US008372663B2

(12) United States Patent
Yanai

(10) Patent No.: US 8,372,663 B2
(45) Date of Patent: Feb. 12, 2013

(54) GOOD CHIP CLASSIFYING METHOD ON WAFER, AND CHIP QUALITY JUDGING METHOD, MARKING MECHANISM, AND MANUFACTURING METHOD OF SEMICONDUCTOR DEVICE USING THE GOOD CHIP CLASSIFYING METHOD

(75) Inventor: Hirokazu Yanai, Osaka (JP)

(73) Assignee: Ricoh Company, Ltd., Tokyo (JP)

( * ) Notice: Subject to any disclaimer, the term of this patent is extended or adjusted under 35 U.S.C. 154(b) by 1268 days.

(21) Appl. No.: 12/145,367

(22) Filed: Jun. 24, 2008

(65) Prior Publication Data

US 2009/0000995 A1      Jan. 1, 2009

(30) Foreign Application Priority Data

Jun. 29, 2007 (JP) ................ 2007-172725

(51) Int. Cl.
*H01L 21/00* (2006.01)
(52) U.S. Cl. ............ 438/4; 438/14; 438/17; 438/18; 257/E21.525; 702/182; 702/183; 702/185
(58) Field of Classification Search .......... None
See application file for complete search history.

(56) References Cited

U.S. PATENT DOCUMENTS

| | | | | |
|---|---|---|---|---|
| 5,497,381 | A * | 3/1996 | O'Donoghue et al. | 714/745 |
| 5,761,064 | A * | 6/1998 | La et al. | 700/110 |
| 6,377,898 | B1 * | 4/2002 | Steffan et al. | 702/82 |
| 6,613,590 | B2 * | 9/2003 | Simmons | 438/14 |
| 6,854,105 | B2 * | 2/2005 | Fukagawa | 716/55 |
| 7,079,960 | B2 * | 7/2006 | Chen et al. | 702/57 |
| 7,105,364 | B2 * | 9/2006 | Suciu et al. | 438/10 |
| 7,415,387 | B2 * | 8/2008 | Fields et al. | 702/183 |

FOREIGN PATENT DOCUMENTS

| | | |
|---|---|---|
| JP | 2004-047542 | 2/2004 |
| JP | 2005-507557 | 3/2005 |
| JP | 2006-518101 | 8/2006 |

* cited by examiner

*Primary Examiner* — Zandra Smith
*Assistant Examiner* — Khanh Duong
(74) *Attorney, Agent, or Firm* — Dickstein Shapiro LLP

(57) ABSTRACT

In a disclosed good chip classifying method capable of classifying the good chips on a wafer, defective chips are divided into defective groups so that the defective chips contiguous to each other are placed into the same defective group based on the wafer test results; the defective group is judged as a defective chip concentrated distribution area when the number of the defective chips exceeds the prescribed value; a defective chip concentrated distribution nearby area including all the defective chips in the defective chip concentrated distribution area and nearby good chips is formed; and the good chips in the defective chip concentrated distribution nearby area are classified to have a chip index based on four directions (X and Y axis directions) on which the defective chips in the defective chip concentrated distribution area are disposed.

20 Claims, 39 Drawing Sheets

FIG.4

| 0 | 1 | 1 | 1 | 1 | 1 | 1 | 1 | 1 | 1 | 1 | 1 | 0 |
|---|---|---|---|---|---|---|---|---|---|---|---|---|
| 1 | 2 | 2 | 2 | 2 | 2 | 2 | × | × | 2 | 2 | 2 | 1 |
| 1 | × | × | × | × | × | × | × | 2 | 2 | 2 | 2 | 1 |
| 1 | × | × | × | × | × | × | × | × | 2 | 2 | 2 | 1 |
| 1 | × | × | 4 | 4 | 4 | 4 | × | 4 | × | × | 2 | 1 |
| 1 | × | × | 4 | 4 | 4 | 4 | × | × | × | × | 2 | 1 |
| 1 | × | × | 4 | 4 | 4 | 4 | 4 | × | 4 | × | × | 2 | 1 |
| 1 | × | × | × | × | 4 | 4 | 4 | × | 4 | × | × | 2 | 1 |
| 1 | × | × | × | × | 4 | 4 | 4 | × | 4 | × | × | 2 | 1 |
| 1 | 2 | 3 | 3 | 3 | 3 | 3 | 3 | × | × | × | × | 2 | 1 |
| 1 | 2 | 3 | 3 | 3 | 3 | 3 | 3 | × | × | 3 | 2 | 1 |
| 1 | 2 | 3 | 3 | 3 | 3 | 3 | 3 | × | × | × | 2 | 1 |
| 1 | 2 | 3 | 3 | 3 | 3 | 3 | 3 | × | × | × | 2 | 1 |
| 1 | 2 | 3 | 3 | 3 | 3 | 3 | 3 | × | × | × | 2 | 1 |
| 1 | 2 | 3 | 3 | × | × | × | × | × | × | × | × | 1 |
| 1 | 2 | × | × | × | × | × | 4 | 4 | 4 | × | × | 1 |
| 1 | 2 | × | × | × | × | × | 4 | 4 | 4 | × | × | 1 |
| 1 | 2 | × | 3 | 3 | 3 | × | × | 4 | 4 | 4 | × | × | 1 |
| 1 | 2 | × | 3 | 3 | 3 | 3 | × | × | × | × | × | 1 |
| 1 | 2 | × | 3 | 3 | 3 | 3 | 3 | 3 | 3 | 3 | × | 1 |
| 0 | 1 | 1 | 1 | 1 | 1 | 1 | 1 | 1 | 1 | 1 | 1 | 0 |

| 0 | 1 | 1 | 1 | 1 | 1 | 1 | 1 | 1 | 1 | 1 | 1 | 1 | 0 |
|---|---|---|---|---|---|---|---|---|---|---|---|---|---|
| 1 | 2 | 2 | 2 | 2 | 2 | 2 | × | × | 2 | 2 | 2 | 2 | 1 |
| 1 | × | × | × | × | × | × | × | × | 2 | 2 | 2 | 2 | 1 |
| 1 | × | × | × | × | × | × | × | × | × | 2 | 2 | 2 | 1 |
| 1 | × | × | 5 | 5 | 4 | 4 | × | 5 | × | × | 2 | 2 | 1 |
| 1 | × | × | 5 | 5 | 4 | 4 | 4 | × | × | × | × | 2 | 1 |
| 1 | × | × | 5 | 5 | 4 | 4 | 4 | × | 5 | × | × | 2 | 1 |
| 1 | × | × | × | × | 4 | 4 | 4 | × | 5 | × | × | 2 | 1 |
| 1 | × | × | × | × | 4 | 4 | 4 | × | 5 | × | × | 2 | 1 |
| 1 | 2 | 3 | 3 | 3 | 3 | 3 | 3 | × | × | × | × | 2 | 1 |
| 1 | 2 | 3 | 3 | 3 | 3 | 3 | 3 | × | × | × | 3 | 2 | 1 |
| 1 | 2 | 3 | 3 | 3 | 3 | 3 | 3 | × | × | × | 3 | 2 | 1 |
| 1 | 2 | 3 | 3 | 3 | 3 | 3 | 3 | × | × | × | 3 | 2 | 1 |
| 1 | 2 | 3 | 3 | 3 | 3 | 3 | 3 | × | × | 3 | 3 | 2 | 1 |
| 1 | 2 | 3 | 3 | × | × | × | × | × | × | × | × | × | 1 |
| 1 | 2 | × | × | × | × | × | × | 5 | 5 | 5 | × | × | 1 |
| 1 | 2 | × | × | × | × | × | × | 5 | 5 | 5 | × | × | 1 |
| 1 | 2 | × | 3 | 3 | 3 | × | × | 5 | 5 | 5 | × | × | 1 |
| 1 | 2 | × | 3 | 3 | 3 | 3 | × | × | × | × | × | × | 1 |
| 1 | 2 | × | 3 | 3 | 3 | 3 | 3 | 3 | 3 | 3 | 3 | × | 1 |
| 0 | 1 | 1 | 1 | 1 | 1 | 1 | 1 | 1 | 1 | 1 | 1 | 1 | 0 |

| 0 | 1 | 1 | 1 | 1 | 1 | 1 | 1 | 1 | 1 | 1 | 1 | 1 | 0 | |
|---|---|---|---|---|---|---|---|---|---|---|---|---|---|---|
| 1 | 2 | 2 | 2 | 2 | 2 | 2 | × | × | 2 | 2 | 2 | 2 | 1 | |
| 1 | × | × | × | × | × | × | × | 2 | 2 | 2 | 2 | 1 | | |
| 1 | × | × | × | × | × | × | × | × | 2 | 2 | 2 | 1 | | |
| 1 | × | × | 5 | 5 | 4 | 4 | × | 6 | × | × | 2 | 2 | 1 | 103 |
| 1 | × | × | 5 | 5 | 4 | 4 | 4 | × | × | × | × | 2 | 1 | A |
| 1 | × | × | 5 | 5 | 4 | 4 | 4 | × | 6 | × | × | 2 | 1 | |
| 1 | × | × | × | × | 4 | 4 | 4 | × | 6 | × | × | 2 | 1 | B |
| 1 | × | × | × | × | 4 | 4 | 4 | × | 6 | × | × | 2 | 1 | |
| 1 | 2 | 3 | 3 | 3 | 3 | 3 | 3 | × | × | × | × | 2 | 1 | |
| 1 | 2 | 3 | 3 | 3 | 3 | 3 | 3 | 3 | × | × | 3 | 2 | 1 | |
| 1 | 2 | 3 | 3 | 3 | 3 | 3 | 3 | 3 | × | × | × | 2 | 1 | |
| 1 | 2 | 3 | 3 | 3 | 3 | 3 | 3 | 3 | × | × | × | 2 | 1 | |
| 1 | 2 | 3 | 3 | 3 | 3 | 3 | 3 | 3 | × | × | × | 2 | 1 | |
| 1 | 2 | 3 | 3 | × | × | × | × | × | × | × | × | 1 | | |
| 1 | 2 | × | × | × | × | × | × | 6 | 6 | 6 | × | × | 1 | |
| 1 | 2 | × | × | × | × | × | × | 6 | 6 | 6 | × | × | 1 | 107 |
| 1 | 2 | × | 3 | 3 | 3 | × | × | 6 | 6 | 6 | × | × | 1 | |
| 1 | 2 | × | 3 | 3 | 3 | 3 | × | × | × | × | × | 1 | | |
| 1 | 2 | × | 3 | 3 | 3 | 3 | 3 | 3 | 3 | 3 | × | 1 | | |
| 0 | 1 | 1 | 1 | 1 | 1 | 1 | 1 | 1 | 1 | 1 | 1 | 1 | 0 | |

| 2 | 3 | 4 | 5 | 5 | 6 | 7 | 6 | 5 | 4 | 2 | 0 | 0 | 0 |
|---|---|---|---|---|---|---|---|---|---|---|---|---|---|
| 4 | 6 | 8 | 10 | 10 | 11 | 12 | × | × | 7 | 4 | 1 | 0 | 0 |
| 6 | × | × | × | × | × | × | × | × | 10 | 6 | 3 | 1 | 0 |
| 8 | × | × | × | × | × | × | × | × | × | 10 | 6 | 3 | 1 |
| 10 | × | × | 16 | 13 | 11 | 13 | × | 15 | × | × | 8 | 5 | 2 |
| 10 | × | × | 15 | 11 | 8 | 10 | 11 | × | × | × | × | 7 | 3 |
| 10 | × | × | 14 | 9 | 5 | 7 | 7 | × | 16 | × | × | 9 | 4 |
| 8 | × | × | × | × | 4 | 7 | 7 | × | 17 | × | × | 10 | 5 |
| 6 | × | × | × | × | 4 | 6 | 6 | × | 15 | × | × | 9 | 4 |
| 4 | 6 | 8 | 8 | 6 | 4 | 5 | 6 | × | × | × | × | 9 | 4 |
| 2 | 3 | 4 | 4 | 3 | 2 | 3 | 6 | 11 | × | × | 13 | 9 | 4 |
| 0 | 0 | 0 | 0 | 0 | 0 | 1 | 6 | 11 | × | × | × | 9 | 4 |
| 0 | 0 | 1 | 2 | 3 | 4 | 5 | 9 | 13 | × | × | × | 10 | 5 |
| 1 | 2 | 4 | 6 | 8 | 9 | 9 | 11 | 13 | × | × | × | 11 | 7 |
| 2 | 4 | 7 | 10 | × | × | × | × | × | × | × | × | × | 8 |
| 3 | 5 | × | × | × | × | × | × | 13 | 14 | 14 | × | × | 9 |
| 4 | 6 | × | × | × | × | × | × | 15 | 16 | 16 | × | × | 10 |
| 5 | 7 | × | 11 | 14 | 13 | × | × | 10 | 11 | 12 | × | × | 9 |
| 4 | 5 | × | 7 | 9 | 8 | 8 | × | × | × | × | × | × | 7 |
| 3 | 3 | × | 3 | 4 | 3 | 4 | 5 | 6 | 7 | 8 | 7 | × | 5 |
| 2 | 2 | 2 | 2 | 2 | 1 | 2 | 3 | 4 | 5 | 6 | 5 | 4 | 3 |

|   | 2 | 2 | 2 | 2 | 2 | 2 | 1 | 1 | 3 | 4 | 5 | 14 |   |
|---|---|---|---|---|---|---|---|---|---|---|---|---|---|
| 7 | 1 | 1 | 1 | 1 | 1 | 1 | × | × | 1 | 2 | 3 | 4 | 5 |
| 1 | × | × | × | × | × | × | × | × | 1 | 2 | 3 | 4 | 5 |
| 1 | × | × | × | × | × | × | × | × | 1 | 2 | 3 | 4 |   |
| 1 | × | × | 1 | 1 | 1 | 1 | × | 1 | × | × | 1 | 2 | 3 |
| 1 | × | × | 1 | 2 | 2 | 2 | 1 | × | × | × | × | 1 | 2 |
| 1 | × | × | 1 | 1 | 3 | 2 | 1 | × | 1 | × | × | 1 | 2 |
| 1 | × | × | × | × | 1 | 2 | 1 | × | 1 | × | × | 1 | 2 |
| 1 | × | × | × | × | 1 | 2 | 1 | × | 1 | × | × | 1 | 2 |
| 8 | 1 | 1 | 1 | 1 | 3 | 2 | 1 | × | × | × | × | 1 | 2 |
| 9 | 2 | 2 | 2 | 2 | 4 | 3 | 2 | 1 | × | × | 1 | 2 | 3 |
| 9 | 3 | 3 | 3 | 3 | 3 | 3 | 2 | 1 | × | × | × | 1 | 2 |
| 9 | 4 | 3 | 3 | 2 | 2 | 2 | 2 | 1 | × | × | × | 1 | 2 |
| 9 | 5 | 2 | 2 | 1 | 1 | 1 | 1 | 1 | × | × | × | 1 | 2 |
| 4 | 3 | 1 | 1 | × | × | × | × | × | × | × | × | × | 1 |
| 2 | 1 | × | × | × | × | × | × | 1 | 1 | 1 | × | × | 1 |
| 2 | 1 | × | × | × | × | × | × | 1 | 2 | 1 | × | × | 1 |
| 2 | 1 | × | 1 | 1 | 1 | × | × | 1 | 1 | 1 | × | × | 1 |
| 2 | 1 | × | 1 | 2 | 2 | 1 | × | × | × | × | × | × | 1 |
| 2 | 1 | × | 1 | 2 | 3 | 2 | 1 | 1 | 1 | 1 | 1 | × | 1 |
|   | 12 | 1 | 4 | 4 | 4 | 3 | 2 | 2 | 2 | 2 | 2 | 1 |   |

| | | | | | M | M | M | M | M | M | M | M |
|---|---|---|---|---|---|---|---|---|---|---|---|---|
| | | | | | M | G3 | G3 | 3 | 3 | G3 | 1 | |
| | | | | M | M | M | 3 | G3 | G3 | G3 | 2 | 1 |
| | | | | | M | 2 | 2 | G3 | 2 | 2 | 2 | 2 | 1 |
| | M | M | M | M | M | 2 | 2 | G3 | 2 | 2 | 2 | 2 | 1 |
| | | M | G5 | | | 1 | 2 | G3 | 2 | 2 | 2 | 2 | 1 |
| M | M | M | G5 | | G4 | 1 | G3 | G3 | 2 | 2 | 2 | 2 | 1 |
| | M | | G5 | G5 | | G4 | 0 | 1 | 1 | 1 | 1 | 1 | 1 | 0 |
| M | M | | | | G4 | G4 | G4 | | | | | | |
| | | | | | | | | | | | | | |

GOOD CHIP CLASSIFYING METHOD ON WAFER, AND CHIP QUALITY JUDGING METHOD, MARKING MECHANISM, AND MANUFACTURING METHOD OF SEMICONDUCTOR DEVICE USING THE GOOD CHIP CLASSIFYING METHOD

CROSS-REFERENCE TO RELATED APPLICATIONS

The present application claims priority under 35 U.S.C §119 to Japanese Patent Application No. 2007-172725 filed Jun. 29, 2007, the entire contents of which are incorporated herein by reference.

BACKGROUND OF THE INVENTION

1. Field of the Invention

The present invention generally relates to a chip classifying method for judging the quality of chips on a wafer in a process of manufacturing semiconductor devices (chips), a chip classifying program, a chip quality judgment program, a marking mechanism, and a method of manufacturing semiconductor devices.

2. Description of the Related Art

A semiconductor device becomes a product through various manufacturing processes. Unfortunately, various problems in those processes may cause reduction of the device yield and the quality of the devices. To detect such defective products in the manufacturing processes, the electric characteristics of each product (chip) on a wafer have been tested (wafer test) to determine whether the chip is good or defective after the patterns of the chips are formed through various processes. Then, marks are placed onto the detected defective chips in an ink marking process. Basically, the chips to be marked are determined based on the result of the wafer test. However, it is known that the defective chips may be concentrated in a part of the wafer, forming a defective chip concentrated distribution area. From experiences, when such a defective chip concentrated distribution area is formed, even though the chips have been judged as good in a wafer test, when the chips are located contiguous to or in the vicinity of the defective chip concentrated distribution area, the quality of the chips may not be sufficiently guaranteed.

Under the circumstance, a wafer having a detected defective chip concentrated distribution area has been conventionally discarded. By doing this, the quality of the products using the chips taken from wafers has been guaranteed. However, the loss due to discarding wafers cannot be avoided. Unfortunately, the loss is increasing in trend as the size of the wafer is becoming larger and larger.

On the other hand, depending on a distribution status of the defective chips on a wafer, there may be cases where good chips having sufficient quality to be guaranteed are included in the same wafer. There are various types of the problems on a wafer. For example, some troubles may be related to a status of a boundary of a single shot by a stepper in a photoengraving step due to, for example, insufficient exposure in the shot by the stepper. However actually, most of the causes are not related to such a status of the boundary but include an abnormal discharge in an etching step. Further, in most cases where the cause of a trouble on a wafer is not related to the status of the boundary a single shot by a stepper, there is a tendency that influence of a trouble is reduced with increasing distance from a center of the defective chip concentrated distribution area.

To avoid discarding wafers, the result of the wafer test is visually checked so that good chips contiguous to and in the vicinity of the defective chip concentrated distribution area are treated as defective chips, and marks are placed onto the defective chips so as to be distinguished from good chips. Hereinafter, an operation of treating such good chips contiguous to and in the vicinity of the defective chip concentrated distribution area as defective and placing marks onto the defective chips so as to be recognized as defective chips is referred to as "an additional inking".

Conventionally, there are two types of additional inking methods. One type of method is to perform inking directly onto a wafer, and the other type of method is to process the wafer test result before placing marks. Generally, as the former method, the additional inking is performed by using an inker function of a testing prober. On the other hand, as the latter method, the additional inking is performed by using a prober dedicated to the additional inking without using the inker function of the testing prober (hereinafter referred to as "a marking prober").

When the former method of performing the additional inking directly onto a wafer is employed, the additional inking is performed onto the chips that seem to have a quality problem after a visual check based the result of the wafer test so that the additional inking is performed on the wafer.

On the other hand, when the latter method of processing the result of the wafer test is employed, the additional inking is performed onto the chips that seem to have a quality problem while the wafer test data are displayed on a display using dedicated software (program).

Further, recently, an inkless method may be used where no mark for distinguishing the defective chips is placed onto a wafer and the next process is performed based on electronic information indicating the result of the wafer test. Hereinafter, in such an inkless method, a process of changing the electronic information indicating good chips whose quality cannot be sufficiently guaranteed into the information indicating defective chips is also referred to as the "additional inking".

By doing the above operation, the quality of the chips may be guaranteed. However, the selection of the chips that may have a quality problem is performed based on sensory analysis from the experience of operators. Therefore, disadvantageously, the result of the selection may vary depending on the operators. Furthermore, it takes many labor-hours to select chips that may have a problem, and the labor-hours are increasing in trend as the size of wafers is increased.

To solve the problems, the present inventor has developed an algorithm for analyzing the distribution of defective chips on a wafer and predicting the chips that may have a quality problem (refer to Japanese Patent No. 3888938).

However, there are many distribution patterns of defective chips. Therefore, in some cases, it may not possible to predict all the chips that should be classified as the targets of the additional inking. One of such cases is next described with reference to FIGS. 38 and 39.

FIG. 38 shows an example of the final result of the wafer test in a wafer test process. FIG. 39 shows an example where additional-inking target chips within a prescribed range of the defective chip concentrated distribution area on the wafer are classified based on a conventional method of classifying the additional-inking target chips.

As shown in FIG. 38, plural chips are arranged in a matrix in the X axis and the Y axis directions of the wafer.

Further, no marks are placed onto the chips (such as good chips 203, 205, and 207) that have been judged as good, and "X" marks are placed onto the chips (such as defective chip 209) that have been judged as defective.

According to a method of judging the defective chip concentrated distribution area disclosed in the Japanese Patent No. 3888938, the plural chips including the defective chip 209 shown in FIG. 38 are judged as the single defective chip concentrated distribution area. Further, as shown in FIG. 39, the good chips such as a good chip 205 next to the defective chip included in the defective chip concentrated distribution area, in other words, the good chips within one-chip range of the defective chips are judged as the additional-inking target chips (see bold frame line in FIG. 39).

In FIG. 39, the good chip 207 surrounded by the defective chip concentrated distribution area but separated by two chips from the defective chips in the defective chip concentrated distribution area is not judged as the additional-inking target chip. However, from experiences, there is a high likelihood that a chip such as good chip 207 within a closed area surrounded by defective chips has a quality problem.

To make it possible to automatically judge the good chip 207 surrounded by defective chips as the additional-inking target chip, the chips separated by two chips from the defective chips in the defective chip concentrated distribution area are judged as defective chips.

However, when this judgment is made, the good chip 203 separated by two chips from the defective chips in the defective chip concentrated distribution area is also judged as the defective chip. As a result, the good chip 203 is judged as the additional-inking target chip. This is not a good result because the good chip 203 has lower likelihood of having a quality problem because the good chip 203 is not surrounded by the defective chips.

Such problems can be avoided when the good chip may be classified according to the quality degradation concern levels.

Such problems may also be avoided when the chip in the vicinity of the defective chip concentrated distribution area can be classified according to the quality degradation concern levels.

SUMMARY OF THE INVENTION

The present invention is made in light of the above problems and may provide a good chip classifying method for classifying good chips on a wafer in accordance with the quality degradation concern level in a manner so that the quality of each of the plural chips arranged in a matrix in the X axis and the Y axis directions on a wafer is accurately determined while the quality of the chips are guaranteed; and a chip quality judging method, a chip quality judgment program, and a marking mechanism using the good chip classifying method.

In the following, various aspects of the present invention are described.

According to an aspect of the present invention, there is provided a good chip classifying method for chips on a wafer. The good chip classifying method on a wafer includes a defective chip dividing step of, based on wafer test results whether each of chips arranged in a matrix in an X direction and a Y direction on the wafer is good or defective, dividing the defective chips into defective groups so that the defective chips contiguous to each other are placed into the same defective group by checking the continuity of the defective chips in four directions of the X axis and the Y axis directions or eight directions consisting of the four directions and additional four directions each inclined 45 degrees with respect to the X axis and the Y axis; and a classifying step of treating at least the good chips as judge target chips and, with respect to each of the defective groups, classifying each of the judge target chips to have any of plural chip indexes based on the number of directions on which any defective chip in the target defective group is disposed in the four directions of the X axis direction and the Y axis directions or in the eight directions consisting of the four directions and the additional four directions each inclined 45 degrees with respect to the X axis and the Y axis.

By doing this, it becomes possible to classify the good chips depending on the extent to which the good chip is surrounded by the defective chips in the defective group, namely quality degradation concern level.

In the appended claims and the specification of the present invention, the term four directions in the X axis and the Y axis directions refers to four directions consisting of X+, X−, Y+, and Y− axis directions.

It should be noted that in the classifying step, the defective chips may also be classified to have any of the chip indexes.

Further, in the classifying step, when the judge target chips are classified based on the above four directions, the judge target chips are classified into five kinds of chip indexes depending the following five cases.

Case 1: no defective chip is detected in any of the four directions (for example, chip index is "0")
Case 2: a defective chip is detected in only one of the four directions (for example, chip index is "1")
Case 3: defective chips are detected in two of the four directions (for example, chip index is "2")
Case 4: defective chips are detected in three of the four directions (for example, chip index is "3")
Case 5: defective chips are detected in each of the four directions (for example, chip index is "4")

In the same manner, when the judge target chips are classified into plural chip indexes based on the above eight directions, the judge target chips are classified into nine kinds of the chip indexes.

In the "DETAILED DESCRIPTION OF THE PREFERRED EMBODIMENTS" described blow, the number of directions on which defective chips are detected is used as the chip index. However, the chip index is not limited to the number. The number of the directions where the defective chip is detected may be replaced by symbols or figures. For example, when no defective chip is detected in any of the four directions, a symbol "a" may be used to represent the chip index; when the defective chip is detected in only one of the four directions, a symbol "b" may be used to represent the chip index; when the defective chips are detected in two of the four directions, a symbol "c" may be used to represent the chip index; when the defective chips are detected in three of the four directions, a symbol "d" may be used to represent the chip index; and when defective chips are detected in each of the four directions, a symbol "e" may be used to represent the chip index. Namely, the chip index may be arbitrarily represented.

In the classifying step, various methods may be used to obtain the number of the directions in which are located the defective chips in the target defective group for classifying into plural chip indexes. Two examples of the methods are described blow. As the first example, there is a method in which the existence of the defective chips is checked one by one at each position of the chips contiguous to the judge target chip in the four directions of the X axis and the Y axis directions with respect to the judge target chip. When it is necessary to check in the eight directions consisting of the four directions of the X axis and the Y axis and additional four directions each inclined 45 degrees with respect to the X axis and the Y axis with respect to the judge target chip, the existence of the defective chips is checked one by one at each of the chips contiguous to the judge target chip in the eight directions.

As the second example, there is a method using a defective group nearby area described below.

In this method, the shape of the defective group nearby area is rectangular and the chips are arranged in a matrix. An index is provided to each of the chips in the defective group nearby area. In each row, the chips are checked one by one from the left to the right in the row until the first defective chip in the defective group is detected. The index of the chips is set "0" for the chips checked before the first defective chip, and the index of the chips is set "1" for the first defective chip and the rest of the chips in the row.

Next, in each row, the chips are checked one by one from the right to the left in the row until the first defective chip in the defective group is detected. The value "1" is added to the index of the chips for the first defective chip and the rest of the chips in the row.

Next, in each column, the chips are checked one by one from the top to the bottom in the column until the first defective chip in the defective group is detected. The value "1" is added to the index of the chips for the first defective chip and rest of the chips in the column.

Next, in each column, the chips are checked one by one from the bottom to the top in the column until the first defective chip in the defective group is detected. The value "1" is added to the index of the chips for the first defective chip and the rest of the chips in the column.

When it is necessary to check in the eight directions consisting of the four directions of the X axis and the Y axis and additional four directions each inclined 45 degrees with respect to the X axis and the Y axis, the chips are checked one by one in the inclined directions as well, and value "1" is added to the index of the chips for the first defective chip and the rest of the chips in each of the inclined directions.

On the other hand, from experience, the good chips near the defective group including a small number of defective chips have no quality problem. Therefore, it is not much necessary to treat such good chips as the additional inking target chips.

Because of this feature, according to another aspect of the present invention, the good chip classifying method may further include a defective chip concentrated distribution area judging step of, with respect to each of the defective groups, judging the defective group as a defective chip concentrated distribution area when the number of defective chips in the defective group is equal to or greater than a prescribed defective chip number threshold value, wherein, in the classifying step, the judge target chips are classified so as to have any of the chip indexes with respect to only the defective group judged as the defective chip concentrated distribution area in the defective chip concentrated distribution area judging step.

Further, according to still another aspect of the present invention, in the defective chip concentrated distribution area judging step, the defective chip number threshold value used for the defective group where at least one defective chip in the defective group is disposed within a prescribed range from a wafer-edge chip may be less than the defective chip number threshold value used for the defective group where none of the defective chips in the defective group are disposed within the prescribed range of a wafer-edge chip. Herein, the wafer-edge chip refers to a chip at the outermost position of the arranged chips.

Still further, from experience, the good chips separated from the defective group have no quality problems. Therefore, it is not necessary to treat such good chips as the additional inking target chips.

Because of this feature, according to still another aspect of the present invention, the good chip classifying method may further include a defective group nearby area setting step of setting a defective group nearby area including all defective chips in the defective group and nearby good chips, wherein in the classifying step, the good chips in the defective group nearby area set in the defective group nearby area setting step are treated as the judge target chips to be classified so as to have any of the chip indexes.

Herein, when the defective chip concentrated distribution area judging step is included in the good chip classifying method, the defective group nearby area setting step may be performed before or after the defective chip concentrated distribution area judging step. However, when the defective chip concentrated distribution area judging step is included, the judge target chips are classified to have any of the chip indexes with respect to only the defective groups judged as the defective chip concentrated distribution area in the judging step. Therefore preferably, to avoid unnecessary setting processes of the defective group nearby area, the defective group nearby area setting step is performed after the defective chip concentrated distribution area judging step.

Still further, according to another aspect of the present invention, in the defective group nearby area setting step of the good chip classifying method, a rectangular area including at least all the defective chips in the defective group may be the defective group nearby area. For example, as the defective group nearby area, the rectangular area may be a minimum rectangular area capable of enclosing all the defective chips in the defective group, or the area may consist of the minimum rectangular area and the additional chips constituting a frame area having a width of one chip or two or more chips and contiguously surrounding the minimum rectangular area. However, the defective group nearby areas are not limited to the above examples. As a further example, the area may consist of all the defective chips in the defective group and additional chips constituting an area having a width of two or more chips and contiguously surrounding defective chips.

It should be noted that when the minimum rectangular area capable of enclosing all the defective chips in the defective group is used as the defective group nearby area, and when the defective group consists of a single defective chip or the shape of the defective group is already rectangular, the defective group nearby area becomes equivalent to the area of the defective group. In such a case, there are no good chips, namely the judge target chips are included in the defective group nearby area. Therefore, no processing is performed of classifying the judge target chips to have any of the chip indexes in the classifying step with respect to such a defective group nearby area.

For example, when a rectangular area consisting of a minimum rectangular area capable of enclosing all the defective chips in the defective group and the additional chips constituting a frame area having a width of one chip and contiguously surrounding the minimum rectangular area is used as the defective group nearby area, the good chips contiguous to the defective chips in the defective group and the good chips where the defective chips in the defective chip concentrated distribution area are disposed in two or more directions of the four directions with respect to the good chips may be treated as the judge target chips.

Still further, according to another aspect of the present invention, the good chip classifying method may include a second classifying step of, with respect to a four-direction defective chip that is the judge target chip classified where any of the defective chips in the target defective group are disposed in each of the four directions in the classifying step, judging whether there is any other judge target chip or any other four-direction defective chip between the four-direction defective chip and the defective chip in the target defective group in each of the four directions, and classifying the four-direction defective chip so as to have another chip index when it is determined that there is no other judge target chip or there is only another four-direction defective chip between the four-direction defective chip and the defective chip in the defective chip concentrated distribution area in each of the four directions. Herein, the target defective group refers to a defective group targeted when the chip index is provided to the judge target chip. Further, the four-direction defective chip refers to the judge target chip classified where the defective chips of the defective groups are disposed in each of the four directions with respect to the judge target chip in the classifying step.

Still further, according to another aspect of the present invention, the good chip classifying method may further include a four-direction judge target chip dividing step of dividing the judge target chips into four-direction good chip groups based on the continuity in the four directions of the X axis and the Y axis directions, and a third classifying step of classifying the judge target chips in the four-direction good chip groups as to have another chip index, the four-direction good chip group consisting of the four-direction defective chips which are judge target chips classified where any of the defective chips in the defective chip concentrated distribution area are disposed in each of the four directions in the classifying step.

Herein, the four-direction judge target chip dividing step may be performed before or after the classifying step. Further, when the second classifying step is included, the second classifying step may be performed before the four-direction judge target chip dividing step, between the four-direction judge target chip dividing step and the third classifying step, or after the third classifying step. Still further, when any one of the defective chip concentrated distribution area judging step and the defective group nearby area setting step or both are included and the four-direction judge target chip dividing step is performed before the classifying step, the four-direction judge target chip dividing step, the defective chip concentrated distribution area judging step, and the defective group nearby area setting step may be performed in an arbitrary order.

Still further, according to another aspect of the present invention, the good chip classifying method may further include an eight-direction judge target chip dividing step of dividing the judge target chips into eight-direction good chip groups based on the continuity in the eight directions consisting of the four directions of the X axis and the Y axis directions and additional four direction each inclined 45 degrees with respect to the X axis and the Y axis, and a fourth classifying step of classifying the judge target chip in the eight-direction good chip groups as to have another chip index, the eight-direction good chip group consisting of four-direction defective chips which are judge target chips classified where any of the defective chips in the defective chip concentrated distribution area are disposed in each of the four directions in the classifying step.

Herein, the eight-direction judge target chip dividing step may be performed before or after the classifying step. Further, when the second step, the four-direction judge target chip dividing step and the third classifying step, or all of those steps are included, those steps may be performed in an arbitrary order as long as the order does not produce conflict. For example, when the second classifying step is included, the second classifying step may be performed before the eight-direction judge target chip dividing step, between the eight-direction judge target chip dividing step and the fourth classifying step, or after the fourth classifying step. Still further, when any one of the defective chip concentrated distribution area judging step and the defective group nearby area setting step or both are included and the eight-direction judge target chip dividing step is performed before the classifying step, the eight-direction judge target chip dividing step, the defective chip concentrated distribution area judging step, and the defective group nearby area setting step may be performed in an arbitrary order.

Still further, according to another aspect of the present invention, in the good chip classifying method, in the defective chip dividing step, with respect to each of the target defective chips, it may be judged whether there is any other defective chip within a prescribed range of the target defective chip, and the defective chips may be divided into defective groups in a manner so that not only the defective chips contiguous to each other but also the defective chips within the prescribed range of the target defective chip are divided into the same defective group. The prescribed range may depend on the wafer size or the chip size. However, when the size of the prescribed range for checking the existence of the other defective chips is too large, the defective chips not divided into one defective group may be disadvantageously included in the same defective group. Therefore preferably, the prescribed range is the rectangular areas including the additional chips having the width of two or three chips. However, the prescribed range is not limited to this. For example, the prescribed range may have additional chips having the width of four or more chips.

Still further, according to another aspect of the present invention, the good chip classifying method may include a defective group merging step of merging any one of the defective chips and another defective group within a prescribed range from the target defective group or both and judging the thus merged group as the defective group. However, when the size of the prescribed range for checking the existence of the other defective group and the defective chip is too large, the defective chips that should not be divided into one defective group are included in the same defective group. Therefore preferably, the prescribed range is the rectangular areas including the additional chips having the width of two or three chips contiguously surrounding the defective chip concentrated distribution area. However, the prescribed range is not limited to this. For example, the prescribed range may have additional chips having the width of four or more chips contiguously surrounding the defective chip concentrated distribution area.

Still further, the merging step may be repeated.

On the other hand, when a small scale defective group is merged in the defective group merging step, the good chips near the thus-merged defective group may be classified as the additional defective chips in the judging step described below, though experiences show that the good chips have no quality problem.

To avoid the situation, still further, according to another aspect of the present invention, in the defective group merging step of the good chip classifying method, only the defective group in which the number of the defective chips is greater than a prescribed first defective chip number merge threshold value may be merged with only another defective group in which the number of the defective chips is greater than a prescribed second defective chip number merge threshold value. For example, the first defective chip number merge threshold value is "5" chips and the second defective chip number merge threshold value is "5" chips. Such defective chip number merge threshold values are especially effective in the defective chip concentrated distribution area judging step and when the judge target chips are classified to have any of the chip indexes with respect to only the defective group judged as the defective chip concentrated distribution area in the defective chip concentrated distribution area judging step.

Still further, according to another aspect of the present invention, in the good chip classifying method, the wafer test results may include one or more wafer test failed groups.

Generally, when the cause of the problem is the same in the same manufacturing step, the chips are likely to be judged as defective in the same test items. Because of the feature, in the chip quality judging method, the accuracy of judging may be improved by judging with respect to each test item of the wafer test. However, it would take much time when the process of the method is performed with respect to each test item, also when there are plural test items, further testing is generally omitted as soon as one test item fails to reduce the time for the wafer test. Therefore, the test items may be divided into groups, and with respect to each of the groups, the results of the wafer test may be used in the chip quality judging method. When the test items are divided into the groups, some test items may be included in plural groups. Rather, by making the same test items included in plural groups, it becomes possible to relieve the inconvenience caused by the fact that when one test item fails, no further testing is performed.

Still further, according to another aspect of the present invention, there is provided a chip quality judging method. The chip quality judging method includes all steps in the good chip classifying method and a judging step, performed after all the steps in the good chip classifying method are performed, of judging the judge target chip as an additional defective chip when the defective chip in the defective group targeted upon the chip index being determined is within a prescribed judgment range from the judge target chip, the prescribed range varying depending on the chip index. Herein, for example, the judgment range may be a rectangular range including additional chips having a width of one or more chips and contiguously surrounding the judge target chip or range having one or more additional chips in the four directions of the X axis and the Y axis with respect to the target chip.

Still further, according to another aspect of the present invention, the chip quality judging method may include all steps in the good chip classifying method and a judging step, performed after all the steps in the good chip classifying method are performed, of judging the judge target chip as an additional defective chip when the judge target chip has the same chip index as a prescribed chip index for judgment.

Still further, according to another aspect of the present invention, the chip quality judging method may include all steps in the good chip classifying method, a nearby defective chip index calculating step of, with respect to each of the judge target chips, calculating the number of defective chips in the defective group that are within a prescribed range from the judge target chip and that is targeted when the chip index is determined, and setting the calculated number to be a nearby defective chip index; and a judging step, performed after all the steps in the good chip classifying method and the nearby defective chip index calculating step are performed, of judging the judge target chip as an additional defective chip when the nearby defective chip index of the defective chip is greater than a prescribed nearby defective chip index threshold value varying depending on the chip index.

Herein, the nearby defective chip index calculating step may be performed at any time between the defective group nearby area setting step and the judging step in any case when the second classifying step, a pair of the four-direction judge target chip dividing step and the third classifying step, a pair of eight-direction judge target chip dividing step and the fourth classifying step, a combination of the above, or all the above steps are included.

Still further, according to another aspect of the present invention, the chip quality judging method may include all steps in the good chip classifying method, a defective chip distance index calculating step of, with respect to each of the judge target chips, calculating the shortest distance to the defective chip in the defective group targeted when the chip index is determined, and setting the calculated shortest distance to a defective chip distance index, and a judging step, performed after all the steps in the good chip classifying method and the defective chip distance index calculating step are performed, of judging the judge target chip as the additional defective chip when the defective chip distance index of the judge target chip is equal to or less than a prescribed defective chip distance index threshold value varying depending on the chip index.

Herein, the defective chip distance index calculating step may be performed at any time between the defective group nearby area setting step and the judging step in any case when the second classifying step, a pair of the four-direction judge target chip dividing step and the third classifying step, a pair of eight-direction judge target chip dividing step and the fourth classifying step, a combination of the above, or all the above steps are included.

Still further, according to another aspect of the present invention, in the judging step of the chip quality judging method, the good chip contiguous to the defective chip in the defective group may be judged as the additional defective chip regardless of the chip index of the good chip. Herein, a chip contiguous to a certain chip refers to a chip contiguous to the certain chip in any of eight directions with respect to the certain chip. Further, when the defective group nearby area is set, the good chips contiguous to the defective chip in the defective group include the good chips disposed in an area other than the defective group nearby area.

Still further, according to another aspect of the present invention, in the judging step of the chip quality judging method, the good chip within a prescribed range from the judge target chip judged as the additional defective chip may be also judged as the additional defective chip.

Still further, according to another aspect of the present invention, the chip quality judging method may further include a judgment validity checking step, performed after the judging step is performed, of checking the validity of the judgment in the judging step based on a difference or a ratio between the number of defective chips in the target defective group in a defective group nearby area including all defective chips in the target defective group and nearby good chips and the number of the additional defective chips.

Still further, according to another aspect of the present invention, in the judgment validity checking step of the chip quality judging method, different criteria may be used depending on the number of the defective chips in the target defective group.

Still further, according to another aspect of the present invention, the chip quality judging method may further include a chip index group dividing step, performed after the classifying step is performed, of dividing the judge target chips having the same chip index with respect to the same defective group into chip index groups based on the continuity in the four directions of the X axis and the Y axis directions or the eight directions consisting of the four directions and additional four directions each inclined 45 degrees with respect to the X axis and the Y axis; and a judgment validity checking step, performed after the judging step is performed, of checking the validity of the judgment in the judging step with respect of each of the chip index groups based on a difference or a ratio between the number of defective chips in a rectangular area consisting of a minimum rectangular area capable of enclosing all the defective chips in the chip index group and the additional chips constituting a frame area having a width of one or more chips and contiguously surrounding the minimum rectangular area and the number of the additional defective chips. Herein, the chip index group dividing step may be performed at any time between the classifying step and the judgment validity checking step.

Still further, according to another aspect of the present invention, in the judgment validity checking step of the chip quality judging method, different criteria may be used depending on the chip index.

Still further, according to another aspect of the present invention, there is provided the chip classifying program causing a computer to execute each step of the above good chip classifying method. With the chip classifying program, the good chips may be automatically classified depending on the quality degradation concern level.

Still further, according to another aspect of the present invention, there is provided the chip quality judgment program causing a computer to execute each step of the above chip quality judging method. With the chip quality judgment program, the chip quality judging method according to an embodiment of the present invention may be performed using a computer, thereby removing a large amount of labor-hours for classifying the chips that may have a problem and improving the criteria which have been relying upon experiences of the operators.

Still further, according to another aspect of the present invention, there is provided the marking mechanism. The marking mechanism includes a marking unit for placing a mark onto a target position on a wafer, and a control unit for controlling the operations of the marking unit, wherein the control unit includes the above chip quality judgment program and controls the operations of the marking unit so as to place marks onto the target wafer positions corresponding to the defective chips or the additional defective chips judged by the chip quality judgment program.

Because of the configuration of the mechanism, by previously inputting the judgment conditions such as the judge chip index and the threshold values, the quality of the chips are judged and marks are automatically placed onto the chips judged as defective while maintaining the quality of the wafer on which defective chips are included.

Still further, according to another aspect of the present invention, there is provided the manufacturing method of semiconductor devices. The manufacturing method of semiconductor devices includes a wafer testing step of judging whether each of the chips arranged in a matrix in the X axis and the Y axis directions is good or defective, a chip quality judging step of detecting the additional defective chips using the above chip quality judging method, and a chip cut off step of cutting the chips from the wafer.

Herein, the chip cut off step may be performed before the wafer testing step, between the wafer testing step and the chip quality judging step, or after the chip quality judging step. When the chip cut off step is performed before the wafer testing step, the wafer test may be performed with the chips adhered to a dicing adhesive tape after the chip cut off step.

Further, the term "cutting the chips from the wafer" refers to dividing the plural chips arranged on the wafer into individual chips.

Further, according to another aspect of the preset invention, the manufacturing method of semiconductor devices may further include a marking step of placing marks onto the wafer positions corresponding to the chips judged as the defective chips or additional defective chips.

Still further, according to another aspect of the present invention, the manufacturing method of semiconductor devices may include a packaging step of packaging only the chips recognized as the good chips in the chip quality judging step.

Herein, the term "packaging the chips" refers to electrically connecting between the electrodes of the chip cut from a wafer and the electrodes such as lead terminals using, for example, the wire bonding technique and then sealing the chip with sealing resin such as molded resin.

It should be noted that a manufacturing method of semiconductor devices according to an embodiment of the present invention is not limited to the method including the packaging step. Namely, when the chips cut from a wafer are directly shipped or loaded onto a production line, the packaging step may not be performed. For example, when the wafer level CPS (Chip Scale Package) is employed, the chips may be sealed before being cut from the wafer. Therefore, the chips may be used without being packaged after being cut from the wafer. In some cases, the chips may be loaded onto a production line in a bare chip condition without being sealed.

In the following, the various advantages of the present invention are described.

According to an aspect of the present invention, a good chip classifying method on a wafer includes a defective chip dividing step of, based on wafer test results whether each of chips arranged in a matrix in an X direction and a Y direction on the wafer is good or defective, dividing the defective chips into defective groups so that the defective chips contiguous to each other are divided into the same defective group by checking the continuity of the defective chips in four directions of the X axis and the Y axis or eight directions consisting of the four directions and additional four directions each inclined 45 degrees with respect to the X axis and the Y axis, and a classifying step of treating at least the good chips as judge target chips and, with respect to each of the defective groups, classifying each of the judge target chips as to have any of plural chip indexes based on the number of directions on which any defective chip in the target defective group is disposed in the four directions of the X axis and the Y axis or in the eight directions consisting of the four directions and the additional four directions each inclined 45 degrees with respect to the X axis and the Y axis.

Because of the feature, it becomes possible to classify the good chips judged as the result of a wafer test in accordance with the quality degradation concern levels.

Further, according to another aspect of the present invention, the good chip classifying method further includes a defective chip concentrated distribution area judging step of, with respect to each of the defective group, judging the defective group as a defective chip concentrated distribution area when the number of defective chips in the defective group is equal to or greater than a prescribed defective chip number threshold value, so that, in the classifying step, the judge target chips are classified so as to have any of the chip indexes with respect to only the defective group judged as the defective chip concentrated distribution area in the defective chip concentrated distribution area judging step. Because of this feature, the data processing time may be reduced because it becomes no longer necessary to calculate the chip indexes with respect to the defective group consisting of only a small number of defective chips.

Still further, according to another aspect of the present invention, in the defective chip concentrated distribution area judging step of the good chip classifying method, it is arranged that the defective chip number threshold value used for the defective group where at least one defective chip in the defective group is disposed within a prescribed range from a wafer-edge chip is less than the defective chip number threshold value used for the defective group where none of the defective chips in the defective group are disposed within the prescribed range from a wafer-edge chip. Because of this feature, a defective group including the defective chip near the wafer-edge chip having a higher quality degradation concern level may be treated as the defective chip concentrated distribution area even if the defective group consists of only a small number of defective chips.

Still further, according to another aspect of the present invention, the good chip classifying method further includes a defective group nearby area setting step of setting a defective group nearby area including all defective chips in the defective group and nearby good chips, so that, in the classifying step, the good chips in the defective group nearby area set in the defective group nearby area setting step are treated as the judge target chips to be classified so as to have any of the chip indexes. Because of this feature, the data processing time may be reduced because it becomes no longer necessary to calculate the chip indexes with respect to the good chips in the area other than the defective group nearby area.

Still further, according to another aspect of the present invention, the good chip classifying method includes a second classifying step of, with respect to a four-direction defective chip that is the judge target chip classified where any of the defective chips in the target defective group are disposed in each of the four directions in the classifying step, judging whether there is any other judge target chip or any other four-direction defective chip between the four-direction defective chip and the defective chip in the target defective group in each of the four directions, and classifying the four-direction defective chip so as to have another chip index when it is determined that there is no other judge target chip or there is only another four-direction defective chip between the four-direction defective chip and the defective chip in the defective chip concentrated distribution area in each of the four directions. Because of this feature, since such a four-direction defective chip is likely to be affected by a problem even if the four-direction defective chip is judged as good in the wafer test, it becomes possible to classify the four-direction defective chip as the additional-inking target chip.

Still further, according to another aspect of the present invention, the good chip classifying method includes a four-direction judge target chip dividing step of dividing the judge target chips into four-direction good chip groups based on the continuity in the four directions of the X axis and the Y axis, and a third classifying step of classifying the judge target chip in the four-direction good chip groups as to have another chip index, the four-direction good chip group consisting of the four-direction defective chips which are judge target chips classified where any of the defective chips in the defective chip concentrated distribution area are disposed in each of the four directions in the classifying step. Because of this feature, it becomes possible to detect the judge target chip surrounded by the defective chips with a higher level and classify the detected judge target chip to have a chip index to be treated as the additional-inking target chip.

Still further, according to another aspect of the present invention, the good chip classifying method includes an eight-direction judge target chip dividing step of dividing the judge target chips into eight-direction good chip groups based on the continuity in the eight directions consisting of the four directions of the X axis and the Y axis and additional four direction each inclined 45 degrees with respect to the X axis and the Y axis, and a fourth classifying step of classifying the judge target chip in the eight-direction good chip groups as to have another chip index, the eight-direction good chip group consisting of four-direction defective chips which are judge target chips classified where any of the defective chips in the defective chip concentrated distribution area are disposed in each of the four directions in the classifying step. Because of this feature, it becomes possible to detect the judge target chip surrounded by the defective chips and classify the detected judge target chip to have a chip index to be treated as the additional-inking target chip.

Still further, according to another aspect of the present invention, in the defective chip dividing step, with respect to each of the target defective chips, it is judged whether there is any other defective chip within a prescribed range from the target defective chip, and the defective chips are divided into defective groups in a manner so that not only the defective chips contiguous to each other but also the defective chip within the prescribed range from the target defective chip are divided into the same defective group. Because of this feature, it becomes possible to divide the plural defective chips that are not contiguous to each other but are in the vicinity of each other into the same defective group and classify the good chips as the additional-inking target chip from experience as the judge target chip in the defective group nearby area.

Still further, according to another aspect of the present invention, the good chip classifying method includes a defective group merging step of merging any one of the defective chips and another defective group within a prescribed range of the target defective group or both and judging the thus merged group as the defective group, and when the merging step is repeated. Because of this feature, it becomes possible to classify the good chips as the additional-inking target chip from experience as the judge target chip in the defective group nearby area.

Still further, according to another aspect of the present invention, in the defective group merging step, only the defective group in which the number of the defective chips is greater than a prescribed first defective chip number merge threshold value is merged with only another defective group in which the number of the defective chips is greater than a prescribed second defective chip number merge threshold value. Because of this feature, it becomes possible to avoid merging between smaller scale defective groups and also to avoid the situation where the chips having good quality, based on experiences, are disadvantageously classified to have a chip index to be judged as the additional defective chips in the judging step described below. As described above, setting the defective chip number merge threshold values is effective especially when the defective chip concentrated distribution area judging step is included and, in the classifying step, the judge target chips with respect to only the defective group judged as the defective chip concentrated distribution area in the defective chip concentrated distribution area judging step are classified to have any of the chip indexes.

Still further, according to another aspect of the present invention, a chip quality judging method includes all steps in the good chip classifying method described above, and a judging step, performed after all the steps in the good chip classifying method are performed, of judging the judge target chip as an additional defective chip when the defective chip in the defective group targeted upon the chip index being determined is within a prescribed judgment range from the judge target chip, the prescribed range varying depending on the chip index. Because of this feature, it becomes possible to judge the quality of the chips more accurately while guaranteeing the quality based on the chip indexes classified depending on the quality degradation concern level using the good chip classifying method according to an embodiment of the present invention. This chip quality judging method is especially effective with respect to a wafer having the defective chip concentrated distribution area.

Still further, according to another aspect of the present invention, the chip quality judging method includes all steps in the good chip classifying method described above, and a judging step, performed after all the steps in the good chip classifying method are performed, of judging the judge target chip as an additional defective chip when the judge target chip has the same chip index as a prescribed chip index for judgment. In this aspect as well, it becomes possible to judge the quality of the chips more accurately while guaranteeing the quality based on the chip indexes classified depending on the quality degradation concern level using the good chip classifying method according to an embodiment of the present invention. This chip quality judging method is especially effective with respect to a wafer having the defective chip concentrated distribution area.

Still further, according to another aspect of the present invention, the chip quality judging method includes all steps in the good chip classifying method described above, a nearby defective chip index calculating step of, with respect to each of the judge target chips, calculating the number of defective chips in the defective group that is within a prescribed range of the judge target chip and that is targeted when the chip index is determined, and setting the calculated number to a nearby defective chip index; and a judging step, performed after all the steps in the good chip classifying method and the nearby defective chip index calculating step are performed, of judging the judge target chip as an additional defective chip when the nearby defective chip index of the defective chip is greater than a prescribed nearby defective chip index threshold value varying depending on the chip index. In this aspect as well, it becomes possible to judge the quality of the chips more accurately while guaranteeing the quality based on the chip indexes classified depending on the quality degradation concern level using the good chip classifying method according to an embodiment of the present invention. This chip quality judging method is especially effective with respect to a wafer having the defective chip concentrated distribution area.

Still further, according to another aspect of the present invention, the chip quality judging method includes all steps in the good chip classifying method described above, a defective chip distance index calculating step of, with respect to each of the judge target chips, calculating the shortest distance to the defective chip in the defective group targeted when the chip index is determined, and setting the calculated shortest distance to be a defective chip distance index; and a judging step, performed after all the steps in the good chip classifying method and the defective chip distance index calculating step are performed, of judging the judge target chip as the additional defective chip when the defective chip distance index of the judge target chip is equal to or less than a prescribed defective chip distance index threshold value varying depending on the chip index. In this aspect as well, it becomes possible to judge the quality of the chips more accurately while guaranteeing the quality based on the chip indexes classified depending on the quality degradation concern level using the good chip classifying method according to an embodiment of the present invention. This chip quality judging method is especially effective with respect to a wafer having the defective chip concentrated distribution area.

Still further, according to another aspect of the present invention, in the chip quality judging method described above, the judging step is arranged so that the good chip contiguous to the defective chip in the defective group is judged as the additional defective chip regardless of the chip index of the good chip. Because of this feature, it becomes possible to treat the good chips having a higher level of the quality degradation concern as the additional-inking target chips, thereby enabling more appropriate judging of the additional-inking target chips.

Still further, according to another aspect of the present invention, in the judging step, it is arranged that the good chip within a prescribed range from the judge target chip judged as the additional defective chip is also judged as the additional defective chip. In this aspect as well, it becomes possible to treat the good chips having a higher level of the quality degradation concern as the additional-inking target chips, thereby enabling more appropriate judging of the additional-inking target chips.

Still further, according to another aspect of the present invention, the chip quality judging method includes a judgment validity checking step, performed after the judging step is performed, of checking the validity of the judgment in the judging step based on a difference or a ratio between the number of defective chips in the target defective group in a defective group nearby area including all defective chips in the target defective group and nearby good chips and the number of the additional defective chips. Because of this feature, when more additional defective chips than necessary are selected in the judging step, it is possible to avoid the situation where all the additional defective chips disadvantageously become the additional-inking target chips.

Still further, according to another aspect of the present invention, in the judgment validity checking step, different criteria are used depending on the number of the defective chips in the target defective group. Because of this feature, it becomes possible to perform the judgment validity checking step in accordance with the scale of the defective chip concentrated distribution area, thereby enabling appropriate checking of the validity of the judgment in the judging step.

Still further, according to another aspect of the present invention, the chip quality judging method described above further includes a chip index group dividing step, performed after the classifying step is performed, of dividing the judge target chips having the same chip index with respect to the same defective group into chip index groups based on the continuity in the four directions of the X axis and the Y axis or the eight directions consisting of the four directions and additional four directions each inclined 45 degrees with respect to the X axis and the Y axis, and a judgment validity checking step, performed after the judging step is performed, of checking the validity of the judgment in the judging step with respect of each of the chip index groups based on a difference or a ratio between the number of defective chips in a rectangular area consisting of a minimum rectangular area capable of enclosing all the defective chips in the chip index group and the additional chips constituting a frame area having a width of one or more chips and contiguously surrounding the minimum rectangular area and the number of the additional defective chips. Because of this feature, it becomes possible to check the validity of the judge more accurately.

Still further, according to another aspect of the present invention, in the judgment validity checking step, different criteria are used depending on the chip index, so it becomes possible to check the validity of the judgment more accurately.

Still further, according to another aspect of the present invention, the chip classifying program is arranged to cause a computer to execute each step of the good chip classifying method described above. Therefore, it is possible to automatically classify the chips near the defective chip concentrated distribution area in accordance with the quality degradation concern levels.

Still further, according to another aspect of the present invention, the chip quality judgment program is arranged to cause a computer to execute each step of the chip quality judging method described above. Therefore, it is possible to cause a computer to execute the chip quality judging method described above, avoid a large amount of labor-hours for classifying the chips that may have a problem, and improve the criteria which have been relying on the experience of the operators.

Still further, according to another aspect of the present invention, the marking mechanism includes a marking unit for placing a mark onto a target position on a wafer, and a control unit for controlling the operations of the marking unit so that the control unit includes the chip quality judgment program described above and controls the operations of the marking unit so as to place marks onto the target wafer positions corresponding to the defective chips or the additional defective chips judged by the chip quality judgment program. Because of this feature, by previously inputting the judgment conditions such as the judge chip index and the threshold values, the quality of the chips are judged and marks are automatically placed onto the chips judged as defective while maintaining the quality of the wafer on which defective chips are included.

Still further, according to another aspect of the present invention, the manufacturing method of semiconductor devices includes a wafer testing step of judging whether each of the chips arranged in a matrix in the X axis and the Y axis directions is good or defective, a chip quality judging step of detecting the additional defective chips using the chip quality judging method described above, and a chip cut off step of cutting the chips from the wafer. Because of this feature, it is possible to accurately judge the quality of the chips while guaranteeing the quality.

Still further, according to another aspect of the present invention, the manufacturing method described above further includes a packaging step of packaging only the chips recognized as the good chips in the chip quality judging step. Because of this feature, it becomes possible to remove the defective chips having a quality problem and the additional defective chips having a higher quality degradation concern level so as to package good chips only, thereby improving the reliability of the packaged semiconductor devices.

BRIEF DESCRIPTION OF THE DRAWINGS

Other objects, features, and advantages of the present invention will become more apparent from the following description when read in conjunction with the accompanying drawings, in which:

FIG. 4 is a drawing showing the chip indexes calculated in the embodiment of the present invention;

FIG. 5 is a drawing showing additional defective chips calculated in the embodiment of the present invention;

FIG. 7 is a drawing showing the chip indexes of the judge target chips, the chip indexes being calculated in the embodiment of the present invention;

FIG. 8 is a drawing showing the additional defective chips calculated in the embodiment of the present invention;

FIG. 11 is a drawing showing the chip indexes of the judge target chips, the chip indexes being calculated in the embodiment of the present invention;

FIG. 12 is a drawing showing the additional defective chips calculated in the embodiment of the present invention;

FIG. 15 is a drawing showing the chip indexes of the judge target chips, the chip indexes being calculated in the embodiment of the present invention;

FIG. 16 is a drawing showing the additional defective chips calculated in the embodiment of the present invention;

FIG. 18 is a drawing showing nearby defective chip indexes calculated in the embodiment of the present invention;

FIG. 19 is a drawing showing the additional defective chips calculated in the embodiment of the present invention;

FIG. 21 is a drawing showing defective chip distance indexes calculated in the embodiment of the present invention;

FIG. 22 is a drawing showing the additional defective chips calculated in the embodiment of the present invention;

FIG. 28 is a drawing showing a result when the defective chips are divided into defective groups "G3", "G4", and "G5" in the area of FIG. 27;

FIG. 29 is a drawing showing the defective chip concentrated distribution nearby area, the chip indexes, and additional defective chips calculated with respect to the defective group "G3";

FIG. 36 is a drawing showing another example of the defective chip concentrated distribution nearby area with respect to the defective chip concentrated distribution area in FIG. 4;

FIG. 37 is a drawing showing calculation results of the number of the directions on which there is a defective chip in the defective chip concentrated distribution area in the case of the same defective chip concentrated distribution nearby area and the defective chip concentrated distribution area in FIG. 4;

DETAILED DESCRIPTION OF THE PREFERRED EMBODIMENTS

In a chip quality judging method according to an embodiment of the present invention, the defective chip concentrated distribution area is detected by continuity verification in the vicinity of the defective chips based on a wafer test, and then the good chips in the vicinity of the defective chip concentrated distribution area are classified so as to have any of plural chip indexes.

Figure 1:
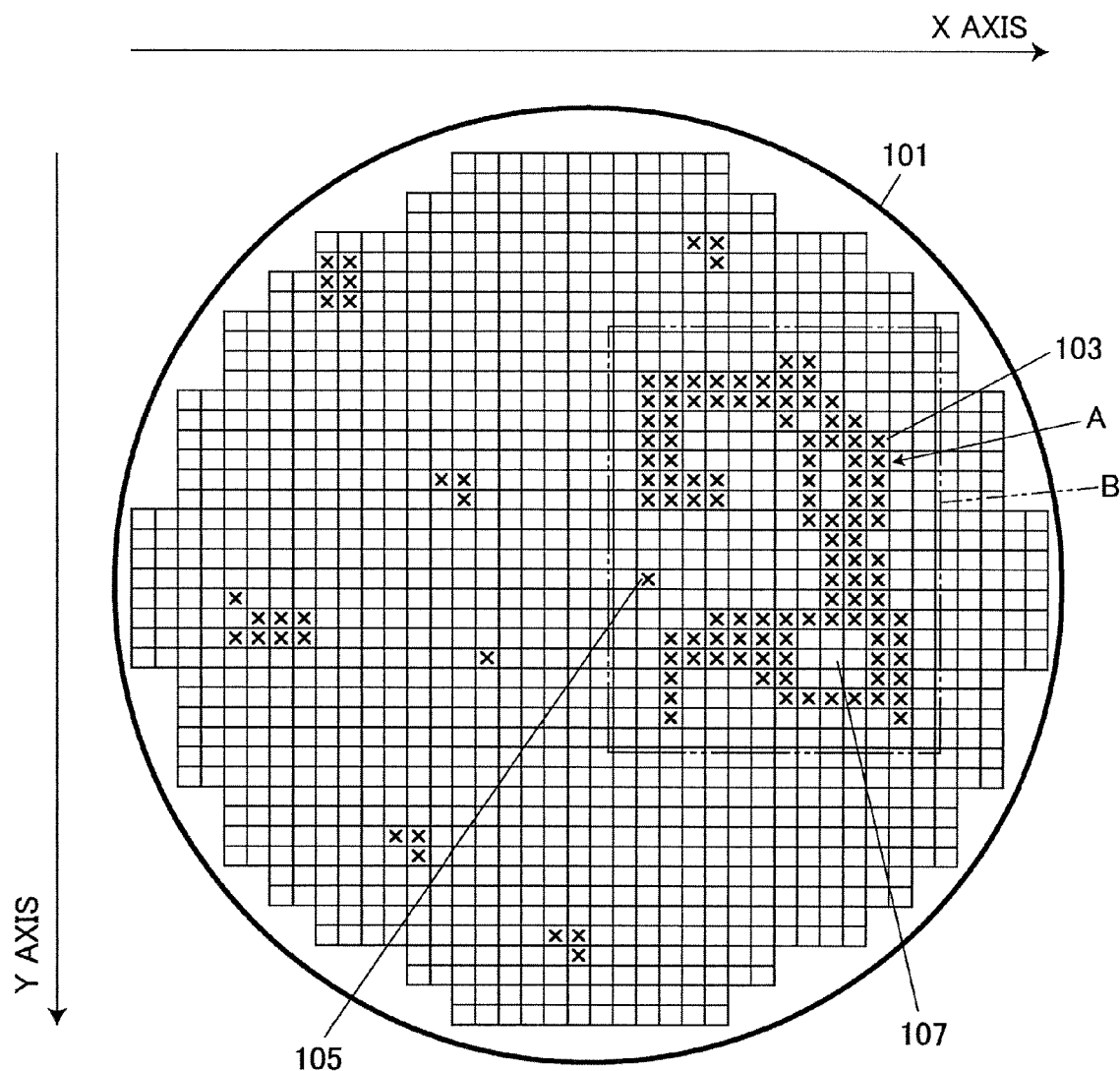
FIG. 1 is a drawing showing an example of a final wafer test result in a wafer test process.

FIG. 1 is an example of the result of the final wafer test in a wafer test process. As shown in FIG. 1, plural chips are arranged in a matrix in X axis and Y axis directions on the wafer 101. No marks are placed onto the chips (such as good chip 107) that have been judged as good, and "X" marks are placed onto the chips (such as defective chips 103 and 105) that have been judged as defective.

Figure 2:
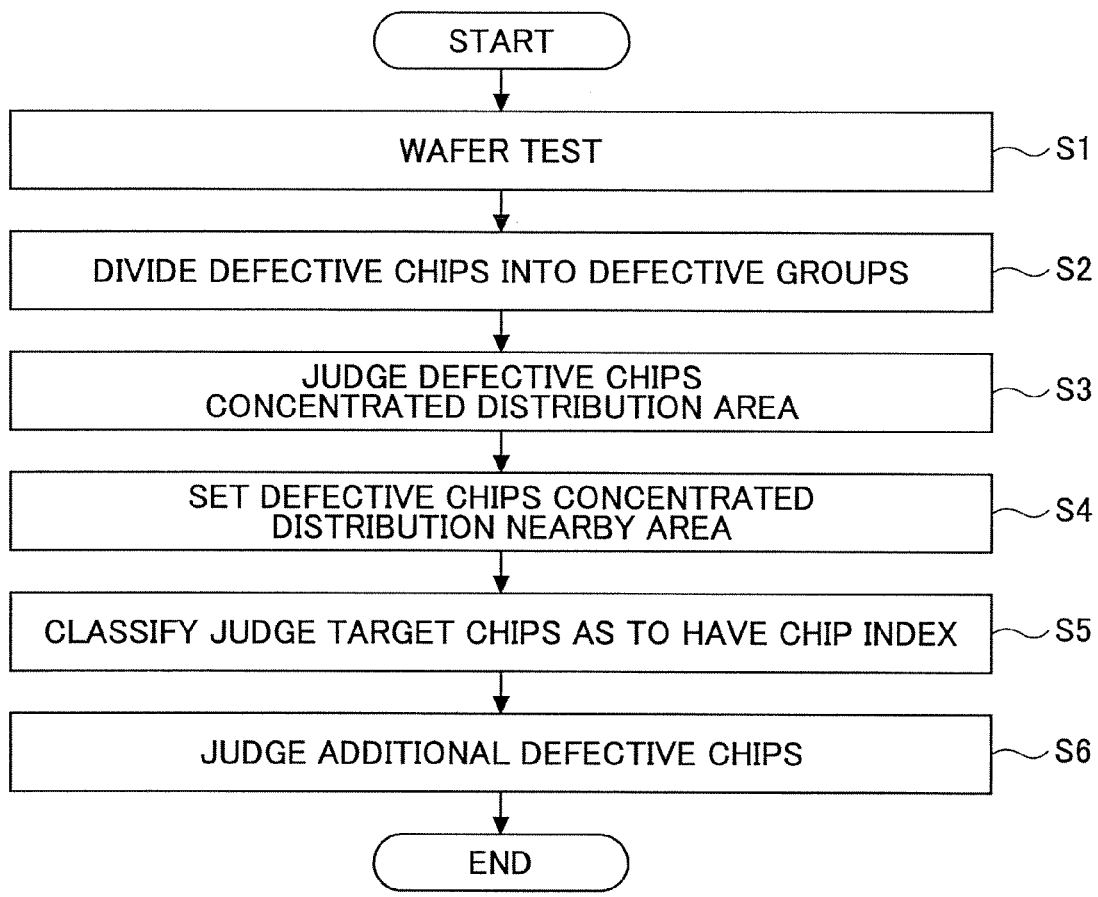
FIG. 2 is a flowchart showing an exemplary procedure of a chip quality judgment method according to an embodiment of the present invention.
Figure 3:
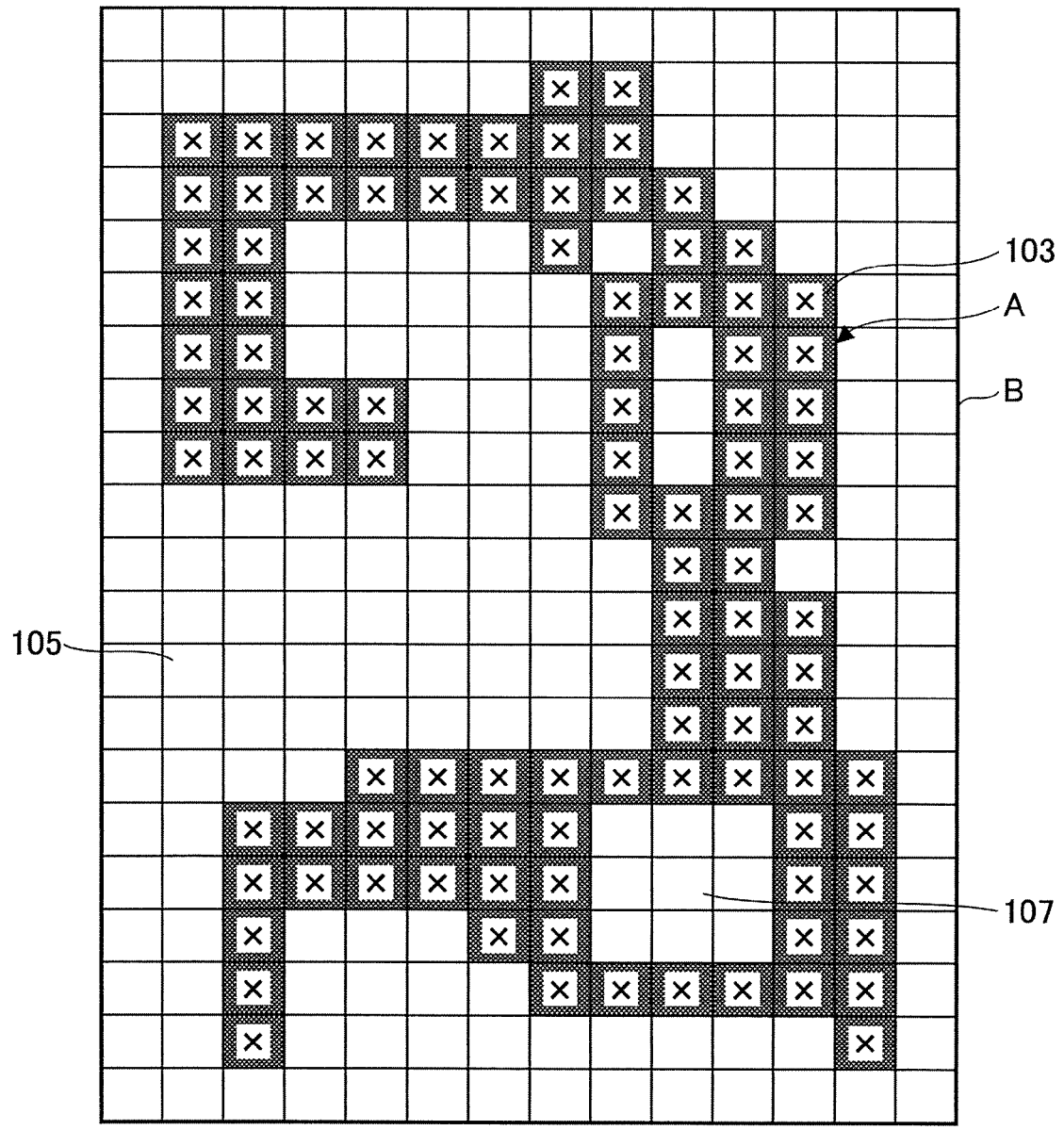
FIG. 3 is an enlarged drawing of the defective chip concentrated distribution nearby area set in the embodiment of the present invention.
Figure 5:
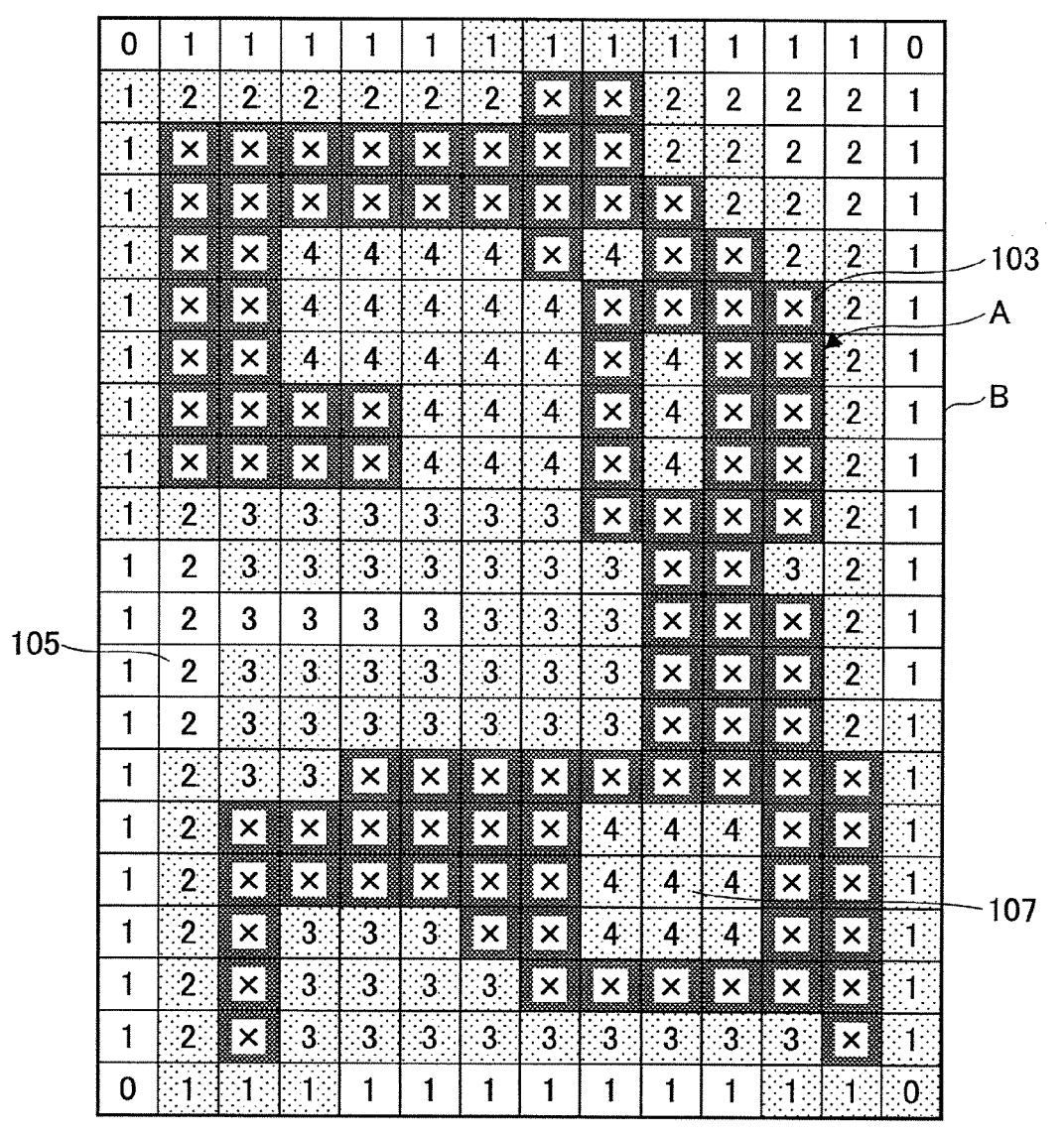

FIG. 2 is a flowchart showing a process of a chip quality judging method according to an embodiment of the present invention. FIGS. 3 through 5 are enlarged drawings showing a defective chip concentrated distribution nearby area provided in this embodiment. This embodiment of the present invention is described with reference to FIGS. 1 through 5.

Step S1: It is determined whether each of the chips arranged in a matrix in the X axis and the Y axis directions on the wafer 101 is good or defective (Wafer testing step).

Step S2: Based on the results of the wafer test in the wafer testing step, the continuity of the defective chips is verified in eight directions consisting of the four directions of the X axis and the Y axis and additional four directions each inclined 45 degrees with respect to the X axis and the Y axis. Then the defective chips are divided into groups so that the defective chips having continuity with contiguous to each other are placed into the same group (defective chip dividing step). In the result of the wafer test shown in FIG. 1, the defective chips are divided into nine defective groups.

When the defective chips in the result of the wafer test shown in FIG. 1 are divided based on four directions of the X and the Y axis, the defective chips are divided into ten separate defective groups.

Step 3: With respect to each of the defective groups, the number of defective chips in the defective group is compared with a predetermined defective chip number threshold value. When the number of defective chips is greater than the defective chip number threshold value, the defective group is judged as a defective chip concentrated distribution area (defective chip concentrated distribution area judging step). For example, when the number of defective chips is "10", only the defective group including the defective chip 103 is determined as the defective chip concentrated distribution area "A". This defective chip concentrated distribution area judging step S3 is performed so as to exclude a small scale defective group which does not influence the quality of the chips near the defective group from the target to be processed as the defective chip concentrated distribution area.

Step S4: The defective chip concentrated distribution nearby area is provided as a prescribed range consisting of all the defective chips in the defective chip concentrated distribution area "A" and the good chips in the vicinity of the defective chip concentrated distribution area "A" (Defective chip concentrated distribution nearby area setting step). In this embodiment, the defective chip concentrated distribution nearby area "B" is defined as a rectangular area consisting of the minimum rectangle capable of enclosing all the defective chips in the defective chip concentrated distribution area "A" and the additional chips constituting a frame area having a width of one chip on each of the four sides and contiguously surrounding the minimum rectangle as shown in FIG. 3. In this embodiment, the defective chip 105 which is included in the defective chip concentrated distribution nearby area "B" but is not included in the defective chip concentrated distribution area "A" is treated as a good chip. However, the process of the following steps (Steps S5 and S6) performed on the good chips may not be performed on the defective chip 105.

Step S5: The good chips in the defective chip concentrated distribution nearby area "B" are treated as judge target chips. With respect to each judge target chip, the number of directions in the four directions of the X and the Y axis directions is counted in which any of the defective chips in the defective chip concentrated distribution area "A" are disposed. According to the obtained number of the directions, each judge target chip has any of the values "0", "1", "2", "3", or "4" as the chip index of the judge target chip (Classifying step). In this case, the chip indexes of only the judge target chips (good chips) are obtained Further, the chip indexes of the defective chips in the defective chip concentrated distribution area "A" are also obtained. FIG. 4 shows the thus obtained chip indexes. As shown in FIG. 4, for example, the chip index of the judge target chips surrounded by the defective chips in the defective chip concentrated distribution area "A", in other words, the chip index of the judge target chips having the defective chips in each of the four directions becomes "4". According to this classifying step S5, the chip index of any judge target chip in the defective chip concentrated distribution nearby area "B" has one of the values "0" through "4" in any case.

From experience, the more are the defective chips that surround a good chip, the more degraded the quality of the good chip. According to the method of determining the chip index in the classification step S5, the greater value of the chip index a judge target chip has, the more concentrated are the defective chips surrounding the judge target chip.

Step S6: The judge target chip having a defective chip of the defective chip concentrated distribution area "A" within a judgment range previously determined based on the chip index of the judge target chip is judged as an additional defective chip (Judging step). For example, in this embodiment, the judgment range of each judge target chip is defined as follows. When the chip index of the judge target chip is any of "0", "1", and "2", the judgment range consists of the judge target chip and the additional chips constituting a frame area having a width of "one" chip and contiguously surrounding the judge target chip. In the same manner, when the chip index of the judge target chip is "3" and "4", the judgment range consists of the judge target chip and the additional chips constituting a frame area having a width of "two" and "three" chips, respectively, and contiguously surrounding the judge target chip. FIG. 5 shows the distribution of the additional defective chips in dotted areas. The additional defective chips are treated as additional-inking target chips. According to this embodiment of the present invention, the good chip 107 that is not contiguous to any of the defective chips in the defective chip concentrated distribution area "A" but is surrounded by defective chips detected as additional defective chips.

As described, an appropriate additional-inking target chip judgment can be performed by using the chip index when a good chip within a prescribed range from the defective chip in the defective chip concentrated distribution area "A" is judged as the additional defective chip.

Figure 6:
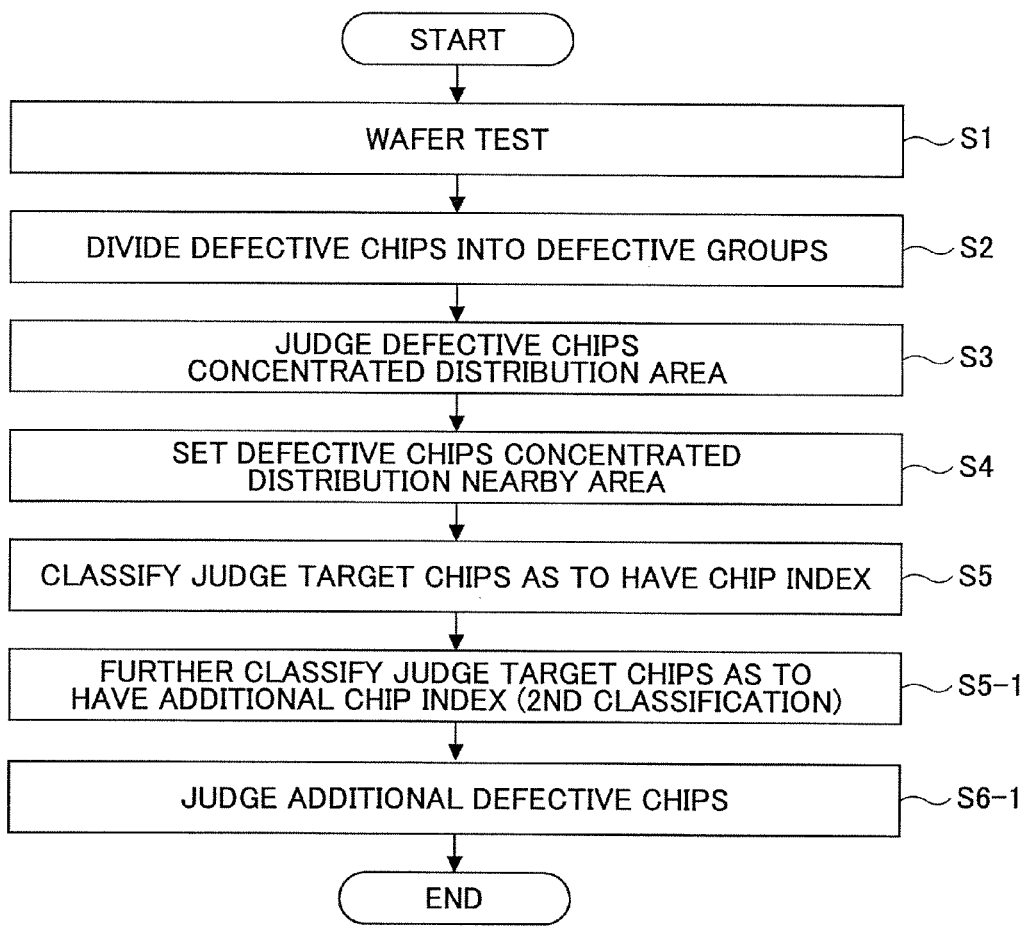
FIG. 6 is a flowchart showing an exemplary procedure of a chip quality judging method according to another embodiment of the present invention.
Figure 8:
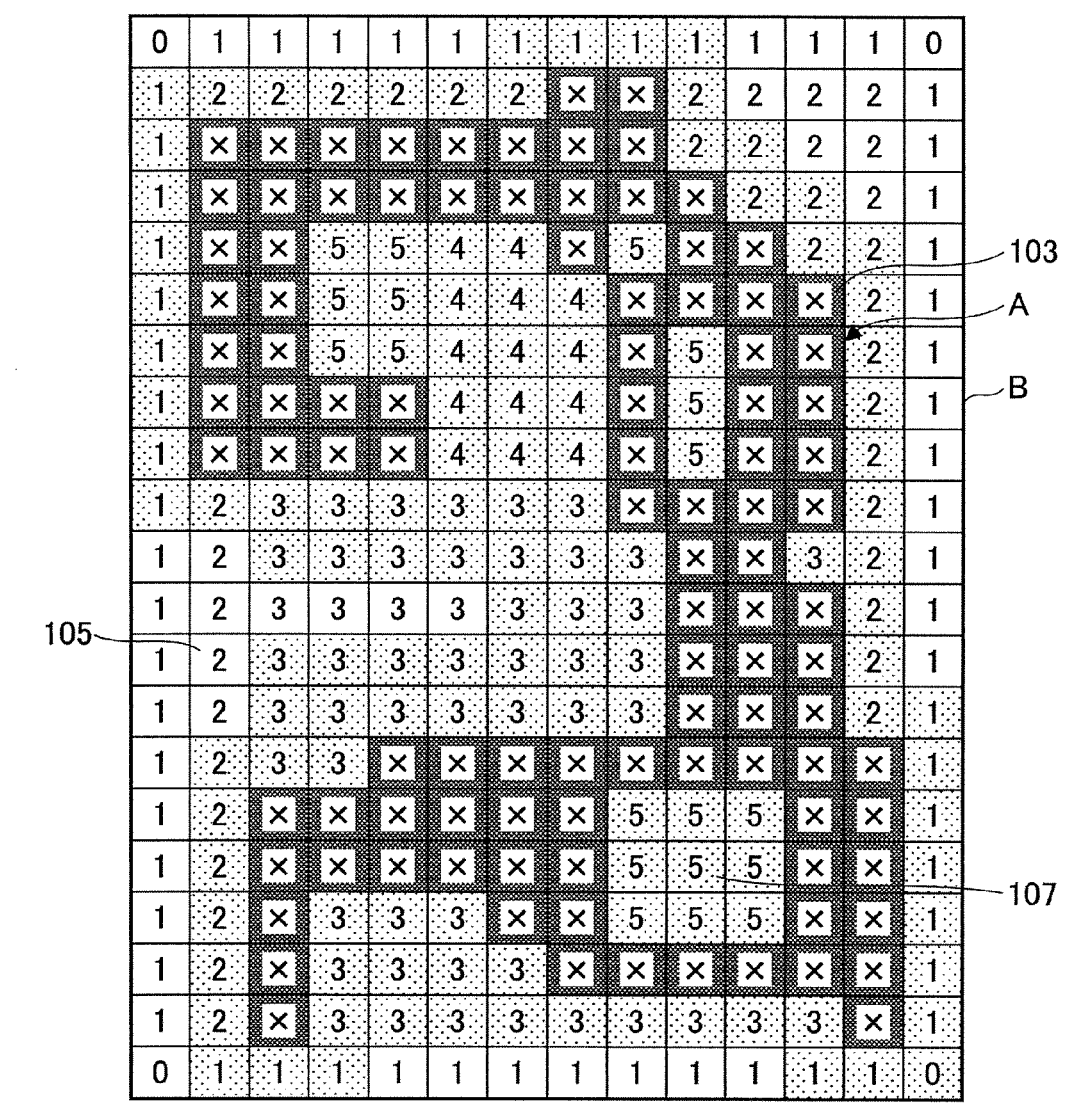

FIG. 6 is a flowchart showing a chip quality judging method according to another embodiment of the present invention. FIGS. 7 and 8 are enlarged drawings showing the defective chip concentrated distribution nearby area provided in this embodiment. This embodiment of the present invention is described with reference to FIGS. 6 through 8. The processes in steps S1 through S5 in FIG. 6 are the same as those described above, and the descriptions of the processes are omitted here.

Step S5-1: Among the judge target chips classified in the classifying step S5, the judge target chips having the chip index of "4" are hereinafter referred to as "four-direction defective chips" (see FIG. 4). In this step, it is determined whether there is any other judge target chip or any other four-direction defective chip between each of the four-direction defective chips and the defective chips in the defective chip concentrated distribution area "A" in the four directions of the X axis and Y axis with respect to the each of the four-direction defective chips. When it is determined that there is no other judge target chip or there is only another four-direction defective chip(s) between the four-direction defective chip and the defective chip in the defective chip concentrated distribution area "A" in each of the four directions, the chip index of the four-direction defective chip becomes "5" (Second classifying step). FIG. 7 shows a result of the classifying step S5 and the second classifying step S5-1. As shown in FIG. 7, it can be judged that the judge target chip having the chip index of "5" is surrounded by a higher proportion of the defective chips than the judge target chip having the chip index of "4".

Step S6-1: In this step, when there is any defective chip in the defective chip concentrated distribution area "A" detected within a judgment range previously determined based on the chip index of the judge target chip, the judge target chip is judged as the additional defective chip (Judging step). For example, in this embodiment, the judgment range of each judge target chip is defined as follows. When the chip index of the judge target chip is any of "0", "1", and "2", the judgment range consists of the judge target chip and the additional chips constituting a frame area having a width of "one" chip and contiguously surrounding the judge target chip. In the same manner, when the chip index of the judge target chip is "3", "4", and "5" the judgment range consists of the judge target chip and the additional chips constituting a frame area having a width of "two", "three", and "four" chips, respectively, and contiguously surrounding the judge target chip. FIG. 8 shows the distribution of the additional defective chips in dotted areas. The additional defective chips are treated as the additional-inking target chips.

According to this embodiment of the present invention, though the four-direction defective chips are judged as good chips in the wafer test, the four-direction defective chips are likely to be affected by a problem. Therefore, by judging such four-direction defective chips as the additional-inking target chips, it becomes possible to determine the additional-inking target chips more appropriately.

Figure 9:
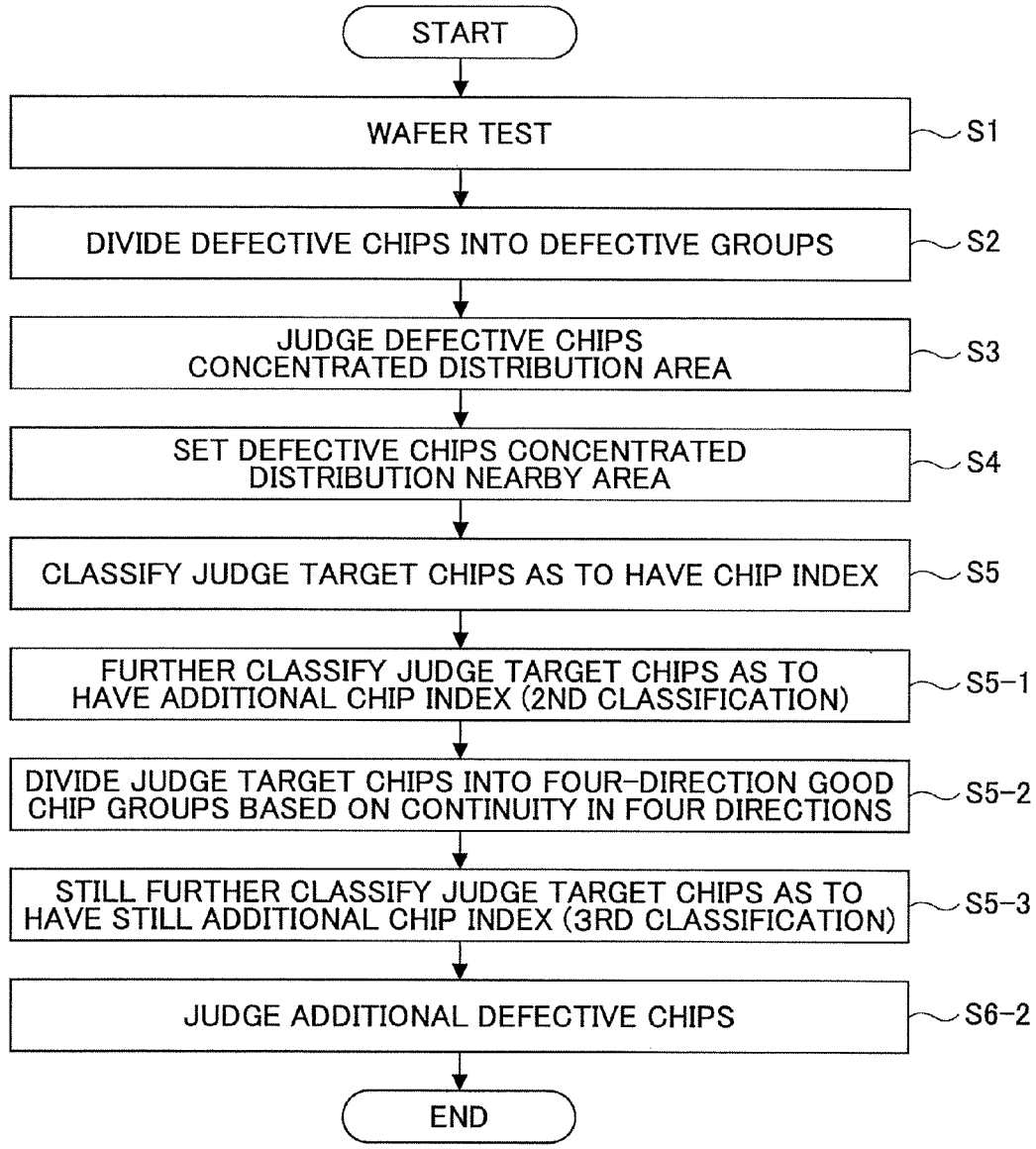
FIG. 9 is a flowchart showing an exemplary procedure of a chip quality judging method according to still another embodiment of the present invention.
Figure 10:
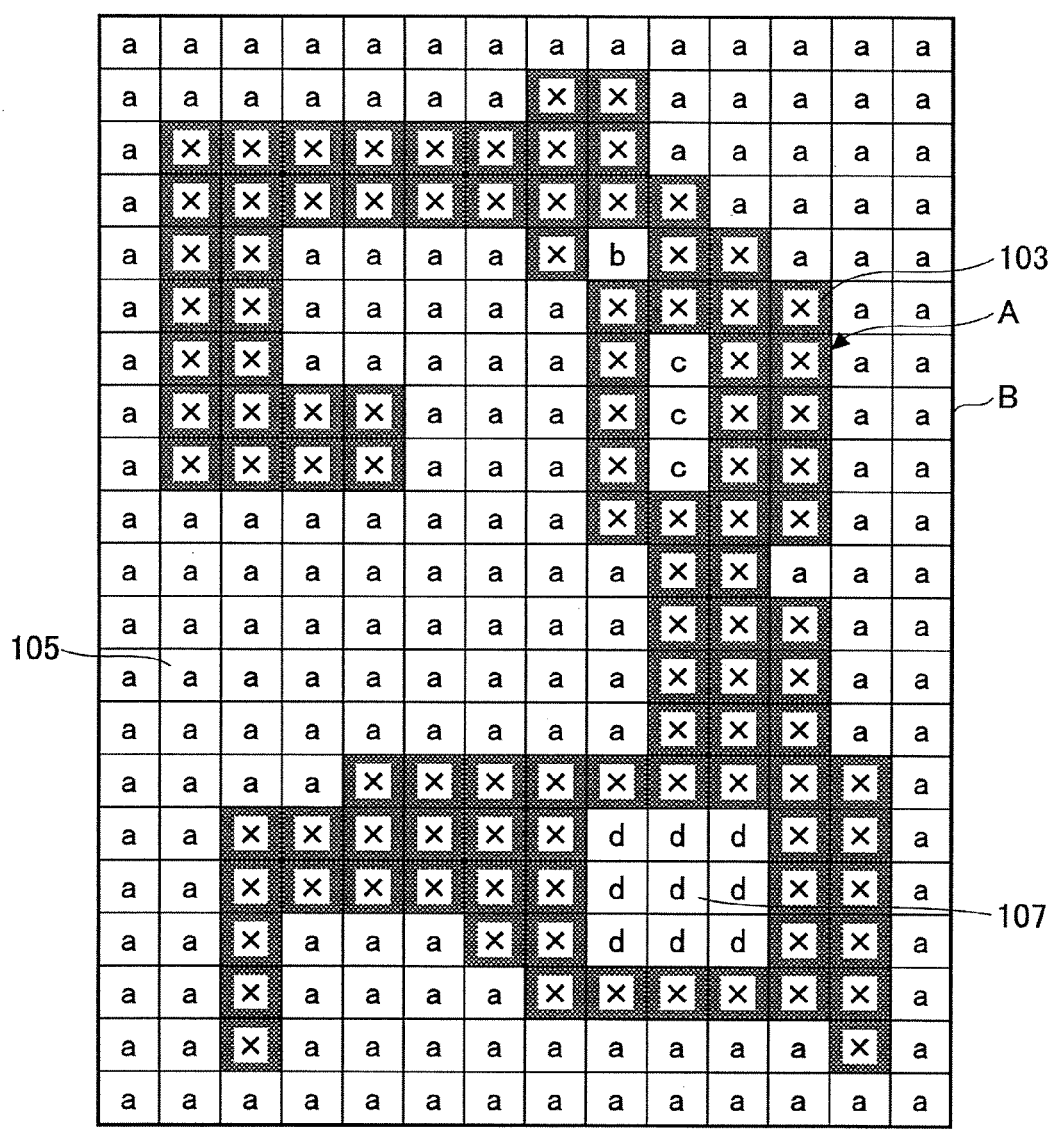
FIG. 10 is a drawing showing four-direction good chip groups calculated in the embodiment of the present invention.
Figure 12:
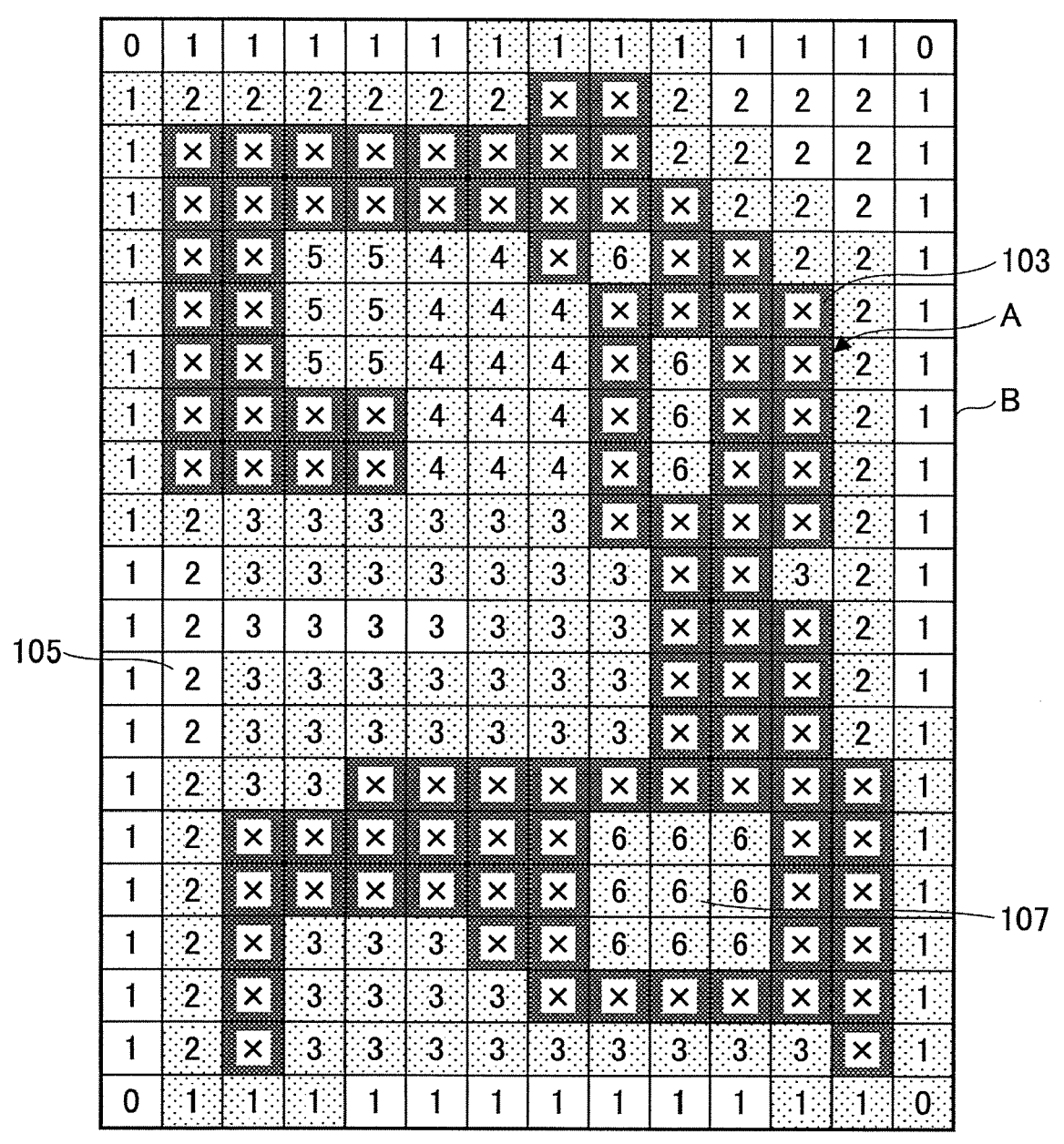

FIG. 9 is a flowchart showing a chip quality judging method according to still another embodiment of the present invention. FIGS. 10 through 12 are enlarged drawings showing the defective chip concentrated distribution nearby area provided in this embodiment. This embodiment of the present invention is described with reference to FIGS. 9 through 12. The processes in steps S1 through S5-1 in FIG. 9 are the same as those described above, and the descriptions of the processes are omitted here.

Step S5-2: This step is performed after the second classifying step S5-1. In this step, the judge target chips in the defective chip concentrated distribution nearby area "B" are divided into four-direction good chip groups based on the continuity in four directions of the X axis and the Y axis directions with respect to each of the judge target chips (Four-direction judge target dividing step). FIG. 10 shows the result of dividing the judge target chips in the four-direction judge target dividing step S5-2. As shown in FIG. 10, the judge target chips in the defective chip concentrated distribution nearby area "B" are divided into four four-direction good chip groups "a", "b", "c", and "d".

Step S5-3: In this step, when all the chip indexes of the judge target chips in a four-direction good chip group are other than a prescribed four-direction good group judge chip index, all the chip indexes of the judge target chips in the four-direction good chip groups are changed into an unused chip index such as "6" (Third classifying step). In this embodiment, the four-direction good group judge chip index is set to be "3". Therefore, when the chip index of any of the judge target chips in a four-direction good chip group is "3", all the chip indexes of the judge target chips in the four-direction good chip group are unchanged. Referring to FIGS. 10 and 11, in the four-direction good chip group "a", there are included the judge target chips having the chip index of "3". Therefore, all the chip indexes of the judge target chips in the four-direction good chip group "a" are unchanged. On the other hand, in the four-direction good chip groups "b", "c", and "d", there is no judge target chips included having the chip index of "3". Therefore, all the chip indexes of the judge target chips in the four-direction good chip group "a" are changed into "6". FIG. 11 shows the result of the classifying step S5, the second classifying step S5-1 and the third classifying step S5-3. As shown in FIG. 11, it can be judged that the judge target chips having the chip index of "6" are surrounded by a higher proportion of the defective chips than the judge target chips having the chip index of "5".

Step S6-2: In this step, when there is any defective chip in the defective chip concentrated distribution area "A" detected within a judgment range previously determined based on the chip index of the judge target chip, the judge target chip is judged as the additional defective chip (Judging step). For example, in this embodiment, the judgment range of each judge target chip is defined as follows. When the chip index of the judge target chip is any of "0", "1", and "2", the judgment range consists of the judge target chip and the additional chips constituting a frame area having a width of "one" chip and contiguously surrounding the judge target chip. In the same manner, when the chip index of the judge target chip is "3", "4", "5", and "6" the judgment range consists of the judge target chip and the additional chips constituting a frame area having a width of "two", "three", "four", and "five" chips, respectively, and contiguously surrounding the judge target chip. FIG. 12 shows the distribution of the additional defective chips in dotted areas. The additional defective chips are treated as the additional-inking target chips.

According to this embodiment of the present invention, it is possible to detect the judge target chips surrounded by a higher proportion of the defective chips and change the chip index of the detected judge target chips, thereby enabling more appropriate determination of the additional-inking target chips.

Figure 13:
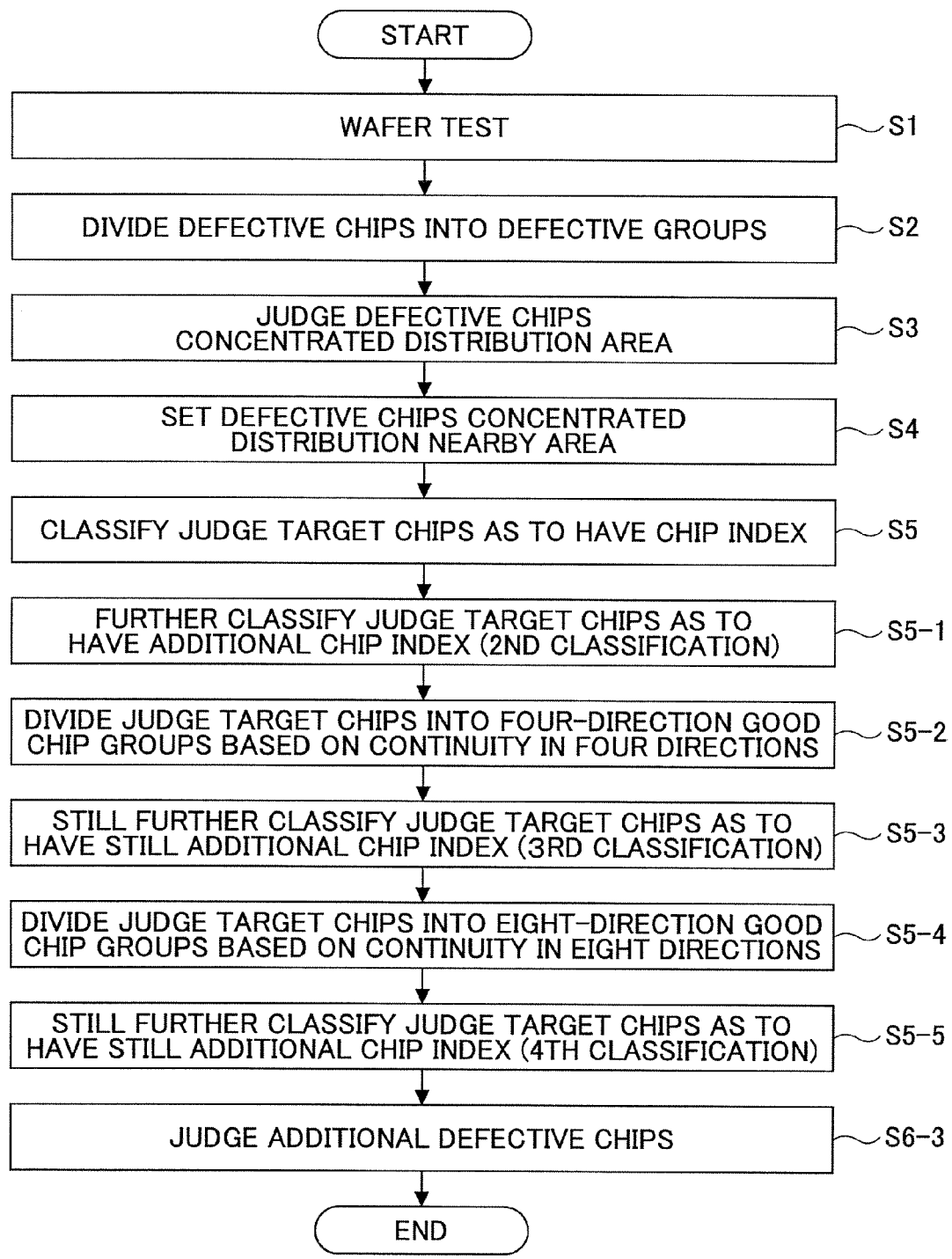
FIG. 13 is a flowchart showing an exemplary procedure of a chip quality judging method according to still another embodiment of the present invention.
Figure 14:
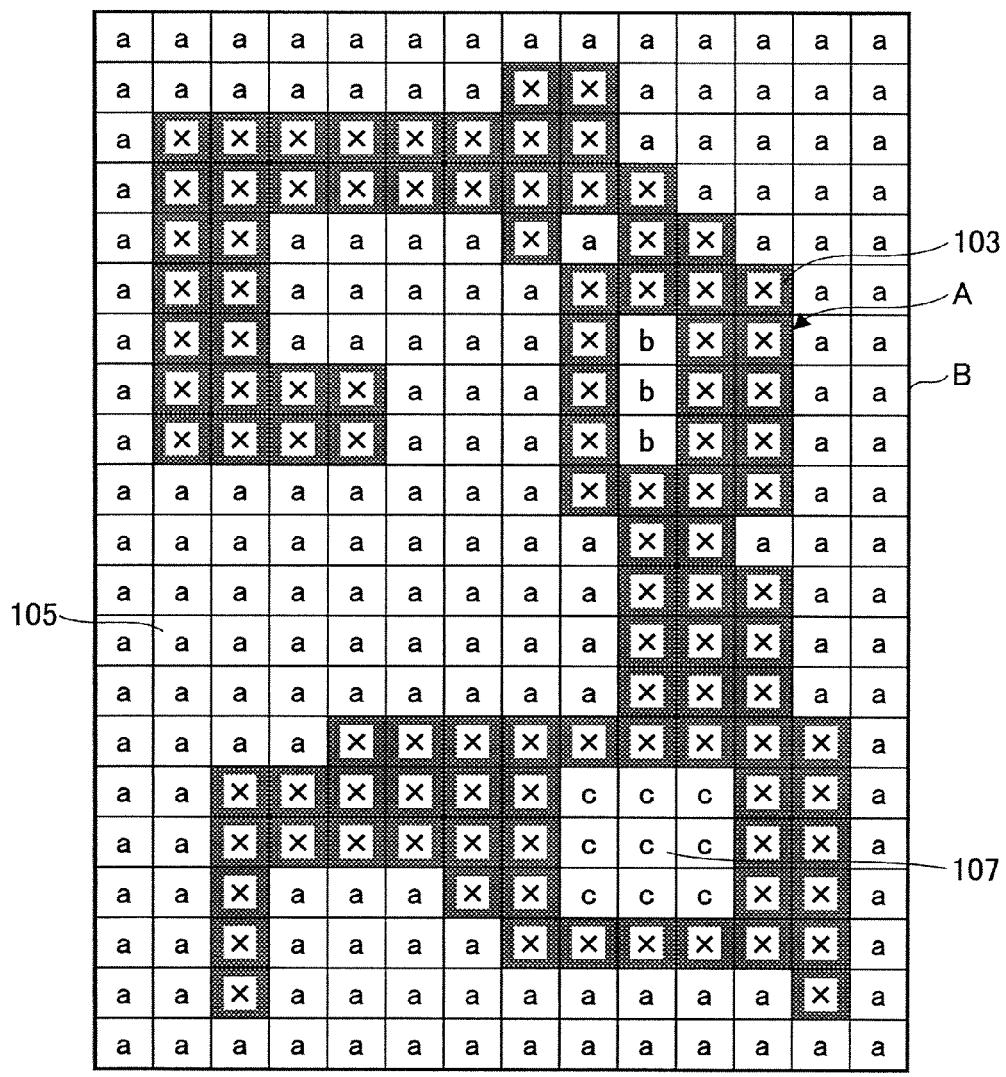
FIG. 14 is a drawing showing eight-direction good chip groups calculated in the embodiment of the present invention.
Figure 15:
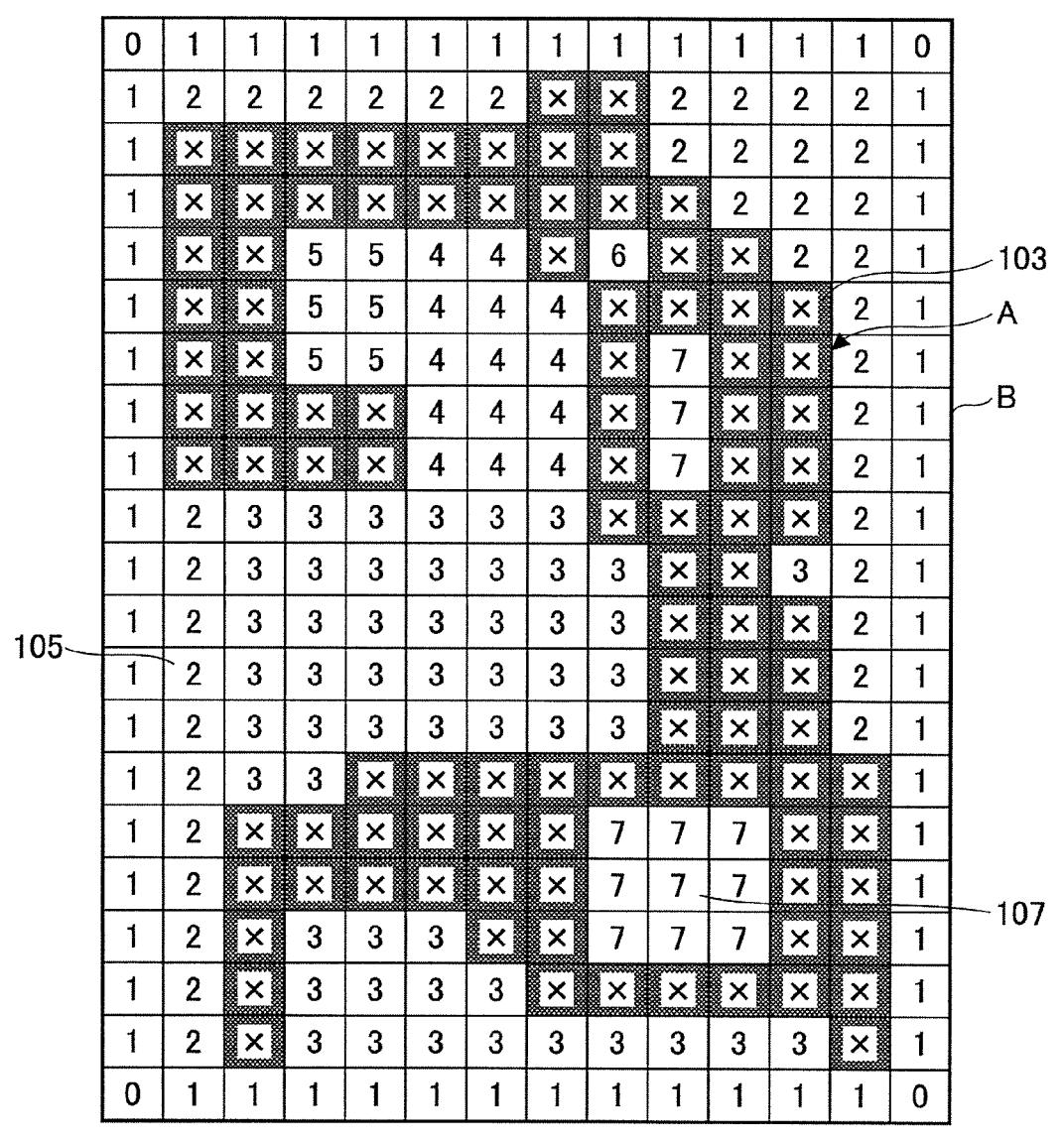
Figure 16:
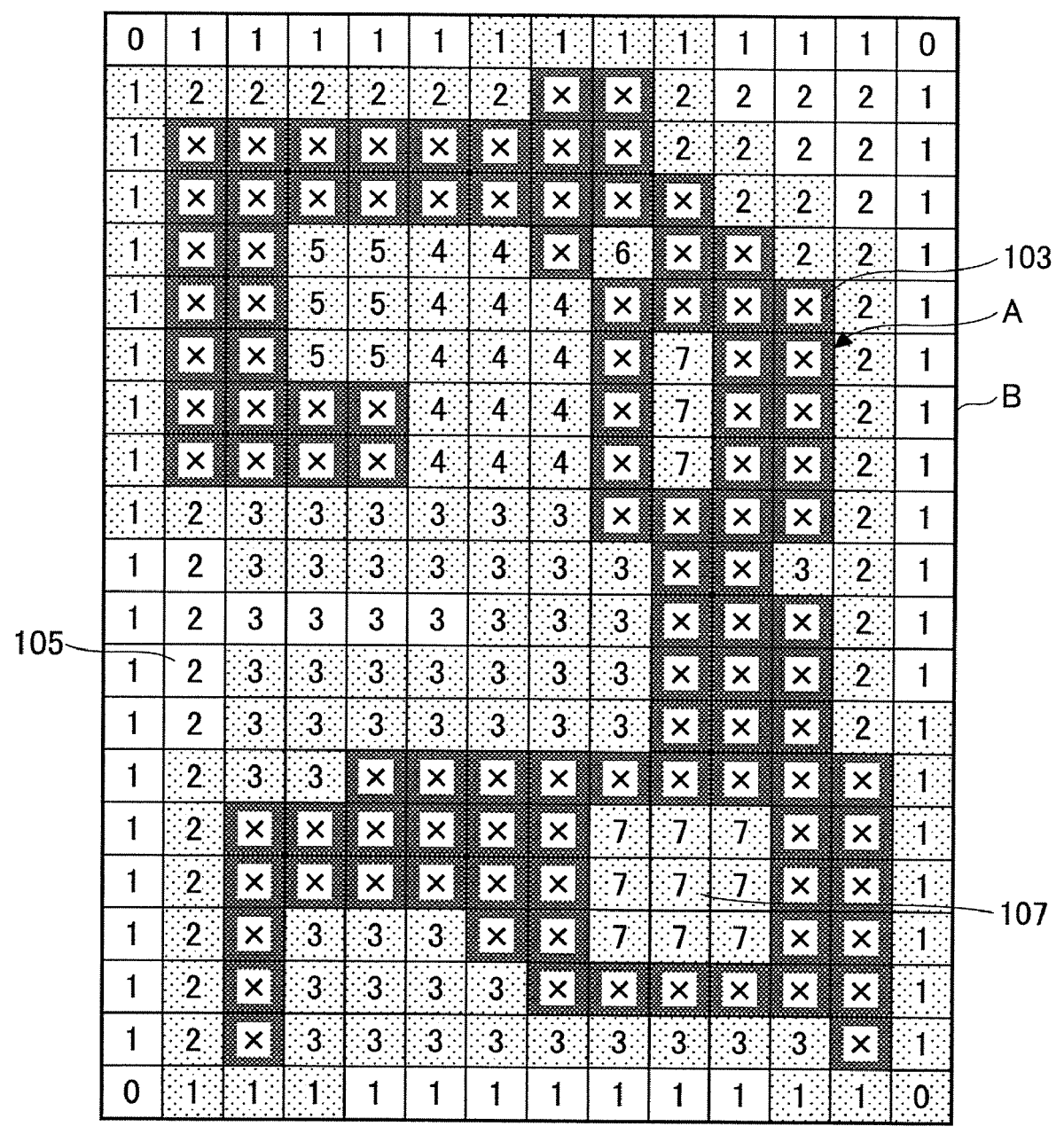

FIG. 13 is a flowchart showing a chip quality judging method according to still another embodiment of the present invention. FIGS. 14 through 16 are enlarged drawings showing the defective chip concentrated distribution nearby area provided in this embodiment. This embodiment of the present invention is described with reference to FIGS. 13 through 16. The processes in steps S1 through S5-3 in FIG. 13 are the same as those described above, and the descriptions of the processes are omitted here.

Step S5-4: This step is performed after the third classifying step S5-3. In this step, the judge target chips in the defective chip concentrated distribution nearby area "B" are divided into eight-direction good chip groups based on the continuity in eight directions with respect to each of the judge target chips (Eight-direction judge target dividing step). The eight directions consist of the four directions of the X axis and the Y axis and additional four directions each inclined 45 degrees with respect to the X axis and the Y axis. FIG. 14 shows the result of dividing the judge target chips in the eight-direction judge target dividing step S5-4. As shown in FIG. 14, the judge target chips in the defective chip concentrated distribution nearby area "B" are divided into three eight-direction good chip groups "a", "b", and "c".

Step S5-5: In this step, when all the chip indexes of the judge target chips in an eight-direction good chip group are other than a prescribed eight-direction good group judge chip index, all the chip indexes of the judge target chips in the eight-direction good chip group are changed into an unused chip index such as "7" (Fourth classifying step). In this embodiment, the eight-direction good group judge chip index is set to be "3". Therefore, when the chip index of any of the judge target chips in an eight-direction good chip group is "3", all the chip indexes of the judge target chips in the eight-direction good chip group are unchanged. Referring to FIGS. 14 and 15, in the eight-direction good chip group "a", there are the judge target chips having the chip index of "3". Therefore, all the chip indexes of the judge target chips in the eight-direction good chip group "a" are unchanged. On the other hand, in the eight-direction good chip groups "b" and "c", there are no judge target chips having the chip index "3". Therefore, all the chip indexes of the judge target chips in the four-direction good chip group "b" and "c" are changed into "7". FIG. 15 shows the result of the classifying step S5, the second classifying step S5-1, the third classifying step S5-3, and the fourth classifying step S5-5. As shown in FIG. 15, it can be judged that the judge target chips having the chip index of "7" are surrounded by the defective chips.

Step S6-3: In this step, when there is any defective chip in the defective chip concentrated distribution area "A" detected within a judgment range previously determined based on the chip index of the judge target chip, the judge target chip is judged as the additional defective chip (Judging step). For example, in this embodiment, the judgment range of each judge target chip is defined as follows. When the chip index of the judge target chip is any of "0", "1", and "2", the judgment range consists of the judge target chip and the additional chips constituting a frame area having a width of "one" chip and contiguously surrounding the judge target chip. In the same manner, when the chip index of the judge target chip is "3", "4", "5", "6", and "7" the judgment range consists of the judge target chip and the additional chips constituting a frame area having a width of "two", "three", "four", "five", and "six" chips, respectively, and contiguously surrounding the judge target chip. FIG. 16 shows the distribution of the additional defective chips in dotted areas. The additional defective chips are treated as the additional-inking target chips.

According to this embodiment of the present invention, it is possible to detect the judge target chips surrounded by the defective chips and change the chip indexes of the detected judge target chips, thereby enabling more appropriate determination of the additional-inking target chips.

When comparing the processes of the four-direction judge target dividing step S5-2 and the eight-direction judge target dividing step S5-4, the only difference is whether checking the continuity of the inclined directions is excluded or included. Therefore, in the actual processing, those two processes can be performed as process extremely similar to each other. Because of this feature, advantageously, when two kinds of group IDs are provided to each of the divided groups of the good chips, those processes may be performed simultaneously, thereby reducing the data processing time.

In a chip quality judging method according to an embodiment of the preset invention, the classifying step is a primary step to obtain the chip index of the judge target chips. However, when the second classifying step, a pair of the four-direction judge target dividing step and the third classifying step, and a pair of the eight-direction judge target dividing step and the fourth classifying step are employed, those steps to be performed can be arbitrarily selected and the order of performing those steps can be arbitrarily arranged. It should be noted that when there is no judge target chip having the chip index of "4" obtained in the classifying step, the result is unchanged even if any of the second, third, and fourth classifying steps is performed.

In the same manner, in any of the second, third, and fourth classifying steps, when any judge target chip having the theoretically highest value of the chip index is not calculated, the result is unchanged even if any further step is performed. Because of the feature, the processing time can be reduced by checking whether there is any judge target chip having the theoretically highest value of the chip index before executing the next processing step.

Still further, the second, third, and fourth classifying steps are further steps for the judge target chips classified to have the chip index of "4" in the classifying step. In the embodiments described above, as the results of the second, third, and fourth classifying steps are further steps, chip indexes other than "4" are used. However, there may be other classifying methods than this. For example, the results of the second, third, and fourth classifying steps are classified as the elements (levels) belonging to the chip index "4". As a result, the chip indexes are classified into five categories "0" through "4", and the chip index "4" has three levels "1" though "3".

In the above embodiments, there is provided the judgment range based on the chip index of the judge target chips. Then, when the judge target chips are within the judgment range from the defective chip in the defective chip concentrated distribution area "A", the judge target chips are judged as the additional defective chips. However, there may be various other judging steps according to the embodiments of the present invention.

For example, in another example of the judging step, after the chip index of the judge target chips in the defective chip concentrated distribution nearby area "B" are classified by the classifying method according to the embodiment of the present invention as described above, the judge target chips having the same chip index as a prescribed judge chip index are judged as the additional defective chips. For example, it is assumed that the judge chip indexes are "3", "4", "5", "6", and "7". Then the judge target chips having any of these chip indexes are judged as the additional defective chips. In this case, preferably, the judge target chips contiguous to the defective chips in the defective chip concentrated distribution area "A" are judged as the additional defective chips even if the chip indexes of the judge target chips are "2" or less.

In addition, in still another example of the judging step, the influence of the defective chip concentrated distribution area "A" on the judge target chips in the defective chip concentrated distribution nearby area "B" is classified into some influence levels with respect to each of the judge target chips. On the other hand, a threshold level corresponding to each of the chip indexes is determined. Then, it is determined whether the judge target chip is judged as the additional defective chip by comparing the influence level and the threshold level with respect to the judge target chip.

Figure 17:
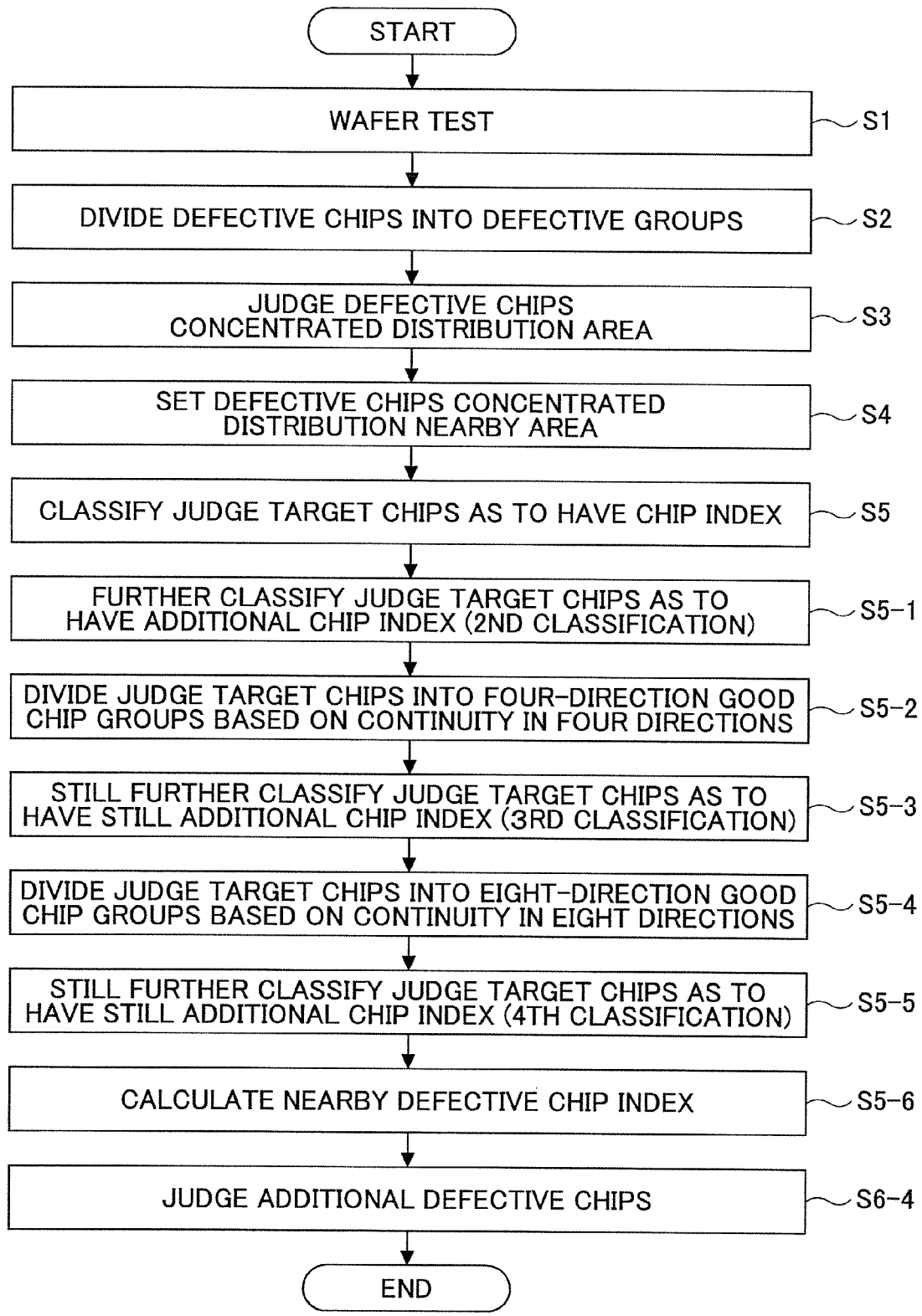
FIG. 17 is a flowchart showing an exemplary procedure of a chip quality judging method according to still another embodiment of the present invention.
Figure 19:
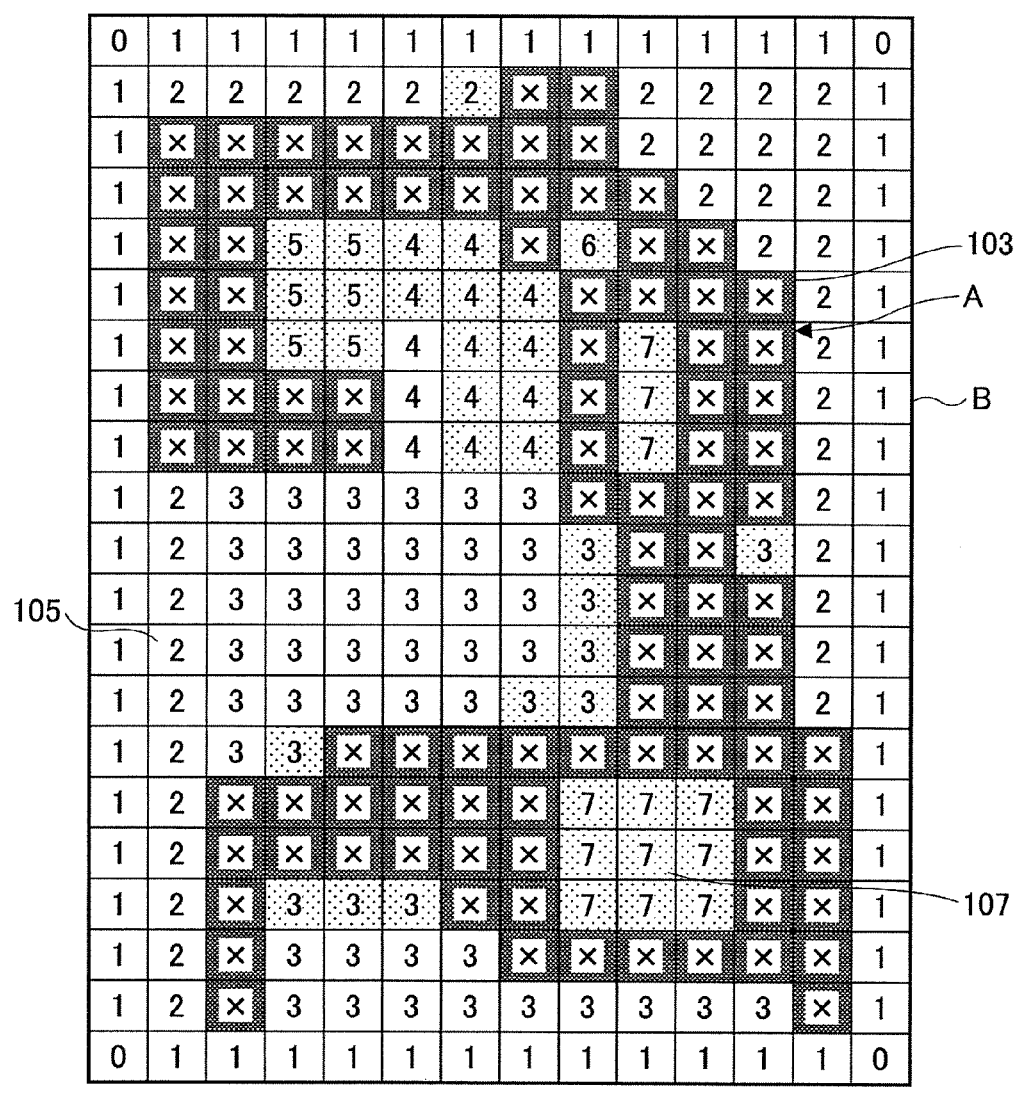

FIG. 17 is a flowchart showing a chip quality judging method according to still another embodiment of the present invention. FIGS. 18 and 19 are enlarged drawings showing the defective chip concentrated distribution nearby area provided in this embodiment. This embodiment of the present invention is described with reference to FIGS. 17 through 19. The processes in steps S1 through S5-5 in FIG. 17 are the same as those described above, and the descriptions of the processes are omitted here.

Step S5-6: This step is performed after the fourth classifying step S5-5. In this step, with respect to each of the judge target chips, the number of defective chips within a prescribed range from the judge target chip and in the defective chip concentrated distribution nearby area "B" are calculated. Hereinafter, the counted number of the defective chips is referred to as "nearby defective chip index" (Nearby defective chip index calculating step). In this embodiment, the prescribed range in this nearby defective chip index calculating step is defined as a rectangle consisting of the judge target chips and the additional chips constituting a frame area having a width of "two" chips and contiguously surrounding the judge target chips. FIG. 18 shows the nearby defective chip indexes based on the calculation result by the nearby defective chip index calculating step S5-6. It should be noted that the nearby defective chip index calculating step S5-6 may be performed anytime between the defective chip concentrated distribution nearby area setting step S5-6 and a judging step S6-4 described below.

Step S6-4: In this step, when there is a judge target chip having the nearby defective chip index greater than a nearby defective chip index threshold value previously determined with respect to each chip index, the judge target chip is judged as the additional defective chip (Judging step). For example, in this embodiment, the nearby defective chip index threshold values are given as follows: "0" (when the chip index is "6" or "7"), "5" (when the chip index is "5"), "6" (when the chip index is "4"), "10" (when the chip index is "3"), and "12" (when the chip index is "2"). However, when the chip index is "1" or "0", this judging step is not performed. The additional defective chips are determined using the chip indexes in the defective chip concentrated distribution nearby area "B" in FIG. 15 and the above nearby defective chip index threshold values. FIG. 19 shows the additional defective chips in dotted area as the result of this step. Those additional defective chips are treated as the additional-inking target chips. In this judging step S6-4, the good chips contiguous to the defective chips in the defective chip concentrated distribution area "A" may be judged as the additional defective chips.

Figure 20:
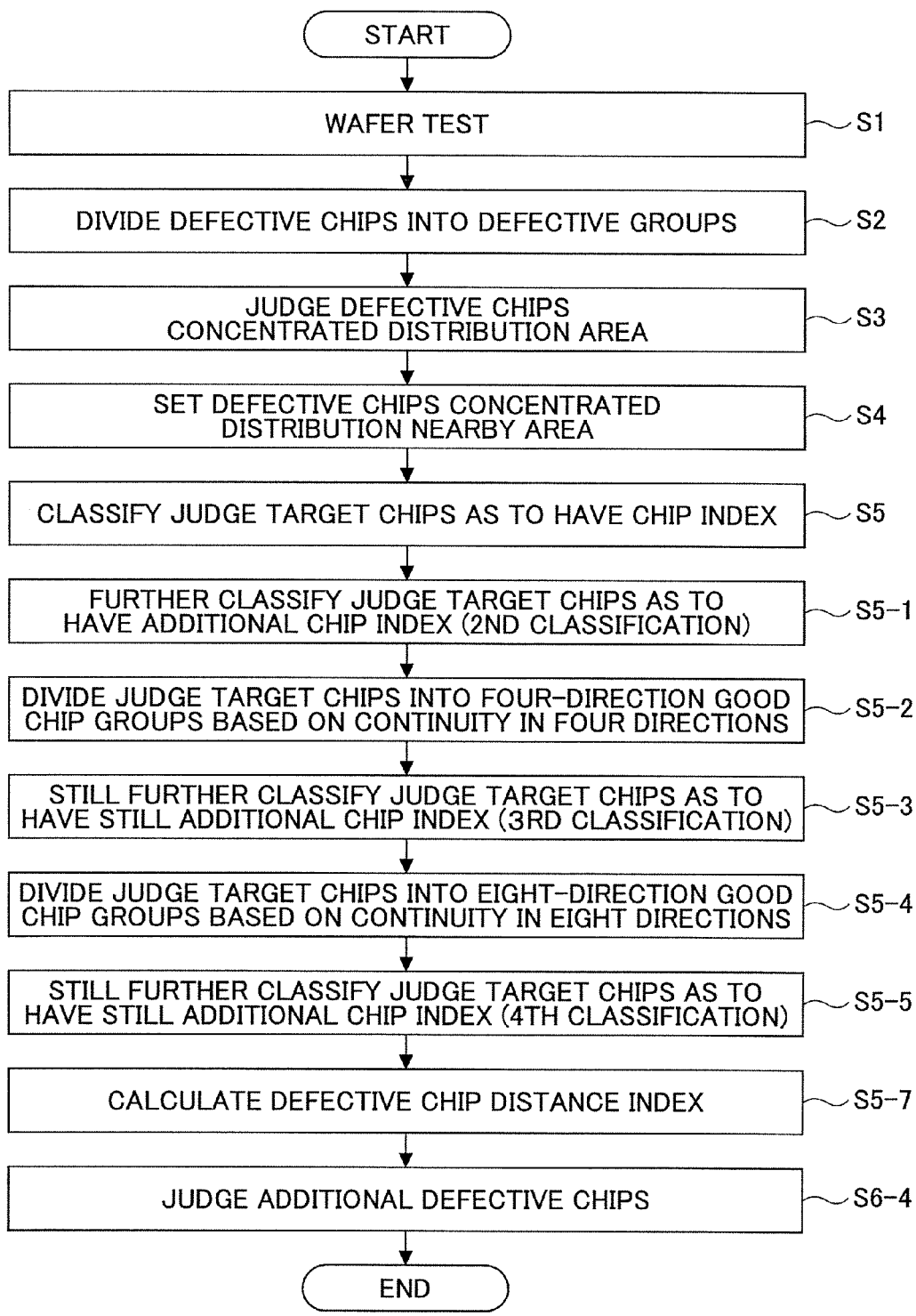
FIG. 20 is a flowchart showing an exemplary procedure of a chip quality judging method according to still another embodiment of the present invention.
Figure 22:
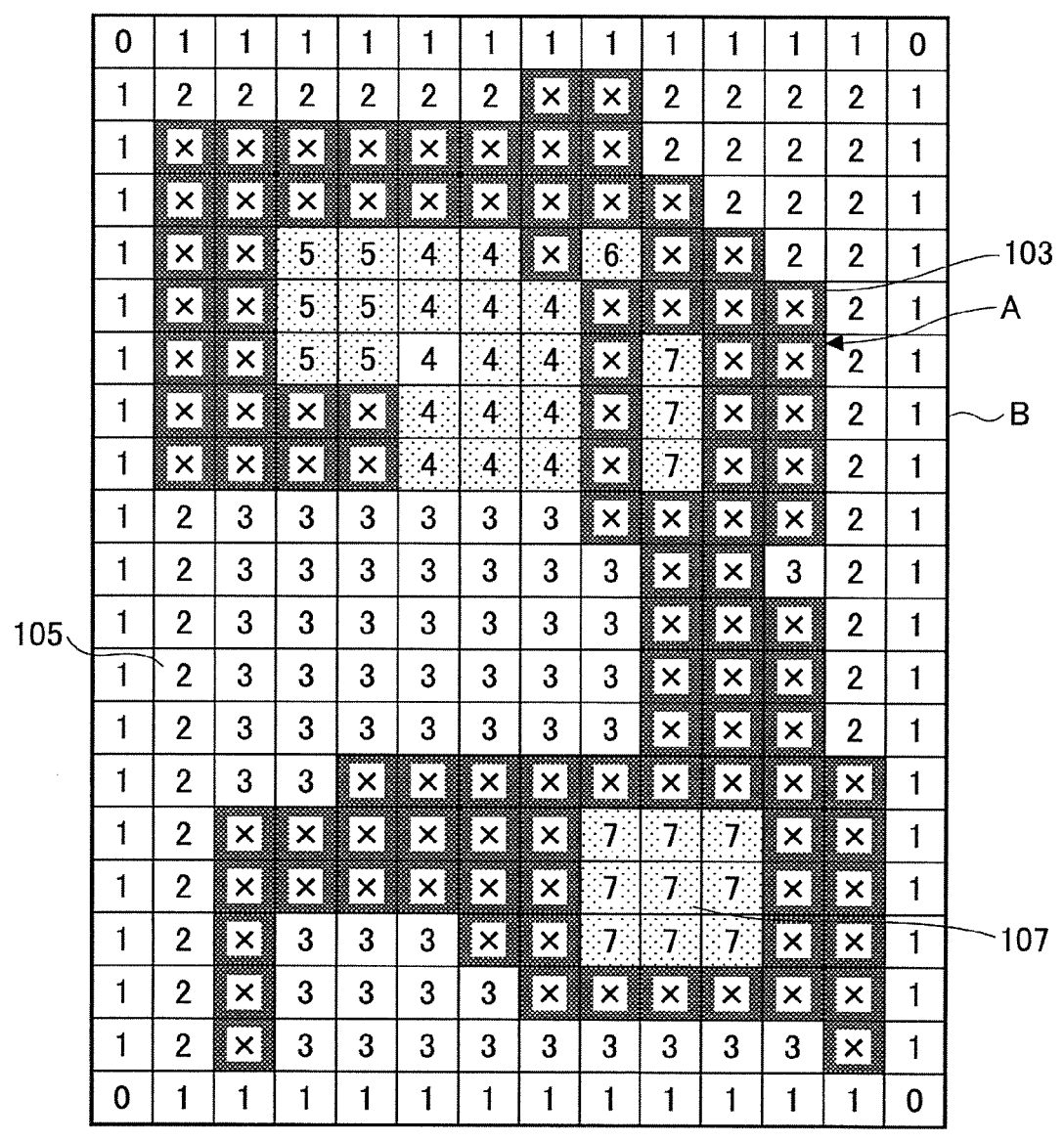

FIG. 20 is a flowchart showing a chip quality judging method according to still another embodiment of the present invention. FIGS. 21 and 22 are enlarged drawings showing the defective chip concentrated distribution nearby area provided in this embodiment. This embodiment of the present invention is described with reference to FIGS. 20 through 22. The processes in steps S through S5-5 in FIG. 20 are the same as those described above, and the descriptions of the processes are omitted here.

Step S5-7: This step is performed after the fourth classifying step S5-5. In this step, with respect to each of the judge target chips, the shortest distance to the defective chip in the defective chip concentrated distribution nearby area "B" in the four directions of the X axis and the Y axis with respect to the judge target chip is calculated. Hereinafter, the calculated shortest distance is referred to as a "distance index" to the defective chip (Distance index to the defective chip calculating step). FIG. 21 shows the distance indexes to the defective chip based on the calculation result by the distance index to the defective chip calculating step S5-7. It should be noted that the distance index to the defective chip calculating step S5-7 may be performed anytime between the defective chip concentrated distribution nearby area setting step S5-6 and a judging step S6-5 described below.

Step S6-5: In this step, when there is a judge target chip having the distance index equal to or less than a distance index threshold value previously determined with respect to each chip index, the judge target chip is judged as the additional defective chip (Judging step). For example, in this embodiment, the distance index threshold values are given as follows: "3" (when the chip index is "7") and "2" (when the chip index is "4", "5", or "6"). However, when the chip index is "0", "1", "2", or "3", this judging step is not performed. The additional defective chips are determined using the chip indexes in the defective chip concentrated distribution nearby area "B" in FIG. 15 and the above distance index threshold values. FIG. 22 shows the additional defective chips in dotted area as the result of this step. Those additional defective chips are treated as the additional-inking target chips. In this judging step S6-5, the good chips contiguous to the defective chips in the defective chip concentrated distribution area "A" may be judged as the additional defective chips.

In the distance index to the defective chip calculating step S5-7, as is the case in FIG. 21, the distance index of the judge target chip at the corner of the defective chip concentrated distribution area "A" may be largely different from that of the contiguous judge target chip. However, this step can be used as effective information for judging the judge target chips having the chip index of "4" or more. Further, the distance index to the defective chip can be calculated while the classifying step S5 is being performed. Because of this feature, this step is useful to reduce the processing time.

In this embodiment, the shortest distance in the four directions of the X axis and the Y axis is calculated and the calculated distance is set to be the index. However, there are some other methods for calculating the shortest distance to the defective chip. For example, first, it is determined whether any of the chips contiguously surrounding the judge target chip is the defective chip in the defective chip concentrated distribution nearby area "B" (first round check). When no defective chip is detected, next, it is determined whether any of the chips contiguously surrounding the chips checked in the first around check is the defective chip in the defective chip concentrated distribution nearby area "B" (second around check). This check is repeated until the defective chip is detected. By doing this, it is also possible to easily calculate the shortest length to the defective chip. In this method, preferably, in each round check, the chips in the four directions of the X axis and the Y axis are checked first, followed by checking the chips in the other four directions inclined 45 degrees with respect to each the X axis and the Y axis so that the calculated distance is gradually increased.

In the above embodiments, for illustrative purposes, the defective chip concentrated distribution nearby area "B" is defined as a rectangular area consisting of the minimum rectangle capable of enclosing all the defective chips in the defective chip concentrated distribution area "A" and the additional chips constituting a frame area having a width of one chip and contiguously surrounding the minimum rectangular as shown in FIG. 3. However, the size and shape of the defective chip concentrated distribution nearby area "B" is not limited as such. Any size and the shape may be applied to the defective chip concentrated distribution nearby area "B" as long as the defective chip concentrated distribution nearby area "B" includes all defective chips of the defective chip concentrated distribution area "A".

For example, the defective chip concentrated distribution nearby area "B" may be defined as the minimum rectangle including all the defective chips in the defective chip concentrated distribution area "A". In this case, obviously, the good chip contiguous to the defective chip in the defective chip concentrated distribution area "A" and outside of the defective chip concentrated distribution nearby area "B" cannot be judged. However, when the judging step capable of judging the good chips within a prescribed range from the defective chips of the defective chip concentrated distribution area "A" is employed, the good chip contiguous to the defective chip is judged as the additional-inking target chip. Therefore, when the defective chip concentrated distribution nearby area "B" is defined as the minimum rectangle including all the defective chips in the defective chip concentrated distribution area "A", the number of judge target chips is reduced compared with that in the defective chip concentrated distribution nearby area "B" in the above embodiments, thereby reducing the data processing time.

On the other hand, when the additional defective chips are automatically judged in a manner as described above, more additional defective chips than expected may be judged as the additional-inking target chips.

To solve the problem, preferably, a judgment validity checking step of checking the validity of the judgment result in the judging step is performed after the judging step.

In an exemplary judgment validity checking step, the validity of the judging step is checked based on the difference or ratio between the number of defective chips in the defective chip concentrated distribution area "A" in the defective chip concentrated distribution nearby area "B" and the number of the additional defective chips. By doing this check, it becomes possible to avoid the problem that more than necessary of the additional defective chips judged in the judging step become the additional-inking target chips. Herein, when different criteria are used depending on the number of the defective chips in the defective chip concentrated distribution area "A", the judgment validity checking step in accordance with the scale of the defective chip concentrated distribution area "A" can be performed, thereby enabling the appropriate checking of the validity of the judging step.

For example, according to the processes of steps S1 through S6 described with reference to FIG. 2, the calculated additional defective chips are shown in dotted area in FIG. 5. In FIG. 5, the numbers of the defective chips in the defective chip concentrated distribution area "A" in the defective chip concentrated distribution nearby area "B" and the additional defective chips are "103" and "86", respectively.

In the above judgment validity checking step, for example, when the difference between the number of the defective chips in the defective chip concentrated distribution area "A" in the defective chip concentrated distribution nearby area "B" and the number of the additional defective chips is "10" (threshold value) or more, it is determined that the result of the judging step is valid. Based on this assumption, the judging in step S6 can be considered as valid because the difference between the number of the defective chips in the defective chip concentrated distribution area "A" in the defective chip concentrated distribution nearby area "B" and the number of the additional defective chips is "17", which is greater than "10".

Further, in the above judgment validity checking step, the validity of the judging step may be checked based on a ratio between the number of the defective chips in the defective chip concentrated distribution area "A" in the defective chip concentrated distribution nearby area "B" and the number of the additional defective chips. For example, when the ratio of (the number of the additional defective chips)/(the number of the defective chips in the defective chip concentrated distribution area "A" in the defective chip concentrated distribution nearby area "B")<1, it is determined that the result of the judging step is valid. Based on this assumption, the judgment in step S6 can be considered as valid because the ratio (the number of the additional defective chips)/(the number of the defective chips in the defective chip concentrated distribution area "A" in the defective chip concentrated distribution nearby area "B")=86/103<1.

It should be noted that when it is determined that the result of the judging step is not valid, the additional defective chips may be determined based on another algorithm.

Further, in another example of the judgment validity checking step, the additional defective chips having the same chip index in the defective chip concentrated distribution nearby area "B" are divided into chip index groups based on the continuity of the additional defective chips in eight directions consisting of four directions in the X axis and the Y axis and additional four directions each inclined 45 degrees with respect to the X axis and the Y axis. Then, with respect to each of the chip index groups, a rectangular area is defined so as to consist of a minimum rectangle enclosing all the additional defective chips in the chip index group and a frame area having a width of "one" chip and contiguously surrounding the minimum rectangle. Then, the validity of the judging step is checked based on the difference or the ratio between the number of the defective chips and the number of the additional defective chips within the defined rectangle. By doing this, it becomes possible to check the validity of the judgment more accurately. Herein, when different criteria are used depending on the chip index of the additional defective chips in the chip index group, it is possible to check the validity of the judgment further more accurately.

This judgment validity checking step is effective when the additional defective chips having the same chip index are divided into groups based on the continuity of the additional defective chips, and the additional-inking target chips are determined with respect to each of the groups.

Figure 23:
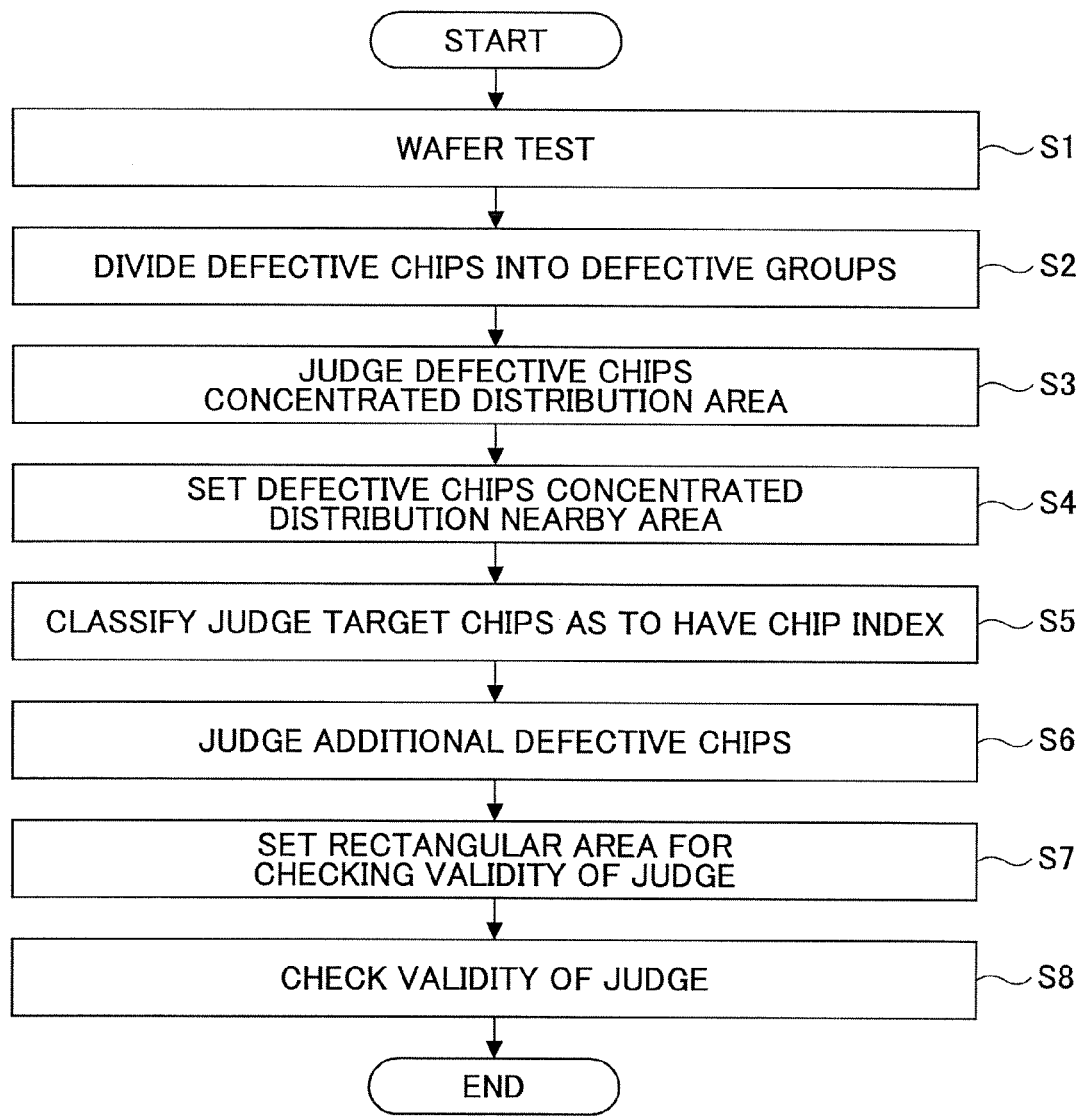
FIG. 23 is a flowchart showing an exemplary procedure of a chip quality judging method according to still another embodiment of the present invention.
Figure 24:
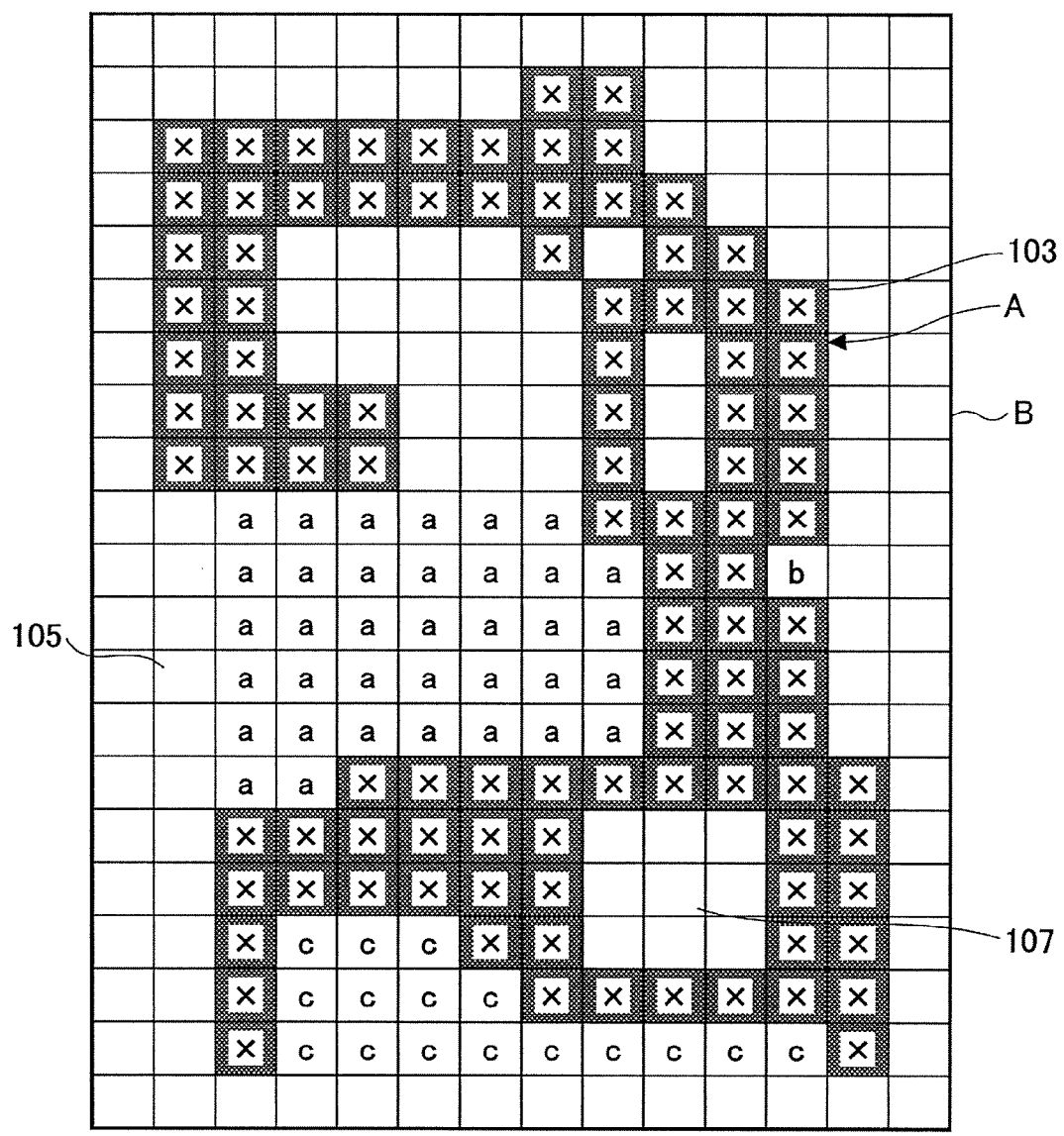
FIG. 24 is a drawing showing chip index groups of the chip index "3" calculated in the embodiment of the present invention.
Figure 25:
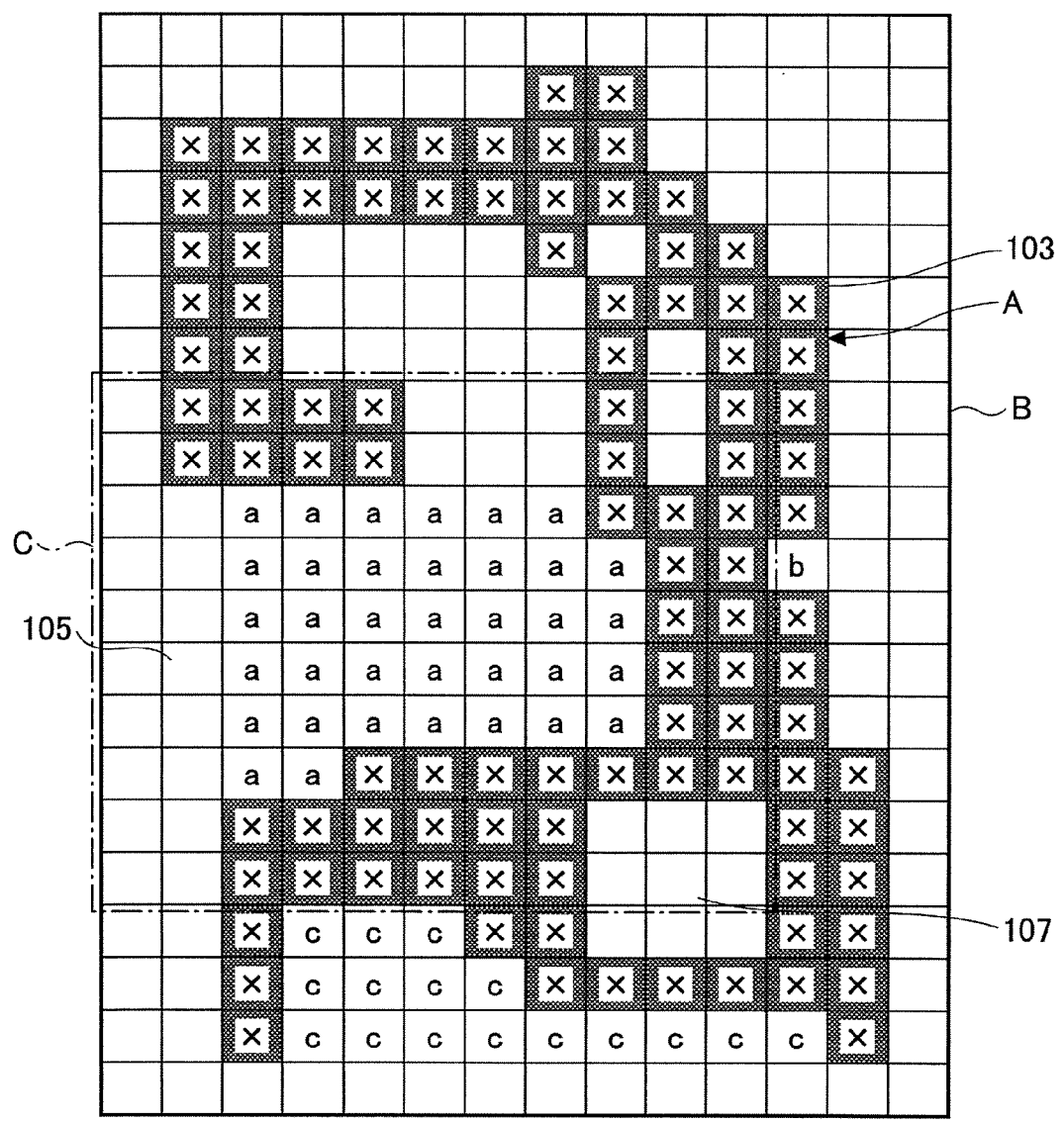
FIG. 25 is a drawing showing a rectangular area "C" for checking the validity of the judgment in the judging step with respect to the chip index group "a" calculated in the embodiment of the present invention.

FIG. 23 is a flowchart showing a chip quality judging method according to still another embodiment of the present invention. FIGS. 24 and 25 are enlarged drawings showing the defective chip concentrated distribution nearby area provided in this embodiment. This embodiment of the present invention is described with reference to FIGS. 23 through 25. The processes in steps S1 through S6 in FIG. 23 are the same as those described above, and the descriptions of the processes are omitted here.

Step S7: In this step, the judge target chips having the same chip index in the defective chip concentrated distribution nearby area "B" are divided into chip index groups based on the continuity of the judge target chips in the four directions of the X axis and the Y axis or in the eight directions consisting of the four directions and additional four directions each inclined 45 degrees with respect to the X axis and the Y axis (Chip index group dividing step). In this case, when the chips having the chip index of "3" are focused among the chip indexes calculated as the result of the defective chip concentrated distribution nearby area setting step S4, the additional defective chips having the chip index of "3" in the defective chip concentrated distribution nearby area "B" can be divided into three chip index groups: "a", "b", and "c" as shown in FIG. 24.

Step S8: With respect to each of the chip index groups "a", "b", and "c", a rectangular area for the judgment validity check is defined so as to consist of a minimum rectangle enclosing all the additional defective chips in the chip index group and a frame area having a width of, at least "one" chip, herein "two" chips and contiguously surrounding the minimum rectangle for the judgment validity check. Then, the validity of the judging step is checked based on the difference or the ratio between the number of the defective chips of the defective chip concentrated distribution area "A" in the rectangular area for the judgment validity check and the number of the additional defective chips (Judgment validity checking step).

FIG. 25 shows a rectangular area "C" as the rectangular area for the judgment validity check to check the validity of the judging step with respect to the chip index group "a".

As shown in FIG. 25, in the rectangular area "C" for checking the validity of the judging step with respect to the chip index group "a", the number of the defective chips in the defective chip concentrated distribution area "A" is "42", and the number of additional defective chips is "36". In this step S8, for example, when the difference between the number of the defective chips in the defective chip concentrated distribution area "A" and the number of the additional defective chips is "5" (threshold value) or more, it is determined that the chip index group is valid. Based on this assumption, in the rectangular area "C" for the judgment validity check with respect to the chip index group "a", the judging in step S8 can be considered as valid because the difference between the number of the defective chips in the defective chip concentrated distribution area "A" and the number of the additional defective chips is "6", which is greater than "5".

In the same manner, in the rectangular area for the judgment validity check with respect to the chip index group "b", the judging step with respect to the index group "b" can be considered as valid because the number of the defective chips in the defective chip concentrated distribution area "A" is "13" and the number of the additional defective chips is "1" and accordingly the difference between the numbers is "12", which is greater than "5".

Further, in the rectangular area for the judgment validity check with respect to the chip index group "c", the judging step with respect to the index group "c" can be considered as valid because the number of the defective chips in the defective chip concentrated distribution area "A" is "30" and the number of the additional defective chips is "16" and accordingly the difference between the numbers is "14", which is greater than "5".

Further, in the above judgment validity checking step S8, the validity of the judging step may be checked based on a ratio between the number of the defective chips in the rectangular area for the judgment validity check and the number of the additional defective chips. For example, when the ratio of (the number of the additional defective chips)/(the number of the defective chips in the defective chip concentrated distribution area "A")<1, it is determined that the result of the judging step is valid. Based on this assumption, in the rectangular area "C" for judgment validity checking, the judgment in step S8 with respect to the chip index group "a" can be considered as valid because the ratio (the number of the additional defective chips)/(the number of the defective chips in the defective chip concentrated distribution area "A")=36/42<1.

In the same manner, in the rectangular area for judgment validity check with respect to the chip index group "b", the number of the defective chips in the defective chip concentrated distribution area "A" is "13", and the number of the additional defective chips is "1". Therefore, the judgment in the judging step can be considered as valid due to the ratio (the number of the additional defective chips)/(the number of the defective chips in the defective chip concentrated distribution area "A")=1/13<1.

Further, in the rectangular area for judgment validity check with respect to the chip index group "c", the number of the defective chips in the defective chip concentrated distribution area "A" is "30", and the number of the additional defective chips is "16". Therefore, the judgment in the judging step can be considered as valid due to the ratio (the number of the additional defective chips)/(the number of the defective chips in the defective chip concentrated distribution area "A")=16/30<1.

The same process is performed with respect to each of the chip indexes "0", "1", "2", and "4". Herein, different criteria may be used depending on the chip indexes. It should be noted that when there is no additional defective chips in a chip index group and accordingly the rectangular area for the judgment validity check with respect to the chip index group cannot be formed, the judging step determining whether the judgment is valid is not performed.

By checking the validity of the judgment with respect to each of the chip index groups as described above, the accuracy of the checking validity can be improved.

On the other hand, when a judgment validity checking step S8 with respect to a chip index group is determined as not valid, the process goes back to a process of obtaining the additional defective chips based on another algorithm.

Further, when any of the judgment validity checking steps S8 with respect to a chip index group is determined as not valid before completing the judging steps for all the chip index groups, it may not necessary to perform the remaining judging steps for the rest of the chip index groups.

Still further, in this embodiment, the judgment validity checking step S8 is performed based on the difference between the number of the defective chips in the rectangular area for checking the validity of the judgment and the number of the additional defective chips. However, the judgment validity checking step S8 may be performed based on the difference between the number of the defective chips and the number of the additional defective chips.

Still further, in the description of this embodiment, the validity of the judging step S6 is checked in the chip index group dividing step S7 and the judgment validity checking step S8. However obviously, the steps S7 and S8 can also be applied to any of the judging steps S6-1 through S6-5.

In the algorithm according to the embodiments of the present invention, first, it is necessary to define the defective chip concentrated distribution area "A" clearly. From experience, the quality degradation concern level differs between a wafer edge area and the area other than the wafer edge area. Therefore, preferably, different criteria are used between the wafer edge area and the area other than the wafer edge area when the defective chip concentrated distribution areas are defined.

Figure 26:
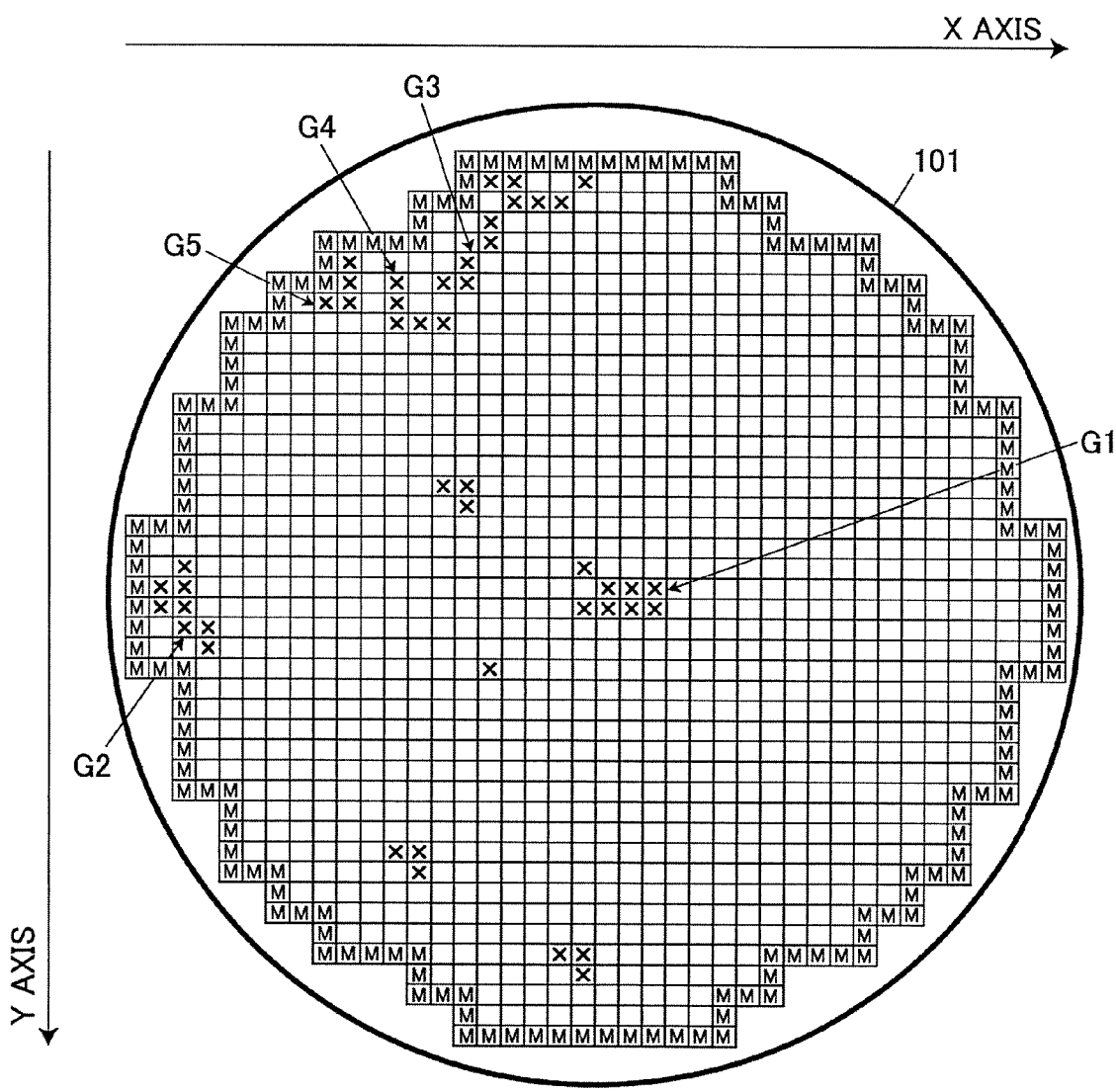
FIG. 26 is a drawing showing another example of a final wafer test result in a wafer test process.

FIG. 26 shows another example of the final result of the wafer test in a wafer test process. No marks are placed onto the chips that have been judged as good, and "X" marks are placed onto the chips that have been judged as defective. Further, the chips disposed at the edge of a wafer are referred to as wafer-edge chips "M". In this example, the wafer-edge chips "M" are automatically judged as the additional defective chips. However, the wafer-edge chips "M" may not be judged as such. For example, the wafer-edge chips "M" may be treated as the judge target chips.

In the defective chips dividing step S2, based on the results of the wafer test in the wafer testing step, the continuity of the defective chips is verified in the eight directions consisting of the four directions of the X axis and the Y axis and the additional four directions each inclined 45 degrees with respect to the X axis and the Y axis. Then the defective chips are divided into groups so that the defective chips having continuity with each other are divided into the same group (defective chips dividing step). In the result of the wafer test shown in FIG. 26, the defective chips are divided into nine defective groups.

In the defective chip concentrated distribution area judging step S3, with respect to each of the defective groups, the number of defective chips in the defective group is compared with a predetermined defective chip number threshold value. When the number of defective chips is greater than the defective chip number threshold value, the defective group is determined as the defective chip concentrated distribution area.

In FIG. 26, there is a defective group "G1" consisting of "8" defective chips at the center part of the wafer. In such as case like this, when the number of defective chips in a defective group is around "8", it is not always necessary to treat the defective group "G1" as the defective chip concentrated distribution area.

On the other hand, there is another defective group "G2" consisting of "8" defective chips, and two defective chips in the defective group "G2" are contiguous to the wafer-edge chips "M". Since the defective group "G2" is disposed near the wafer edge, it is necessary to treat the defective group "G2" as the defective chip concentrated distribution area due to the influence near the wafer-edge part even considering that the scale of the defective group "G2" consists of "8" defective chips. Especially, from experience, in a wafer test, when a test item in which a chip is judged as defective is included in the first logic test, the cause of judging the chips near the wafer peripheral as defective is most likely to be a pattern defect due to foreign material. In this case, unfortunately, it is known that the quality of the chips in the vicinity of the defective chip are degraded. Because of this feature, it is preferable that different defective chip number threshold values be used depending on the position of the defective group such as the wafer-edge part and the wafer center part when it is determined whether the defective groups are to be judged as the defective chip concentrated distribution area in the defective chip concentrated distribution area judging step S3. Further preferably, in the wafer-edge part, still different defective chip number threshold values are used between the case where at least one defective chip in the defective group is contiguous to the wafer-edge chips "M" and the case where none of the defective chips in the defective group is contiguous to the wafer-edge chips "M".

For example, different defective chip number threshold values may be set as follows. The defective chip number threshold value is "8" when the defective group is contiguous to the wafer-edge chips "M". The defective chip number threshold value is "10" when the defective group is not contiguous to the wafer-edge chips "M", but at least one of the defective chips in the defective group is within a prescribed range from the wafer-edge chips "M" within a rectangular area consisting of the wafer-edge chips "M" and the additional chips constituting a frame area having a width of "three" chips and contiguously surrounding the wafer-edge chips "M". The defective chip number threshold value is "20" when none of the defective chips in the defective group is within a prescribed range from the wafer-edge chips "M" within a rectangular area consisting of the wafer-edge chips "M" and the additional chips constituting a frame area having a width of "three" chips and contiguously surrounding the wafer-edge chips "M", namely the defective group is disposed at the center part of the wafer. It should be noted that the defective chip number threshold values and the prescribed ranges described above are examples only and the defective chip number threshold values and the prescribed ranges are not limited as such. For example, two, four, or more then four defective chip number threshold values with respect to the defective groups in the wafer may be used.

When the defective chip concentrated distribution area judging step S3 is performed using the criteria (defective chip number threshold values) described above, the defective groups "G2" and "G3" shown as the result of the wafer test in FIG. 26 are judged as the defective chip concentrated distribution area. On the other hand, the defective groups "G1" "G4" and "G5" are not judged as the defective chip concentrated distribution area.

Further, a type of the chip on the wafer can be classified based on the position of the chip on the wafer whether the chip is the wafer-edge chip "M", a wafer-edge contiguous chip, or chips other than those. Therefore, the chips on the wafer may have the type information as the property information of the chips in advance. By using the property information, the positional relationships between the defective groups and the wafer-edge part can be easily obtained.

Further, even without using the chip layout information as described above, by using, for example, the algorithm "1A" disclosed in Japanese Patent No. 3888938, the type of the chip on the wafer can be easily classified whether the chip is the wafer-edge chip "M" or the wafer-edge contiguous chip.

On the other hand, there are so many various distribution patterns of the defective chips caused by the pattern defects due to foreign material, and unfortunately, some of them are not easy to judge even for a person skilled in the information processing. FIG. 26 shows an example of such a case where the defective groups "G3", "G4", and "G5" constitute a defective group set.

Figure 27:
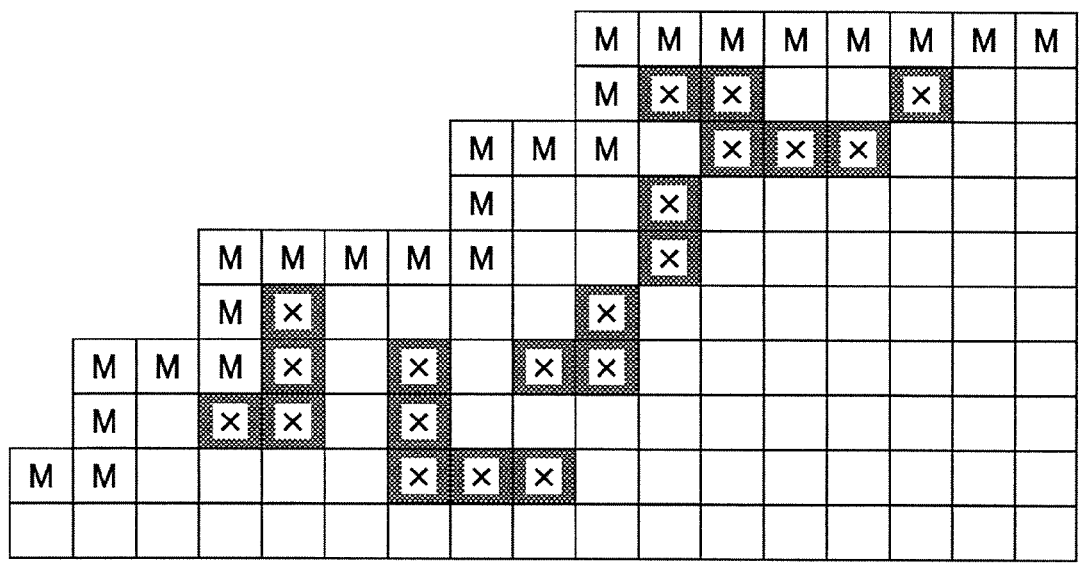
FIG. 27 is an enlarged drawing of the defective groups "G3", "G4", and "G5" in the wafer test result.
Figure 28:
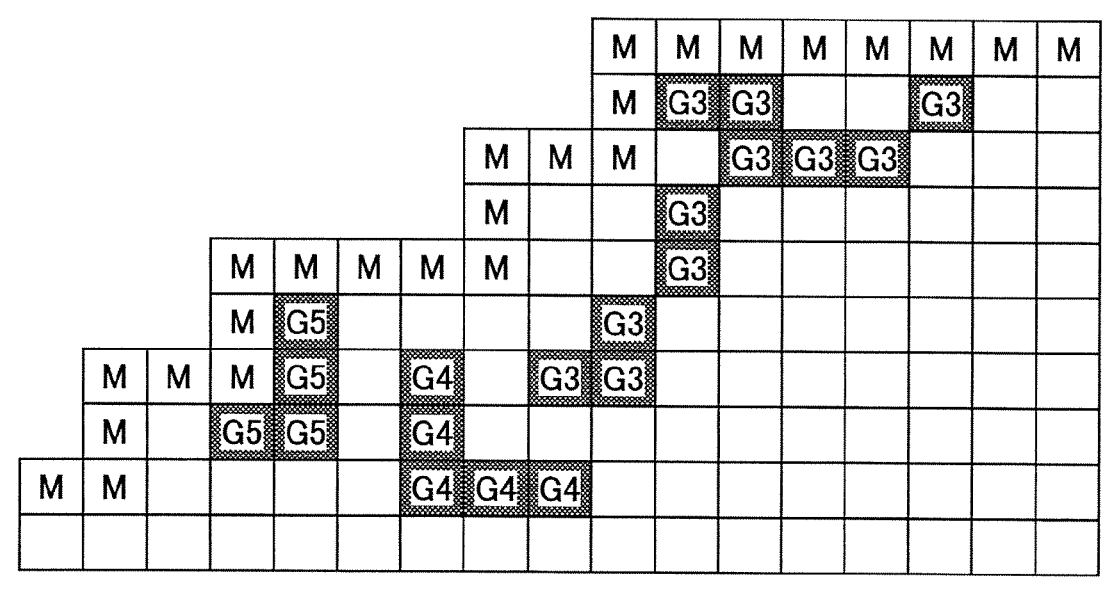

FIGS. 27 through 29 are enlarged drawings showing the area including the defective groups "G3", "G4", and "G5".

In FIGS. 27 through 29, no marks are placed onto the chips having been judged as good in the wafer test, the "X" marks are placed onto the chips having been judged as defective, and "M" marks are automatically placed onto the wafer-edge chips.

In the area shown in FIG. 27, by the defective chips dividing step S2, the defective chips are divided into three defective groups "G3", "G4", and "G5". FIG. 28 shows the defective groups "G3", "G4", and "G5" more specifically as the result of the defective chip dividing step S2.

When each of the defective groups "G3", "G4", and "G5" is judged according to the defective chip concentrated distribution area judging step S3, only the defective group "G3" is judged as the defective chip concentrated distribution area.

Then, the additional defective chips with respect to the defective group "G3" which is the defective chip concentrated distribution area are determined in the same manner as in the defective chip concentrated distribution nearby area setting step S4, the classifying step S5, and the judging step S6. FIG. 29 shows the defective chip concentrated distribution nearby area in a bold frame line, the chip indexes in figures, and the additional defective chips in dotted areas.

The result shown in FIG. 29 may seem to be acceptable at a first glance. However unfortunately, for example, the good chips 109 and 111 that should have been judged as the additional defective chips from experience are not judged as such. The good chip 109 can be judged as an additional defective chip by setting the rectangular area with respect to the chip index of "2" so as to have the frame area having a width of "two" chips. However, the good chip 111 cannot be judged as such because the good chip 111 is outside of the defective chip concentrated distribution nearby area.

To solve the problem, in the defective chip dividing step, when the defective chips on a wafer are divided into the defective groups, the existence of another defective chip is checked not only based on the continuity with respect to a defective chip but also a prescribed range with respect to the defective chip. Then, the defective group is formed in a manner so that not only the defective chips having continuity with each other but also the defective chips in the prescribed range are placed into the same defective group.

In the example of the wafer test result shown in FIG. 26, when it is arranged that the defective chips separated from each other by two chips are judged as the defective chips to be placed into the same defective group in the defective chip dividing step S2, the three defective groups "G3", "G4", and "G5", which are judged as separated defective groups from each other by the previous defective chip dividing step S2, are judged to be the same single defect group. With respect to the defective group including the defective groups "G3", "G4", and "G5", when the additional defective chips are determined in the same manner as in the defective chip concentrated distribution area judging step S3, the defective chip concentrated distribution nearby area setting step S4, the classifying step S5, and the judging step S6, the good chip 111 to be judged as the additional-inking target chips from experience can be judged as the additional defective chip.

In addition, to solve the problem, in the defective chip concentrated distribution area judging step S3, the defective chip concentrated distribution area is determined in a manner so that any one of the defective chip and a first defective group which are disposed within a prescribed range from a second defective group or both are combined with the second defective group to constitute the same single defective group.

In the example of the wafer test result shown in FIG. 26, when it is arranged that the defective chips separated from each other by two chips are judged as the defective chips in the same defective group in defective chip concentrated distribution area judging step S3, the defective group "G4" separated from the defective group "G3" by "two" chips is combined with the defective group "G3" to constitute the same single defective group. With respect to the defective group including the defective groups "G3" and "G4", when the additional defective chips are determined in the same manner as in the defective chip concentrated distribution area judging step S3, the defective chip concentrated distribution nearby area setting step S4, the classifying step S5, and the judging step S6, the good chip 111 to be judged as the additional-inking target chips from experience can be judged as the additional defective chip.

Further, in the modified defective chip concentrated distribution area judging step S3, when it is arranged to repeat the above combining operation, the defective group "G5" is combined with the defective group including the defective groups "G3" and "G4".

It should be noted that the above methods can be applied to not only the algorithm described with reference to FIG. 2 but also the other algorithms described above.

Next, a computer system employing a quality checking method is described.

Figure 30:
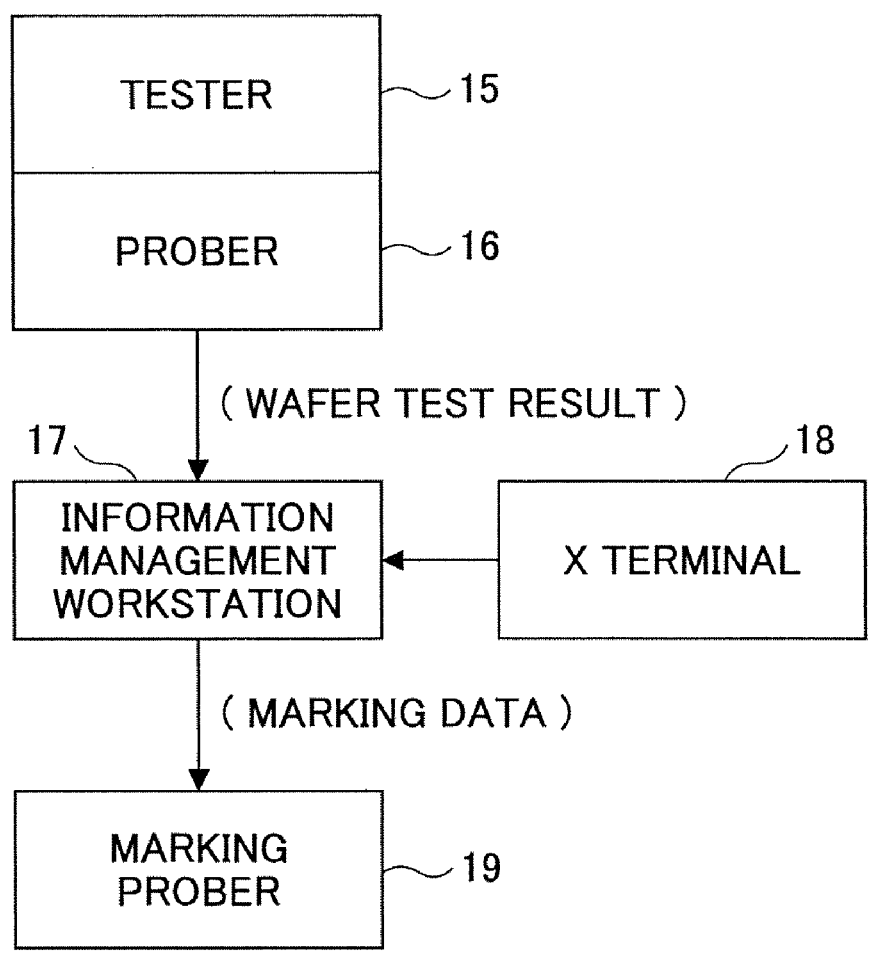
FIG. 30 is a drawing schematically showing an exemplary configuration of a quality judgment system.

FIG. 30 schematically shows an exemplary configuration of a quality judgment system. The quality judgment system is capable of inking using the marking prober without using the inker function of the test prober.

As shown in FIG. 30, the quality judgment system includes a tester 15, a prober 16, an information management workstation 17, an X terminal 18, and a marking prober 19. Next, the operations of the quality judgment system are described. A wafer is placed on the prober 16, and the probe needles of the prober 16 are brought into contact with the electrodes of a test target chip on the wafer. Then, power and test signals are supplied from the tester 15 to the test target chip to perform a wafer test. The results of the wafer test are transmitted to the information management workstation 17 from the prober 16. The result of the wafer test may also be directly transmitted to the marking prober 19. However, in typical use, there are plural testers 15, probers 16, and marking probers 19 operated in parallel. In such a case, it is reasonable to collect the wafer test results from those probers 16 in the information management workstation 17 once.

An operator checks the wafer test results on the information management workstation 17 and manually determines the additional-inking target chips to create marking (inking) data. This operation may be performed on the X terminal 18. Typically, after the additional-inking target chips are confirmed, one lot of wafers are loaded one by one onto the marking prober 19. The marking prober 19 places marks onto the defective chips based on the wafer test results and the additional-inking target chips determined by the operator.

Figure 31:
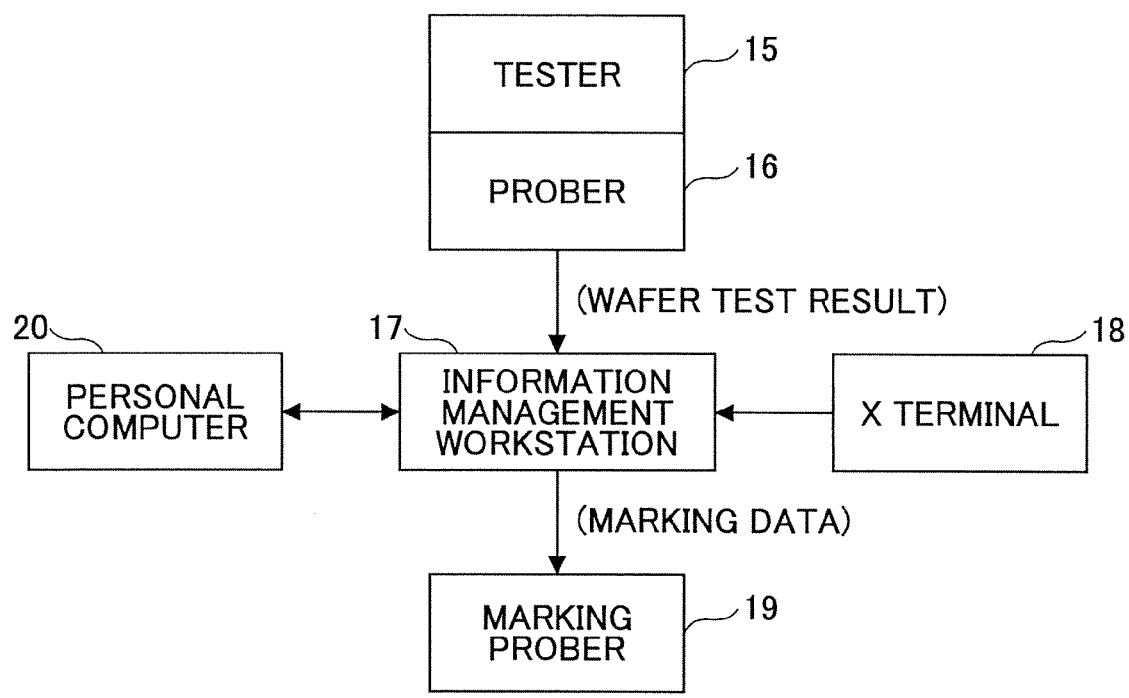
FIG. 31 is a drawing schematically showing an exemplary configuration of a quality judgment system including a marking mechanism according to an embodiment of the present invention.

FIG. 31 schematically shows an exemplary configuration of a quality judgment system having a marking mechanism according to an embodiment of the present invention. As shown in FIG. 31, a personal computer 20 is connected to the information management workstation 17. In the personal computer 20, application software is installed that runs a quality judgment program causing the personal computer 20 to execute the chip quality judging method according to an embodiment of the present invention. The configuration other than above is the same as that of the quality judgment system in FIG. 30. Similar to the quality judgment system in FIG. 30, the wafer test results are transmitted from the prober 16 to the information management workstation 17.

The wafer test results include the coordinate information, pass or fail information, and defective category information with respect to each chip. The information management workstation 17 associates and stores the wafer test results with, for example, shot layout information, within-shot-range layout position information, and defective chip repetitively occurring area information. The marking prober 19 constitutes a marking unit of the marking mechanism according to an embodiment of the present invention. The information management workstation 17 and the personal computer 20 constitute a controlling unit according to an embodiment of the present invention for controlling the marking unit.

Figure 32:
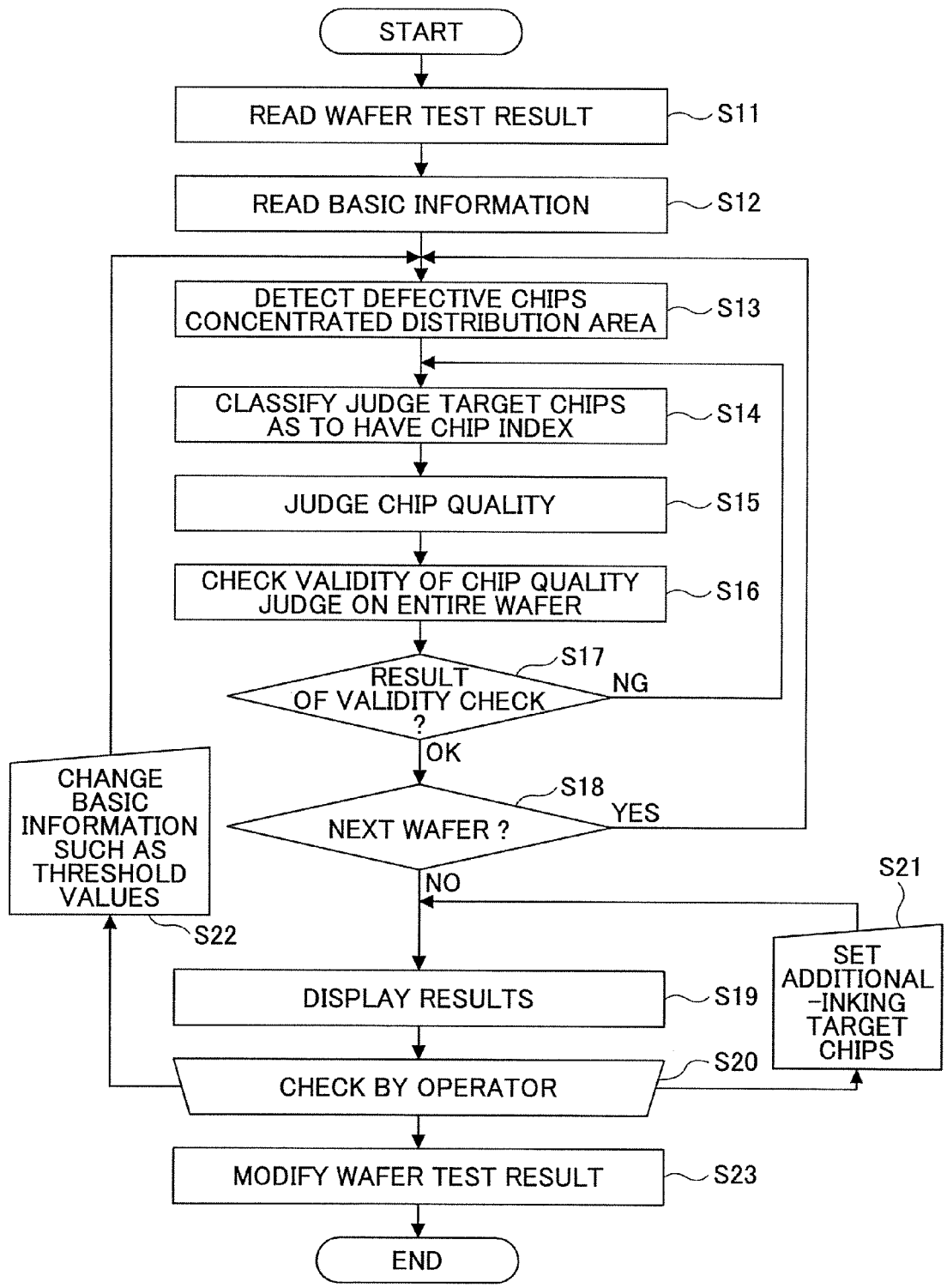
FIG. 32 is a flowchart showing exemplary application software including a quality judgment program according to an embodiment of the present invention.

FIG. 32 is a flowchart showing an exemplary process of the application software running a quality judgment program according to an embodiment of the present invention. This application software not only displays the automatic judging results of the determined additional-inking target chips based on the algorithm described above but also allows an operator to change the additional-inking target chips.

In the following, the operations of the application software are described. First, the program reads the wafer test results (step S11), and reads basic information necessary for the data to be processed based on the wafer test results (step S12). Herein, the basic information refers to the information including the chip layout, the chip size, a threshold value used in the quality judging method, a validity checking method, and pass-fail criteria.

Next, the defective chip concentrated distribution area is detected (step S13).

Figure 33:
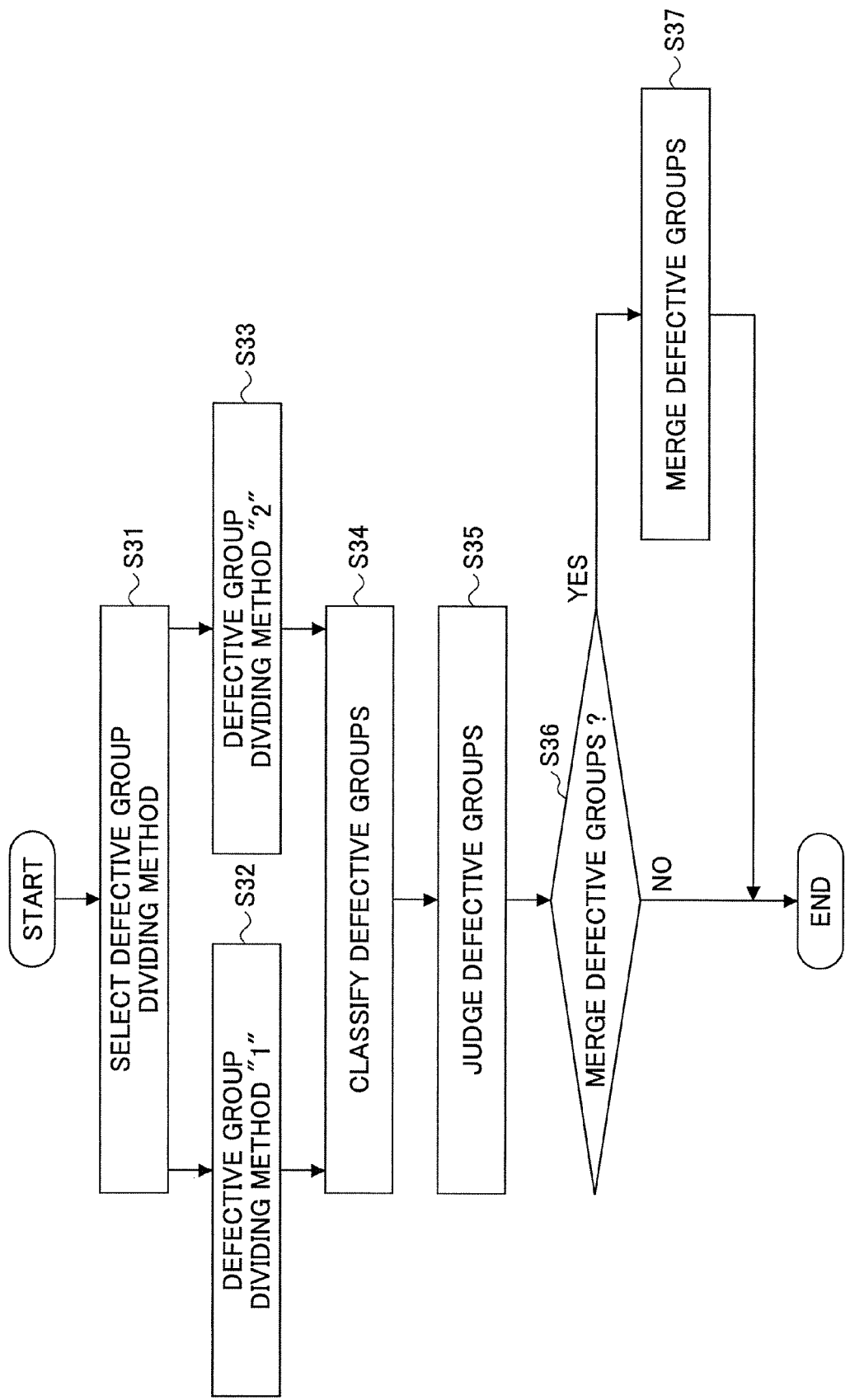
FIG. 33 is a flowchart showing the defective chip concentrated distribution area detecting step S13 in the flowchart in FIG. 32.

FIG. 33 is a flowchart illustrating a defective chip concentrated distribution area detection step S13.

First, a dividing method for dividing the defective chips on a wafer into defective groups is selected (step S31). The dividing method to be selected may be included in the basic information or selected by the operator.

For example, when a defective group dividing method "1" is selected, the defective chips are divided into defective groups using the defective chips dividing step S2 described with reference to FIG. 2 (step S32).

On the other hand, when a defective group dividing method "2" is selected, the defective chips are divided into defective groups in a manner so that the existence of the other defective chip within a prescribed range from each of the defective chips is checked and not only defective chips contiguous to each other but also the defective chips separated within the prescribed range are placed into the same single defective group (step S33).

Next, to perform more appropriate judgment depending on the situation, the defective groups are classified using the information of the relationships between each of the obtained defective groups divided in step S32 or S33 and the wafer-edge chips at the edge of the chip arranged on a wafer (step S34). The chips near the wafer-edge part may often have the pattern defect due to foreign material. Namely, the situation near the wafer-edge part is different from that in the wafer center part. Because of this feature, in this embodiment of the present invention, the defective groups are classified into three types: a wafer-edge contiguous type, a wafer-edge nearby type, and the other type (wafer center type).

The defective group may also be classified by checking the property of the chips in the defective group. Since the property of the chip is determined based on the chip layout of the chip, the chip layout may be included in the basic information. Further, the defective group may be classified by using coordinate information to determine the positional relationship between the defective group and the wafer-edge chips after the defective chips are divided into the defective groups. Still further, when the defective groups are classified into only two types, i.e. the wafer-edge contiguous type and the other type, the information in dividing the defective groups can be used.

Next, the defective chip concentrated distribution areas are judged (step S35). This step is performed to exclude a small scale defective group that does not influence the quality of the chips outside the group. By setting the criteria to be used with respect to each of the defective groups previously obtained as a part of the basic information, different scales of defective groups depending on the type of the defective group may be judged as the defective chip concentrated distribution area to be judged.

Next, it is determined whether defective groups are to be merged with each other (step S36). When it is determined that the defective groups are to be merged (YES in step S36), the process goes to step S37 to merge the defective groups. The reason for the merge is to provide more ideal results. More specifically, the pattern defects due to foreign material often occur in the wafer-edge part. When such pattern defects occur, smaller scale plural defective groups nearby are also generated in the wafer-edge part. From experience, when those defective groups are merged into a single defective group, more ideal results can be obtained.

As an example of the merging process, with respect to each of the defective groups or the defective group that has been judged as the defective chip concentrated distribution area, it is determined whether any of the defective chips other than the defective chips in the defective group are included in a prescribed range from the defective group. When the defective chip is included within the prescribed range of the defective group, the defective group including the defective chip within the prescribed range is merged with each of the defective groups or the defective group that has been judged as the defective chip concentrated distribution area, respectively. It should be noted that when the defective group that has been judged as the defective chip concentrated distribution area is merged, the enlarged defective group due to merging is treated as a single defective group and it is further determined whether any of the defective chips other than the defective chips in the enlarged defective group are within a prescribed range of the enlarged defective group. When such a defective chip is detected, the defective group including the defective chip within the prescribed range is merged with the defective group that has been judged as the defective chip concentrated distribution area to form further enlarged defective group. By doing this, the final configuration of the defective groups is determined.

Further, it may be determined whether the merging process is to be performed by checking the scale of the defective group to be merged and a failed test item of the defective chip included in the defective group. It should be noted that the information such as whether the merger is to be performed, and the prescribed range and the scale of the defective group used when the merger is performed may be provided in constant values or included as a part of the basic information.

By performing the above processes, the information of the detected defective chip concentrated distribution areas is provided as a defective group list so as to be used in the following processes. The information whether each of the defective groups is merged with another defective group is included as a part of the defective list information so as to be used in the following processes.

On the other hand, when it is determined that the defective groups are not to be merged (NO in step S36) or when the defective groups are merged in step S37, the process of detecting defective chip concentrated distribution areas ends.

Referring back to FIG. 32 to continue the description, in step S13, with respect to each of the detected defective chip concentrated distribution areas, the defective chip concentrated distribution nearby area is set so that the judge target chips within the defective chip concentrated distribution nearby area are classified to have any of the chip indexes (step S14).

Figure 34:
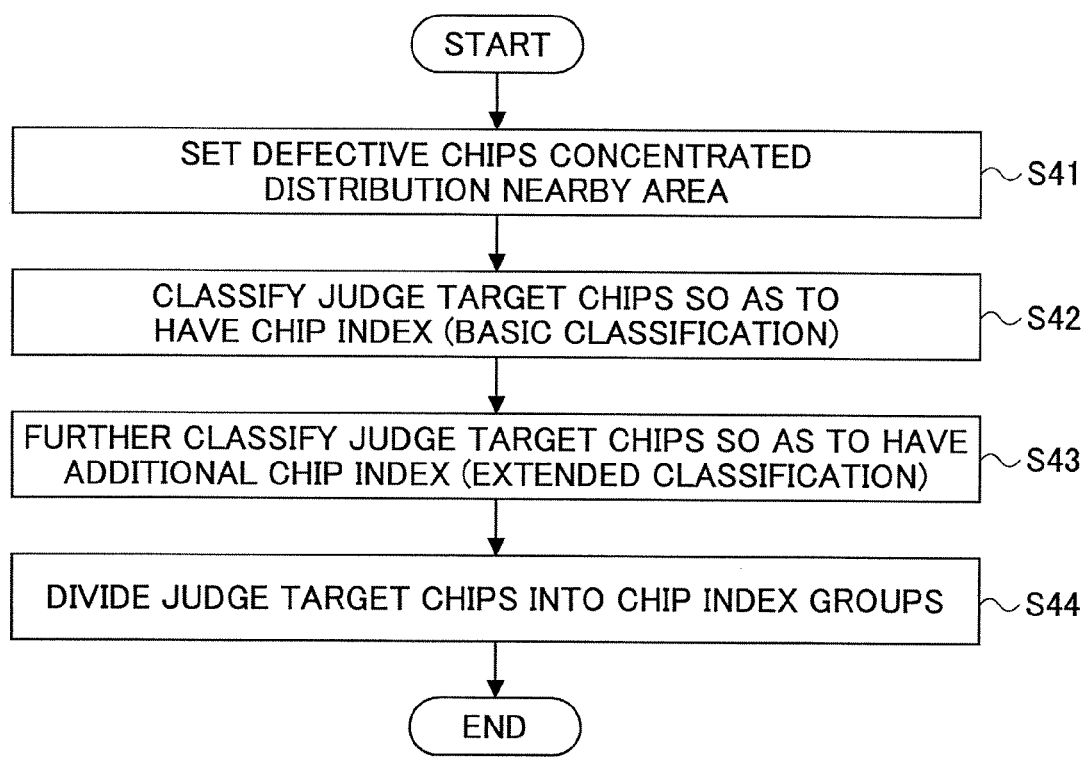
FIG. 34 is a flowchart showing the chip index classifying step S14 in the flowchart in FIG. 32.

Next, a step of setting the defective chip concentrated distribution nearby area and classification of the chip indexes is described. FIG. 34 is a flowchart illustrating a chip index classifying step S14.

According to the defective group list, the defective chip concentrated distribution areas to be judged are selected, and the corresponding defective chip concentrated distribution nearby areas are set (step S41). The defective chip concentrated distribution nearby areas are set by the defective chip concentrated distribution nearby area setting step S4 so as to have a prescribed range including all the defective chips in the defective chip concentrated distribution area and the good chips near the defective chip concentrated distribution area.

The good chips in the set defective chip concentrated distribution areas are treated as judge target chips, and the chip indexes of the treated as judge target chips are classified (this classification is referred to as "basic classification", step S42). The basic classification refers to the classifying step S5 described above with reference to FIG. 2. As a result, each of the judge target chips in the defective chip concentrated distribution nearby areas has theoretically any of five chip indexes "0" through "4".

Next, a step of extended classification is performed (step S43). In this step, the chip index "4" is further classified. The processes of the extended classification include the second classifying step S5-1 described with reference to FIG. 6, the four-direction judge target dividing step S5-2 and the third classifying step S5-3 described with reference to FIG. 9, and the eight-direction judge target dividing step S5-4 and the fourth classifying step S5-5 described with reference to FIG. 13. When the processes up to the fourth classifying step S5-5 are completed, the chip index "4" is classified into four kinds. In this embodiment, by using this information as the detailed information of the chip index "4", the chip index of the defective chips in the defective chip concentrated distribution nearby areas are classified into eight kinds "0" through "7". In these classifying processes, the chip index information of the judge target chips in the defective chip concentrated distribution nearby areas is used. Therefore, the chip can be selected based on the chip index information in the classifying processes.

It should be noted that the defective chips disposed in the defective chip concentrated distribution nearby area but outside the defective chip concentrated distribution area are assumed and treated as good chips in the basic classification step S42 and the extended classification step S43.

Next, the judge target chips having the same chip index in the defective chip concentrated distribution nearby area are divided into chip index groups based on the continuity in the coordinate system (step S44). The process in this step is the same process in the is the chip index group dividing step S7. Whether the continuity in the inclined directions is used may be determined depending on the situation. For example, all the judge target chips having the chip index of "4" or more and surrounded by the defective chips are likely to be judged as the additional-inking target chips. Therefore, the accuracy of checking the judgment validity described below may be increased by ignoring the continuity in the inclined directions when the judge target chips are divided into chip index groups.

After the above processes are finished, the setting of the defective chip concentrated distribution nearby areas and the chip index classification end.

In the chip index classifying processes, a chip index group list is created and used in the following processes.

The information such as the prescribed range used in the chip index classification process may be constant values or included as a part of the basic information.

In this embodiment, it is arranged that neither basic nor extended classifications are performed with respect to the defective chips in the defective chip concentrated distribution areas. When such defective chips are classified so as to have the chip indexes, expected results may be obtained. However, the data processing after this process becomes more complicated, thereby providing little advantage.

Referring back to FIG. 32 to continue the description, with respect to each of the defective chip concentrated distribution nearby areas set in step S14, the chip quality is judged, and validity of the chip quality judgment is checked and judged (step S15). In this embodiment, the chip quality is judged, and validity of the chip quality judgment is checked and judged with respect to each of the chip indexes of each of the defective chip concentrated distribution nearby areas. However, the embodiment of the present invention is not limited to this. For example, the above checking and the judgment may be performed with respect to each of the defective chip concentrated distribution nearby areas.

Figure 35:
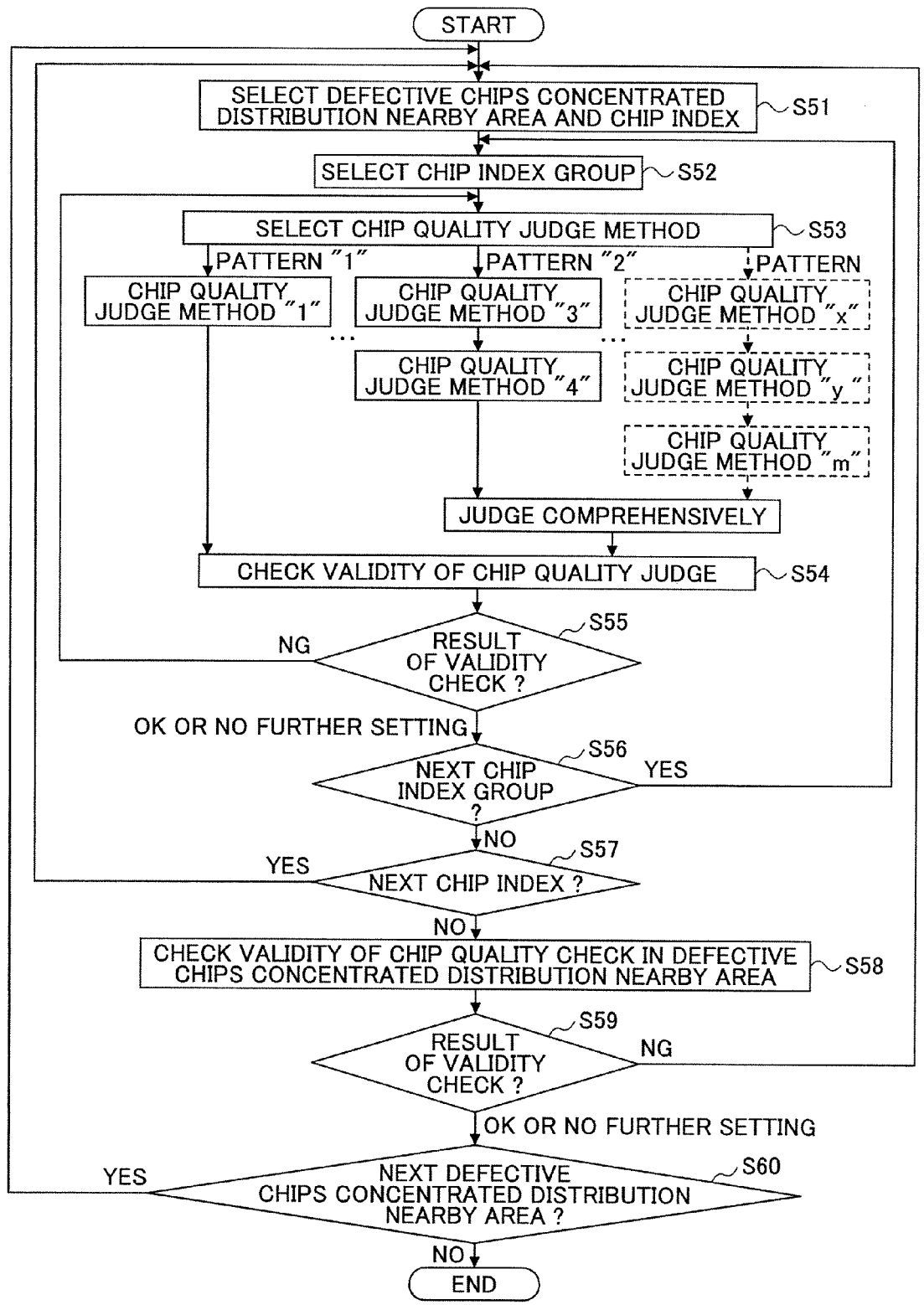
FIG. 35 is a flowchart showing the chip quality judgment and checking and judging the validity of the chip quality judging step S15 in the flowchart in FIG. 32.
Figure 38:
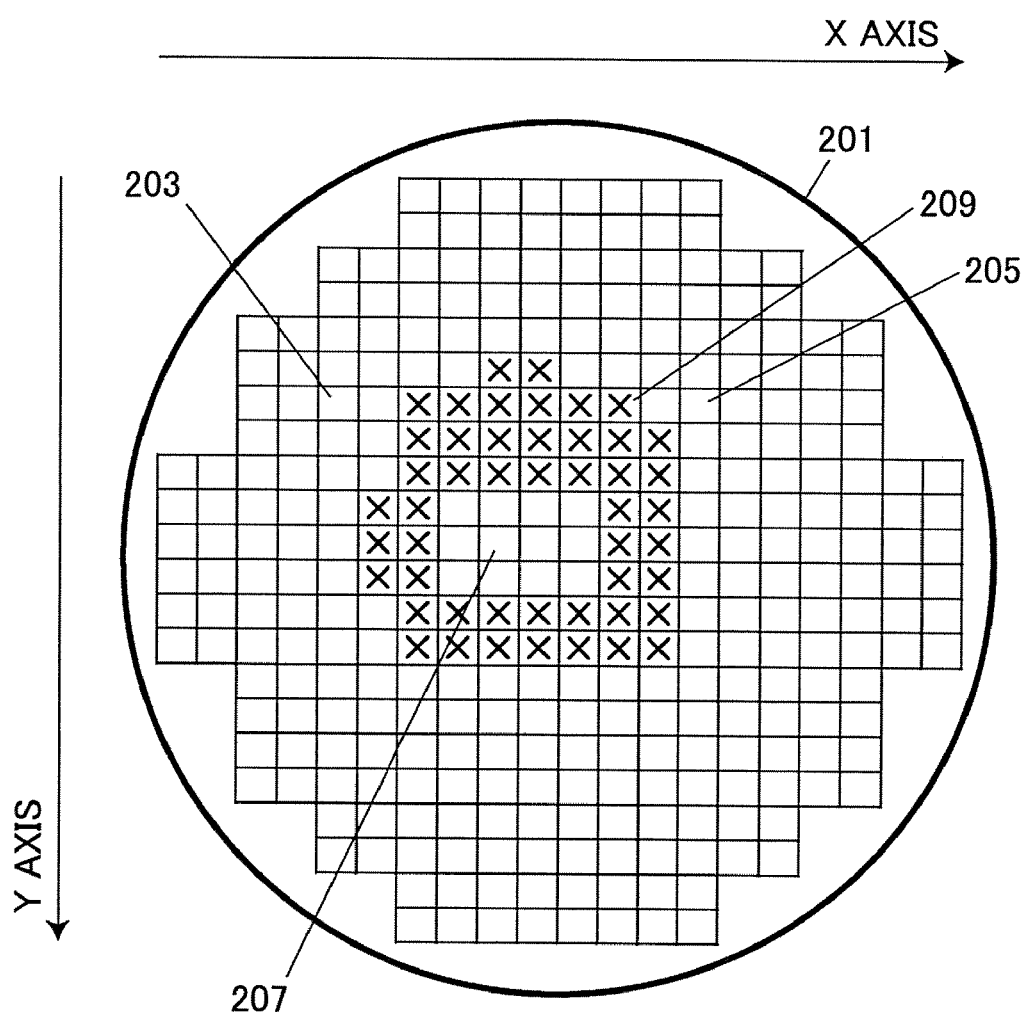
FIG. 38 is a drawing showing still another example of a final wafer test result in a wafer test process.
Figure 39:
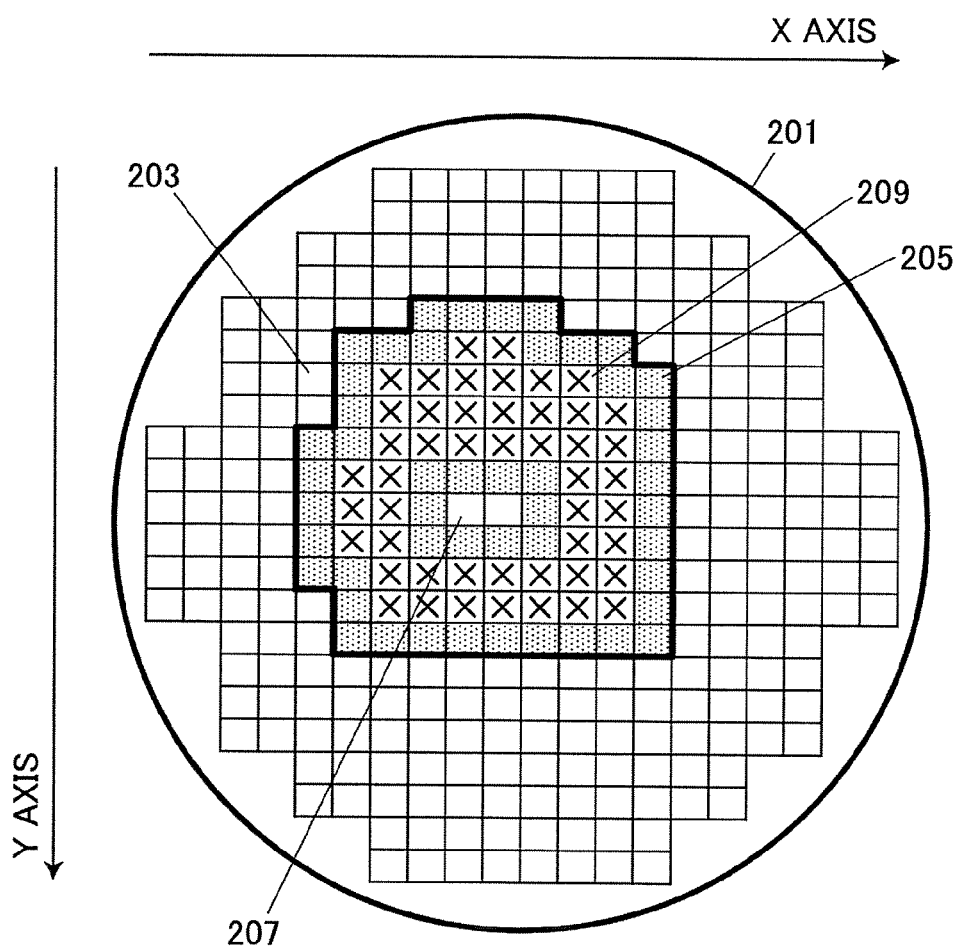
FIG. 39 is a drawing showing an example where additional-inking target chips are classified in a prescribed range from the defective chip concentrated distribution area according to a conventional additional-inking target chip classifying method with respect to the wafer test result in FIG. 38.

FIG. 35 is a flowchart illustrating a step of judging the chip quality and checking and judging the validity of the chip quality judgement (step S15).

First, based on the chip index group list, the defective chip concentrated distribution nearby areas to be judged and the chip index to be judged are selected (step S51), and one of the chip index groups having the selected chip index is selected (step S52).

Next, a pattern for chip quality judging is selected based on, for example, the chip index information (chip quality judging method selection step, step S53). In practical use, various patterns for the chip quality judging are combined and used as the pattern of the chip quality judging.

Next, each of the chip quality judging methods used in this step is described.

In a chip quality judging method "1", the judge target chips having a predetermined chip index are judged as the additional defective chips. This method is especially effective for the judge target chips classified to have chip indexes of "6" and "7". Herein, different threshold values of the scale of the chip index group depending on the chip indexes may be used to determine whether each of the judge target chips is judged as the additional defective chip.

In a chip quality judging method "2", the judge target chip is judged as the additional defective chips when any of the defective chips in the defective chip concentrated distribution area is within a judgment range previously determined depending on the chip index.

In a chip quality judging method "3", a shortest distance to the defective chip in the defective chip concentrated distribution nearby areas from the judge target chip is calculated. Herein the calculated shortest distance is referred to as a distance index to the defective chip. Also, a distance index threshold value to the defective chip is provided. The distance index threshold value is previously determined based on the chip index of the judge target chip. Then, the judge target chip is judged as the additional defective chip when the distance index of the judge target chip is equal to or less than the distance index threshold value to the defective chip. The principle of this method is similar to that in the above chip quality judging method "2". However, in this method, it is also possible to judge by comparing a uniform threshold value with a value obtained by multiplying the distance index based on the distance to the defective chip concentrated distribution area by a coefficient determined with respect to each of the chip indexes. Because of this feature, the data processing and processing speed in the method become easier and faster, respectively, compared with those in the chip quality judging method "2".

In a chip quality judging method "4", the number of defective chips in the defective chip concentrated distribution nearby area and within a prescribed range from the judge target chip is referred to as a nearby defective chip index. Also, a nearby defective chip index threshold value is previously determined based on the chip index of the judge target chip. Then, the judge target chip is judged as the additional defective chip when the nearby defective chip index of the judge target chip is equal to or greater than the nearby defective chip index threshold value. In this chip quality judging method "4", it is also possible to judge by comparing a uniform threshold value with a value obtained by multiplying the nearby defective chip index by a coefficient determined with respect to each of the chip indexes.

It should be noted that it is more effective when the indexes used in the chip quality judging methods "3" and "4" are obtained at one time with respect to the judge target chips in the defective chip concentrated distribution nearby area rather than with respect to each of the chip indexes or chip index groups. It is accordingly more effective when the indexes are obtained before selecting the judgment areas in step S51.

In step S53 of selecting the chip quality judging method, by using any of the chip quality judging methods "1" through "4" or any combination of the chip quality judging methods "1" through "4", there are up to 15 patterns can be generated. For example, as shown in FIG. 35, the pattern "1" includes the chip quality judging method "4" only, the pattern "2" consists of chip quality judging methods "3" and "4". Further, when a pattern includes plural chip quality judging methods, more comprehensive judgment can be conducted by performing, for example, "OR" or "AND" operations among the results of the chip quality judging methods.

The validity of the result of the chip quality judgment based on the quality judging method selected in step S53 is checked in a validity checking step of checking the validity of the chip quality judgment (step S54).

In an exemplary judgment validity checking method, the validity of the chip quality judgment result is checked by comparing the difference or ratio between the number of chips judged as the additional defective chips and the number of defective chips in the defective chip concentrated distribution area in a rectangular area consisting of a minimum rectangle capable of enclosing all the defective chips judged as the additional defective chips and the additional chips constituting a frame area having a prescribed width and contiguously surrounding the minimum rectangle with the corresponding threshold values.

In a validity judging step S55, when it is determined that the validity is judged as inappropriate in the validity checking step S54 (NG in step S55), the process goes back to the selection step of the chip quality checking method in step S53 to select another pattern for chip quality checking method for judging again.

On the other hand, when it is determined that the validity is judged as appropriate in the validity checking step S54 (OK in step S55), the process goes to the next chip index group checking step S56.

Further, when it is determined that the validity is judged as inappropriate in the validity checking step S54 but there is no remaining set pattern to be selected (No further setting in step S55), the process goes to the next chip index group checking step S56.

Then, when the validity of the final chip quality judgment result is determined as inappropriate in the validity checking step S54, the judgment whether this judgment result is to be valid may be included in a part of the basic information. Alternatively, the entire results are set valid or invalid and a message that the entire results are treated as valid or invalid is displayed on a display described below in a menu display step S19 (see FIG. 32) so that the further process can be determined by the operator.

In the next chip index group checking step S56, when it is determined that there is a not-yet-judged chip index group having the same chip index remaining in the same defective chip concentrated distribution nearby area (YES in step S56), the process goes back to step S52 and performs the steps S52 through S56 with respect to the not-yet-judged chip index group.

On the other hand, in the next chip index group checking step S56, when it is determined that there is no not-yet-judged chip index group having the same chip index remaining in the same defective chip concentrated distribution nearby area (NO in step S56), the process goes to the next chip index checking step S57.

In the next chip index checking step S57, when it is determined that there is a not-yet-judged chip index in the same defective chip concentrated distribution nearby area (YES in step S57), the process goes back to step S51 and performs the steps S51 through S56 with respect to the not-yet-judged chip index. On the other hand, in the next chip index checking step S57, when it is determined that there is no not-yet-judged chip index in the same defective chip concentrated distribution nearby area (NO in step S57), the process goes to a validity checking step S58.

In the validity checking step S58, the validity of the chip quality judgment with respect to each of the chip index groups in the defective chip concentrated distribution nearby area is checked. In a validity judging step S59, when it is determined that the validity is judged as inappropriate in the validity checking step S58 (NG in step S59), the process goes back to step S51 to judge again using another pattern of the chip quality judging method.

On the other hand, in a validity judging step S59, when it is determined that the validity is judged as appropriate in the validity checking step S58 (OK in step S59), the process goes to the next defective chip concentrated distribution nearby area checking step S60.

Further, when it is determined that the validity is judged as inappropriate in the validity checking step S58 but there is no remaining set pattern to be selected (NO FURTHER SETTING in step S59), the process goes to the next defective chip concentrated distribution nearby area checking step S60.

In this case as well, when the validity of the final chip quality judgment result is determined as inappropriate in the validity checking step S54, the judgment whether this judgment result is to be valid may be included in a part of the basic information. Alternatively, the entire results are set valid or invalid and a message that the entire results are treated as valid or invalid is displayed on a display described below in a menu display step S19 (see FIG. 32) so that the further process can be determined by the operator.

In the defective chip concentrated distribution nearby area checking step S60, when it is determined that there is a not-jet-judged defective chip concentrated distribution nearby area, (YES in Step 60), the process goes back to step S51 to perform steps S51 through S58 with respect to the not-jet-judged defective chip concentrated distribution nearby area. On the other hand, when it is determined that there is no not-jet-judged defective chip concentrated distribution nearby area, (NO in Step 60), the process goes to validity checking step S16 to check the validity of the chip quality checking with respect to the entire wafer (see FIG. 32).

Refer back to FIG. 32 for further description. In a validity checking step S16, the validity of the chip quality judgment with respect to the entire wafer is checked.

In a validity judging step S17, when it is determined that the validity is judged as inappropriate in the validity checking step S16 (NG in step S17), the process goes back to step S14. Then the defective chip concentrated distribution nearby area with respect to each of the defective chip concentrated distribution areas is set and the set defective chip concentrated distribution nearby area is classified based on another setting. Alternatively, the process may go back to step S13 to detect the defective chip concentrated distribution areas based on another setting.

In a validity judging step S17, when it is determined that the validity is judged as appropriate in the validity checking step S16 (OK in step S17), the processes for the wafer end and the process goes to a next wafer checking step S18.

Further, when it is determined that the validity is judged as inappropriate in the validity checking step S16 but there is no further setting left in step S14 or S13, the process goes to the next wafer checking step S18 (NO FURTHER SETTING in step S17).

In the next wafer checking step S18, when it is determined that there is a not-yet-judged wafer (YES in step S18), the process goes back to step S13 to perform steps S13 through S17 with respect to the not-yet judged wafer.

On the other hand, in the next wafer checking step S18, when it is determined that there is no not-yet-judged wafer (NO in step S18), the result is displayed on a menu and waits for confirmation by the operator (Menu display step S19).

In a checking step by an operator (Step S20), the operator may add the additional-inking target chips (Step S21). Or, the operator may modify the basic information such as the threshold values (Step S22), and the process goes back to step S13 for judging again. Herein, the wafer to be judged again can be determined by the operator, or it may be arranged that all the wafers are set to be checked again.

After the check by the operator, a modification of adding the additional defective chips is automatically performed on the wafer test result in accordance with the obtained chip quality judgment result (Step S23). By the modification of the wafer test result, the modified wafer test result consisting of the marking data of the entire wafer including the specified additional defective chips or the marking data including the specified additional defective chips is created. The obtained marking data is transferred to the tester having a marking function or the marking prober for the inking.

As described above, in a chip quality judging method according to an embodiment of the present invention, in a wafer including defective chips, it is possible to judge the quality of the chips on the wafer while the quality of the chips is guaranteed. Further, advantageously, in a chip quality judgment program according to an embodiment of the present invention, each of the steps in the chip quality judging method according to an embodiment of the present invention can be executed by a computer. Therefore, a large amount of labor-hours spent for selecting chips that may have a problem can be avoided and the criteria depending on the experience of the operators can be improved. Still further advantageously, in a chip plant where no additional inking has been performed due to the large amount of labor-hours necessary for the entire additional inking processes based on a conventional method, the loss of discarding the wafers can be better controlled by employing the additional inking system including a marking mechanism according to an embodiment of the present invention.

As a configuration of the system, a personal computer 20 on which a program according to an embodiment of the present invention is installed may be connected to a tester 15 so as to exchange data directly with each other. Or the tester 15 may include a function of selecting chips to be re-measured based on a good chip classifying method or a chip quality judging method according to an embodiment of the present invention.

In the embodiment described above, as shown in FIG. 4, in the defective chip concentrated distribution nearby area setting step S4, the defective chip concentrated distribution nearby area "B" is defined as a rectangular area consisting of the minimum rectangle capable of enclosing all the defective chips in the defective chip concentrated distribution area and the additional chips constituting a frame area having a width of one or more chips and contiguously surrounding the minimum rectangle. However, the present invention is not limited to this defective chip concentrated distribution nearby area explained in the description of the defective chip concentrated distribution nearby area setting step S4.

For example, the defective chip concentrated distribution nearby area explained in the description of the defective chip concentrated distribution nearby area setting step S4 may be defined as a rectangular area consisting of the minimum rectangle capable of enclosing all the defective chips in the defective chip concentrated distribution area, a rectangular area consisting of the minimum rectangle capable of enclosing all the defective chips in the defective chip concentrated distribution area and the additional chips constituting a frame area having a width of two or more chips and contiguously surrounding the minimum rectangle, or the defective chip concentrated distribution area and the additional chips constituting a frame area having a width of two or more chips and contiguously surrounding the defective chip concentrated distribution area.

Figure 36:
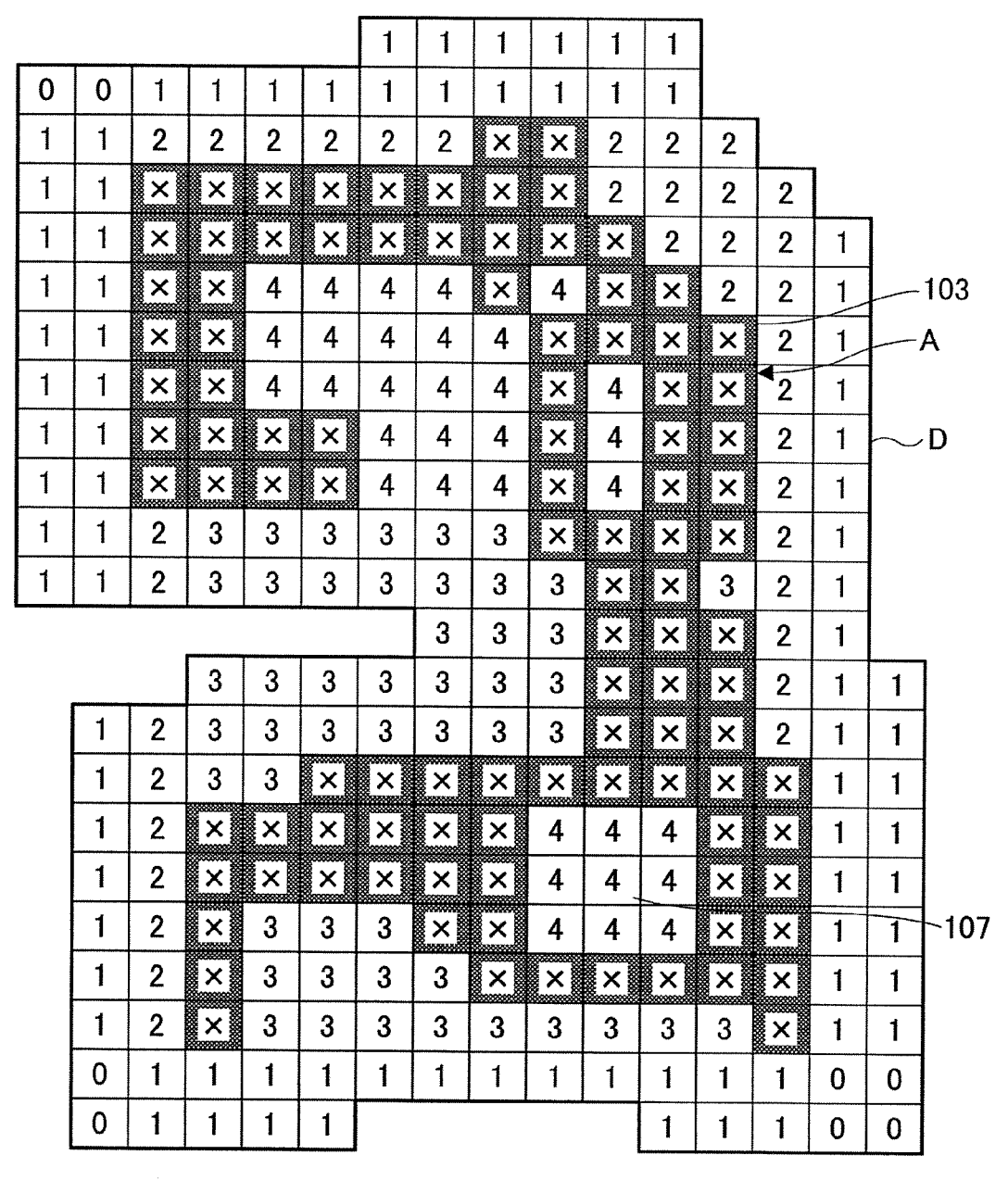

FIG. 36 shows another example of the defective chip concentrated distribution nearby area with respect to the defective chip concentrated distribution area "A". As shown in FIG. 36, the defective chip concentrated distribution nearby area "D" consists of the defective chip concentrated distribution area "A" and the additional chips constituting a frame area having a width of two chips and contiguously surrounding the defective chip concentrated distribution area "A". Even in such a defective chip concentrated distribution nearby area "D", it is easy to assume that the classifying, second, third, and fourth classifying, judging, and validity checking steps can also be executed as in the embodiment of the present invention.

Further, in the above embodiment, as shown in FIG. 4, the good chips in the defective chip concentrated distribution nearby area "B" are treated as judge target chips. With respect to each judge target chip, the number of directions in the four directions of the X and the Y axis is counted on which any of the defective chips in the defective chip concentrated distribution area "A" is disposed. According to the obtained number of the directions, each judge target chip has any of the values "0", "1", "2", "3", or "4" as the chip index of the judge target chip (classifying step).

However, the classifying step according to an embodiment of the present invention is not limited to this method. For example, the good chips in the defective chip concentrated distribution nearby area "B" are treated as judge target chips. With respect to each of the judge target chips, the number of directions in the eight directions consisting of the four directions of the X and the Y axis and additional four directions each inclined 45 degrees with respect to the X axis and the Y axis may be counted on which any of the defective chips in the defective chip concentrated distribution area "A" is disposed. According to the obtained number of the directions, each judge target chip has any of the values "0" through "8" as the chip index of the judge target chip.

Figure 37:
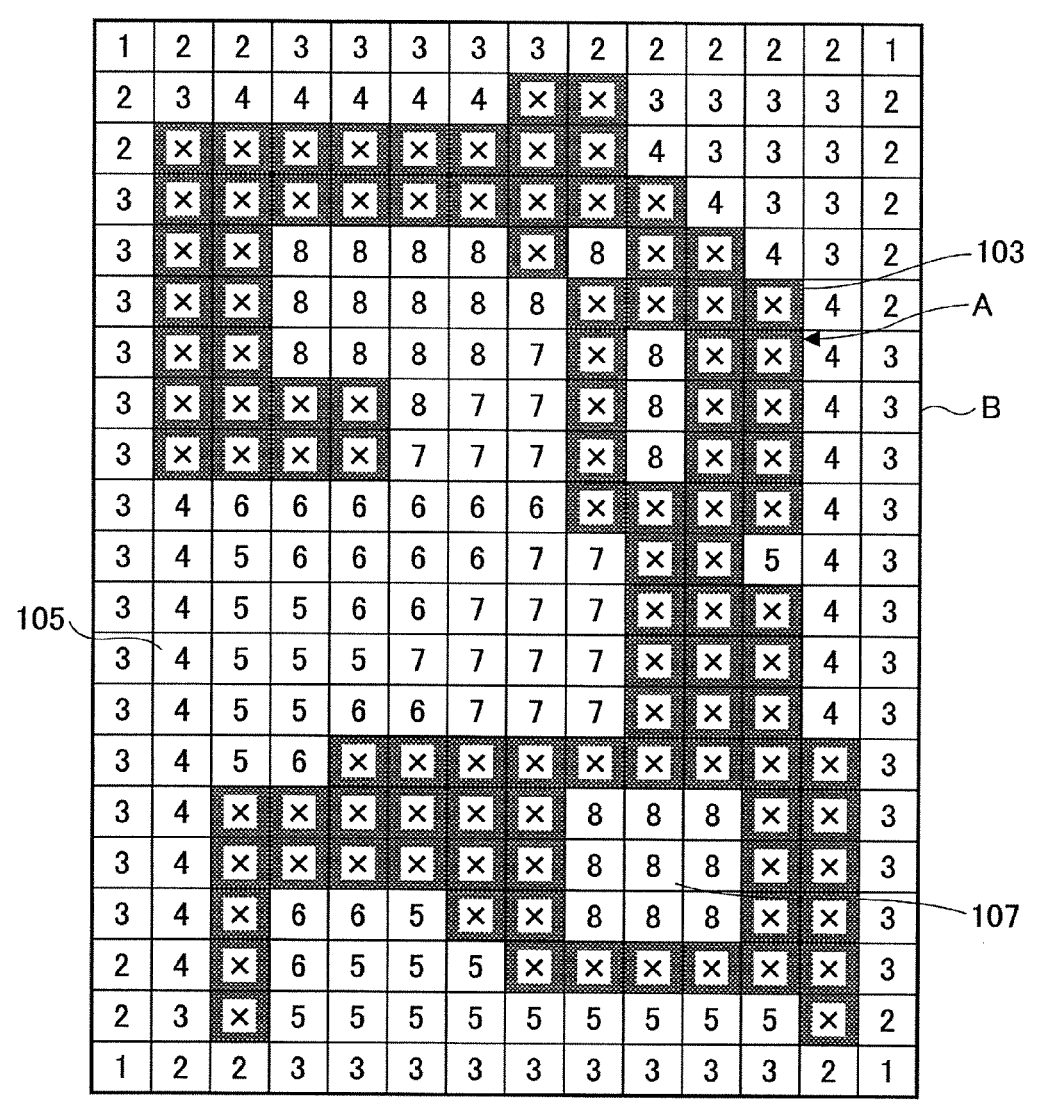

FIG. 37 shows the results showing the number of directions in the eight directions with respect to each of the judge target chips on which the defective chips in the defective chip concentrated distribution area "A" and the defective chip concentrated distribution nearby area "B" are disposed. According to this classifying step, each of the judge target chips in the defective chip concentrated distribution nearby area "B" has the chip index of any of "1" through "8". When compared with the case shown in FIG. 4, the number of chip indexes is increased, but it is easy to assume that the classifying, second, third, and fourth classifying, judging, and validity checking steps can also be executed as in the embodiment of the present invention.

Next, a manufacturing method according to an embodiment of the present invention for manufacturing a semiconductor device is described.

First, it is determined whether each of the chips arranged in a matrix in the X axis and the Y axis directions on a wafer is good or defective (Wafer testing step).

By using the results of the wafer test, the additional defective chips are detected in the chip quality judging method according to an embodiment of the present invention (Chip quality judging step).

Marks are placed onto the wafer positions corresponding to the chips judged as the defective chips and the additional defective chips (Marking step). It should be noted that when an inkless method in which electronic information based on the wafer test result and the chip quality judgment result is used, the process of placing the marks on the wafer is omitted.

The chips are cut from the wafer (Chip cutting step).

Among the chips cut from the wafer, only good chips are packaged (Packaging step). Herein, any chip judged as the defective chip in the wafer testing step and judged as the additional defective chip in the chip quality judging step is not packaged. By doing this, the reliability of the packaged semiconductor device is improved.

It should be noted that reference numerals and reference symbols used in the specification are given by way of illustration only, and thus do not limit the present invention.

Although a good chip classifying method of a wafer according to an embodiment of the present invention, a chip quality judging method, a chip classifying program, a marking mechanism, and a manufacturing method of a semiconductor device using the good chip classifying method have been described for a complete and clear disclosure, the appended claims are not to be thus limited but are to be construed as embodying all modifications and alternative constructions that may occur to one skilled in the art that fairly fall within the basic teaching herein set forth.

What is claimed is:

1. A good chip classifying method of a wafer, comprising:
    a defective chip dividing step of, based on wafer test results whether each of chips arranged in a matrix in an X direction and a Y direction on the wafer is good or defective, dividing the defective chips into defective groups so that the defective chips contiguous to each other are placed into the same defective group by checking the continuity of the defective chips in four directions of the X axis and the Y axis or eight directions consisting of the four directions and an additional four directions each inclined 45 degrees with respect to the X axis and the Y axis; and
    a classifying step of treating at least good chips as judge target chips and, with respect to each of the defective groups, classifying each of the judge target chips to have any of plural chip indexes based on the number of directions in which any defective chip in a target defective group is disposed in the four directions of the X axis and the Y axis or in the eight directions consisting of the four directions and the additional four directions each inclined 45 degrees with respect to the X axis and the Y axis.

2. The good chip classifying method according to claim 1, further comprising:
    a defective chip concentrated distribution area judging step of, with respect to each of the defective groups, comparing the number of defective chips in the defective group with the number of a prescribed defective chip number threshold value, and judging the defective group as a defective chip concentrated distribution area when the number of defective chips in the defective group is equal to or greater than the prescribed defective chip number threshold value; wherein
    in the classifying step, the judge target chips are classified so as to have any of the chip indexes with respect to only the defective group judged as the defective chip concentrated distribution area in the defective chip concentrated distribution area judging step.

3. The good chip classifying method according to claim 2, wherein
    in the defective chip concentrated distribution area judging step, the defective chip number threshold value used for the defective group where at least one defective chip in the defective group is disposed within a prescribed range of a wafer-edge chip is less than the defective chip number threshold value used for the defective group where none of the defective chips in the defective group are disposed within the prescribed range of a wafer-edge chip.

4. The good chip classifying method according to claim 1, further comprising:
    a defective group nearby area setting step of setting a defective group nearby area including all defective chips in the defective group and nearby good chips; wherein
    in the classifying step, the good chips in the defective group nearby area set in the defective group nearby area setting step are treated as the judge target chips to be classified so as to have any of the chip indexes.

5. The good chip classifying method according to claim 4, wherein
in the defective group nearby area setting step, a rectangular area including at least all the defective chips in the defective group is the defective group nearby area.

6. The good chip classifying method according to claim 2, further comprising:
a second classifying step of, with respect to a four-direction defective chip that is the judge target chip classified where any of the defective chips in the target defective group is disposed in each of the four directions in the classifying step, judging whether there is any other judge target chip or any other four-direction defective chip between the four-direction defective chip and the defective chip in the target defective group in each of the four directions, and classifying the four-direction defective chip so as to have another chip index when it is determined that there is no other judge target chip or there is only another four-direction defective chip between the four-direction defective chip and the defective chip in the defective chip concentrated distribution area in each of the four directions.

7. The good chip classifying method according to claim 2, further comprising:
a four-direction judge target chip dividing step of dividing the judge target chips into four-direction good chip groups based on the continuity in the four directions of the X axis and the Y axis; and
a third classifying step of classifying the judge target chips in the four-direction good chip groups to have another chip index, the four-direction good chip group consisting of the four-direction defective chips which are judge target chips classified where any of the defective chips in the defective chip concentrated distribution area is disposed in each of the four directions in the classifying step.

8. The good chip classifying method according to claim 2, further comprising:
an eight-direction judge target chip dividing step of dividing the judge target chips into eight-direction good chip groups based on the continuity in the eight directions consisting of the four directions of the X axis and the Y axis and additional four directions each inclined 45 degrees with respect to the X axis and the Y axis; and
a fourth classifying step of classifying the judge target chips in the eight-direction good chip groups to have another chip index, the eight-direction good chip group consisting of four-direction defective chips which are judge target chips classified where any of the defective chips in the defective chip concentrated distribution area is disposed in each of the four directions in the classifying step.

9. The good chip classifying method according to claim 1, wherein
in the defective chip dividing step, with respect to each of the target defective chips, it is judged whether there is any other defective chip within a prescribed range of the target defective chip, and the defective chips are divided into defective groups in a manner so that not only the defective chips contiguous to each other but also the defective chips within the prescribed range of the target defective chips are placed into the same defective group.

10. The good chip classifying method according to claim 1, further comprising:

a defective group merging step of merging any one of the defective chips and another defective group within a prescribed range of the target defective group or both and judging the thus merged group as the defective group.

11. The good chip classifying method according to claim 10, wherein
in the defective group merging step, only the defective group in which the number of the defective chips is greater than a prescribed first defective chip number merge threshold value is merged with only another defective group in which the number of the defective chips is greater than a prescribed second defective chip number merge threshold value.

12. The good chip classifying method according to claim 10, wherein
in the defective group merging step, only the defective group in which the number of the defective chips is greater than a prescribed first defective chip number merge threshold value is merged with only another defective group in which the number of the defective chips is greater than a prescribed second defective chip number merge threshold value, and the merged defective group is merged with only another defective group in which the number of the defective group is greater than the prescribed second defective chip number merge threshold value, the another defective group being within a prescribed range of the merged defective group.

13. The chip quality judging method comprising:
all steps in the good chip classifying method according to claim 1; and
a judging step, performed after all the steps in the good chip classifying method are performed, of judging each of the judge target chips as an additional defective chip when the defective chip in the defective group targeted upon the chip index being determined is within a prescribed judgment range of the judge target chips, the prescribed range varying depending on the chip index.

14. The chip quality judging method comprising:
all steps in the good chip classifying method according to claim 1; and
a judging step, performed after all the steps in the good chip classifying method are performed, of judging each of the judge target chips as an additional defective chip when the judge target chips have the same chip index as a prescribed chip index for judgment.

15. The chip quality judging method comprising:
all steps in the good chip classifying method according to claim 1;
a nearby defective chip index calculating step of with respect to each of the judge target chips, calculating the number of defective chips in the defective group that is within a prescribed range of the judge target chips and that is targeted when the chip index is determined, and setting the calculated number to a nearby defective chip index; and
a judging step, performed after all the steps in the good chip classifying method and the nearby defective chip index calculating step are performed, of judging each of the judge target chips as an additional defective chip when the nearby defective chip index of the defective chip is greater than a prescribed nearby defective chip index threshold value varying depending on the chip index.

16. The chip quality judging method comprising:
all steps in the good chip classifying method according to claim 1;

a defective chip distance index calculating step of, with respect to each of the judge target chips, calculating the shortest distance to the defective chip in the defective group targeted when the chip index is determined, and setting the calculated shortest distance to a defective chip distance index; and a judging step, performed after all the steps in the good chip classifying method and the defective chip distance index calculating step are performed, of judging each of the judge target chips as the additional defective chip when the defective chip distance index of the judge target chips is equal to or less than a prescribed defective chip distance index threshold value varying depending on the chip index.

17. The chip quality judging method according to claim 13, further comprising:

a judgment validity checking step, performed after the judging step is performed, of checking the validity of judgment in the judging step based on a difference or a ratio between the number of defective chips in the target defective group in a defective group nearby area including all defective chips in the target defective group and nearby good chips and the number of the additional defective chips.

18. The chip quality judging method according to claim 13, further comprising:

a chip index group dividing step, performed after the classifying step is performed, of dividing the judge target chips having the same chip index with respect to the same defective group into chip index groups based on the continuity in the four directions of the X axis and the Y axis or the eight directions consisting of the four directions and additional four directions each inclined 45 degrees with respect to the X axis and the Y axis; and a judgment validity checking step, performed after the judging step is performed, of checking the validity of judgment in the judging step with respect to each of the chip index groups based on a difference or a ratio between the number of defective chips in a rectangular area consisting of a minimum rectangular area capable of enclosing all the defective chips in the chip index group and the additional chips constituting a frame area having a width of one or more chips and contiguously surrounding the minimum rectangular area and the number of the additional defective chips.

19. A marking mechanism comprising:

a marking unit for placing a mark onto a target position on a wafer; and a control unit for controlling the operations of the marking unit, wherein the control unit includes a chip quality judgment program causing a computer to execute each step according to claim 13 and controls the operations of the marking unit so as to place marks onto the target wafer positions corresponding to the defective chips or the additional defective chips judged by the chip quality judgment program.

20. A manufacturing method of semiconductor devices comprising:

a wafer testing step of judging whether each of the chips arranged in a matrix in the X axis and the Y axis directions is good or defective;

a chip quality judging step of detecting additional defective chips using the chip quality judging method according to claim 13; and a chip cutting off step of cutting the chips from the wafer.

* * * * *